(12) United States Patent
Schober et al.

(10) Patent No.: US 10,573,545 B2
(45) Date of Patent: Feb. 25, 2020

(54) SUBSTRATE CARRIER AND SUBSTRATE CARRIER STACK

(71) Applicant: MURATA MACHINERY, LTD., Kyoto-shi, Kyoto (JP)

(72) Inventors: Thomas Schober, Ermatingen (CH); Bernd Rahrbach, Constance (DE); Christian Wohanka, Tägerwilen (CH); Yves Fenner, Berg (CH); Gerhard Dovids, Grabs (CH); John Fiddes, Kreuzlingen (CH)

(73) Assignee: MURATA MACHINERY, LTD., Kyoto (JP)

( * ) Notice: Subject to any disclaimer, the term of this patent is extended or adjusted under 35 U.S.C. 154(b) by 0 days.

(21) Appl. No.: 16/185,541

(22) Filed: Nov. 9, 2018

(65) Prior Publication Data
US 2019/0074203 A1 Mar. 7, 2019

Related U.S. Application Data

(63) Continuation-in-part of application No. 15/635,263, filed on Jun. 28, 2017, now Pat. No. 10,403,526.
(Continued)

(30) Foreign Application Priority Data

Jun. 27, 2018 (DE) .................. 20 2018 103 662 U

(51) Int. Cl.
H01L 21/673 (2006.01)

(52) U.S. Cl.
CPC .. *H01L 21/67346* (2013.01); *H01L 21/67376* (2013.01); *H01L 21/67389* (2013.01); *H01L 21/67393* (2013.01)

(58) Field of Classification Search
CPC ......... H01L 21/67346; H01L 21/67383; H01L 21/6875
See application file for complete search history.

(56) References Cited

U.S. PATENT DOCUMENTS 7,530,462 B2 * 5/2009 Yajima .............. H01L 21/67346 206/303
7,588,150 B2 * 9/2009 Kasama ............ H01L 21/67346 206/303

(Continued)

FOREIGN PATENT DOCUMENTS

JP 2008-053325 A 3/2008
WO 2014/107818 A2 7/2014

OTHER PUBLICATIONS

Official Communication issued in International Patent Application No. PCT/US2019/037449, dated Oct. 2, 2019.
(Continued)

*Primary Examiner* — Kaitlin S Joerger
(74) *Attorney, Agent, or Firm* — Keating & Bennett, LLP

(57) ABSTRACT

A substrate carrier stack includes substrate carriers which are stacked or stackable on each other and carry substrates within an inner accommodation space of the substrate carrier stack. The substrate carrier stack includes at least one first purging channel and at least one second purging channel, which extend vertically parallel to the inner accommodation space at opposing sides thereof, and purging structures which enable horizontal purging flows within the substrate carrier stack through spaces between substrates held by the substrate carriers. The substrate carriers each include an outer carrier frame provided with a seat to carry a substrate, wherein the outer carrier frame extends around the first and second purging channels and the inner accommodation space.

20 Claims, 31 Drawing Sheets

Related U.S. Application Data

(60) Provisional application No. 62/355,856, filed on Jun. 28, 2016.

(56) References Cited

U.S. PATENT DOCUMENTS

| | | | |
|---|---|---|---|
| 7,819,252 B2 * | 10/2010 | Kasama | H01L 21/67346 206/509 |
| 7,854,327 B2 * | 12/2010 | Hyobu | H01L 21/67294 206/454 |
| 8,480,348 B2 * | 7/2013 | Hyobu | H01L 21/67778 206/509 |
| 8,960,442 B2 * | 2/2015 | Oyama | H01L 21/67383 206/711 |
| 9,144,901 B2 * | 9/2015 | Yang | B25H 3/00 |
| 9,181,633 B2 * | 11/2015 | Jurisch | C30B 29/40 |
| 9,324,763 B2 * | 4/2016 | Matsuda | H01L 21/67346 |
| 9,437,466 B2 * | 9/2016 | Sakiya | H01L 21/67265 |
| 2005/0188923 A1 * | 9/2005 | Cook | C23C 16/4584 118/728 |
| 2006/0151404 A1 | 7/2006 | Blattner et al. | |
| 2007/0140822 A1 | 6/2007 | Elliott et al. | |
| 2008/0298935 A1 * | 12/2008 | Lering | H01L 21/67383 414/217.1 |
| 2010/0179681 A1 | 7/2010 | Jäger et al. | |
| 2012/0325328 A1 | 12/2012 | Shah et al. | |
| 2017/0365491 A1 | 12/2017 | Wu et al. | |
| 2017/0372930 A1 * | 12/2017 | Schober | H01L 21/67346 |
| 2018/0211860 A1 * | 7/2018 | Kuo | H01L 21/67766 |
| 2018/0240696 A1 * | 8/2018 | Yoo | H01L 21/02 |
| 2018/0374731 A1 * | 12/2018 | Woo | B65D 85/38 |

OTHER PUBLICATIONS

Schober et al., "Substrate Storage and Processing", U.S. Appl. No. 15/635,263, filed Jun. 28, 2017.

Schober et al., "Substrate Carrier and Substrate Carrier Stack", U.S. Appl. No. 16/185,546, filed Nov. 9, 2018.

Schober et al., "Opener Apparatus", U.S. Appl. No. 16/185,556, filed Nov. 9, 2018.

* cited by examiner

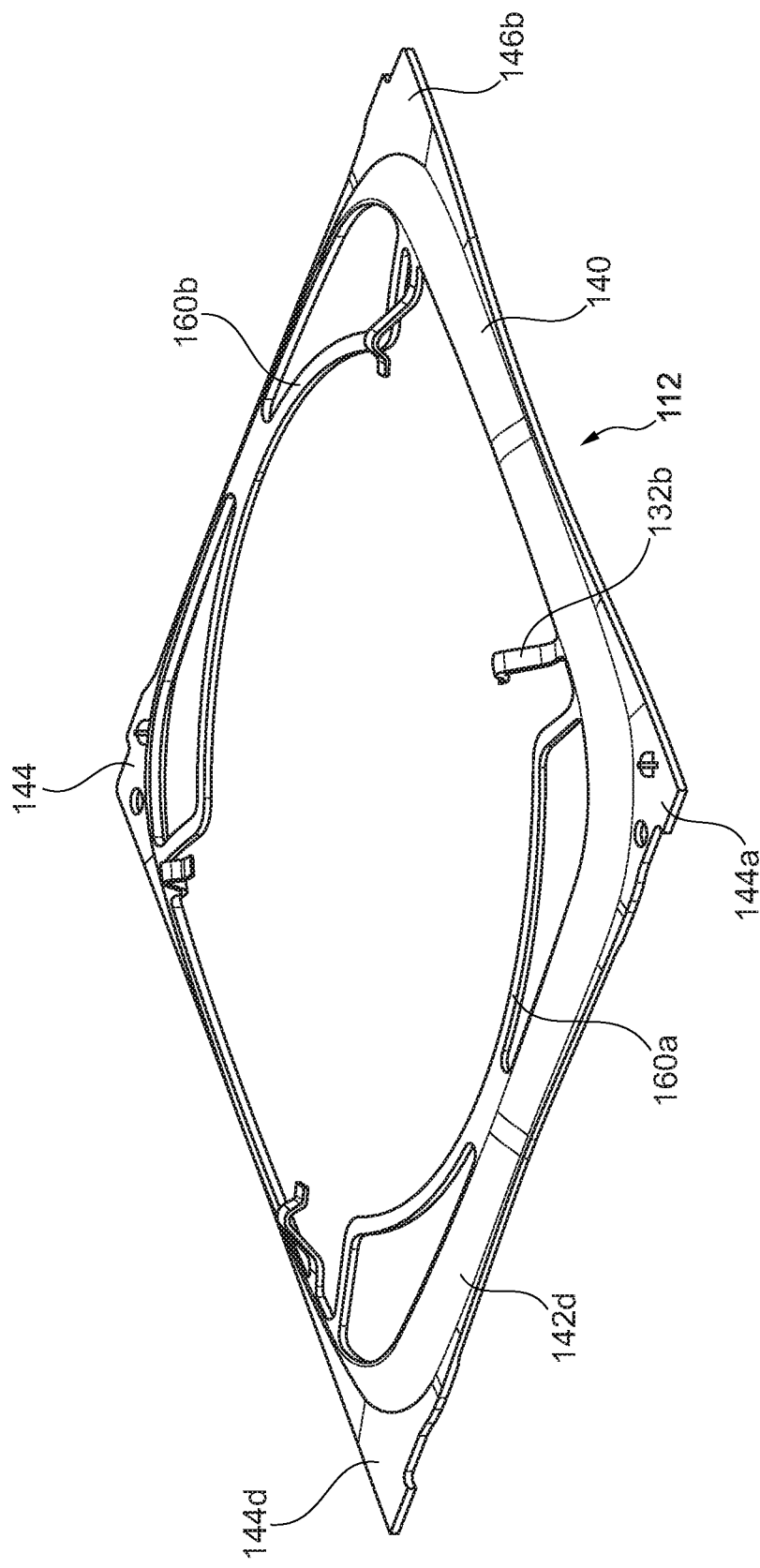

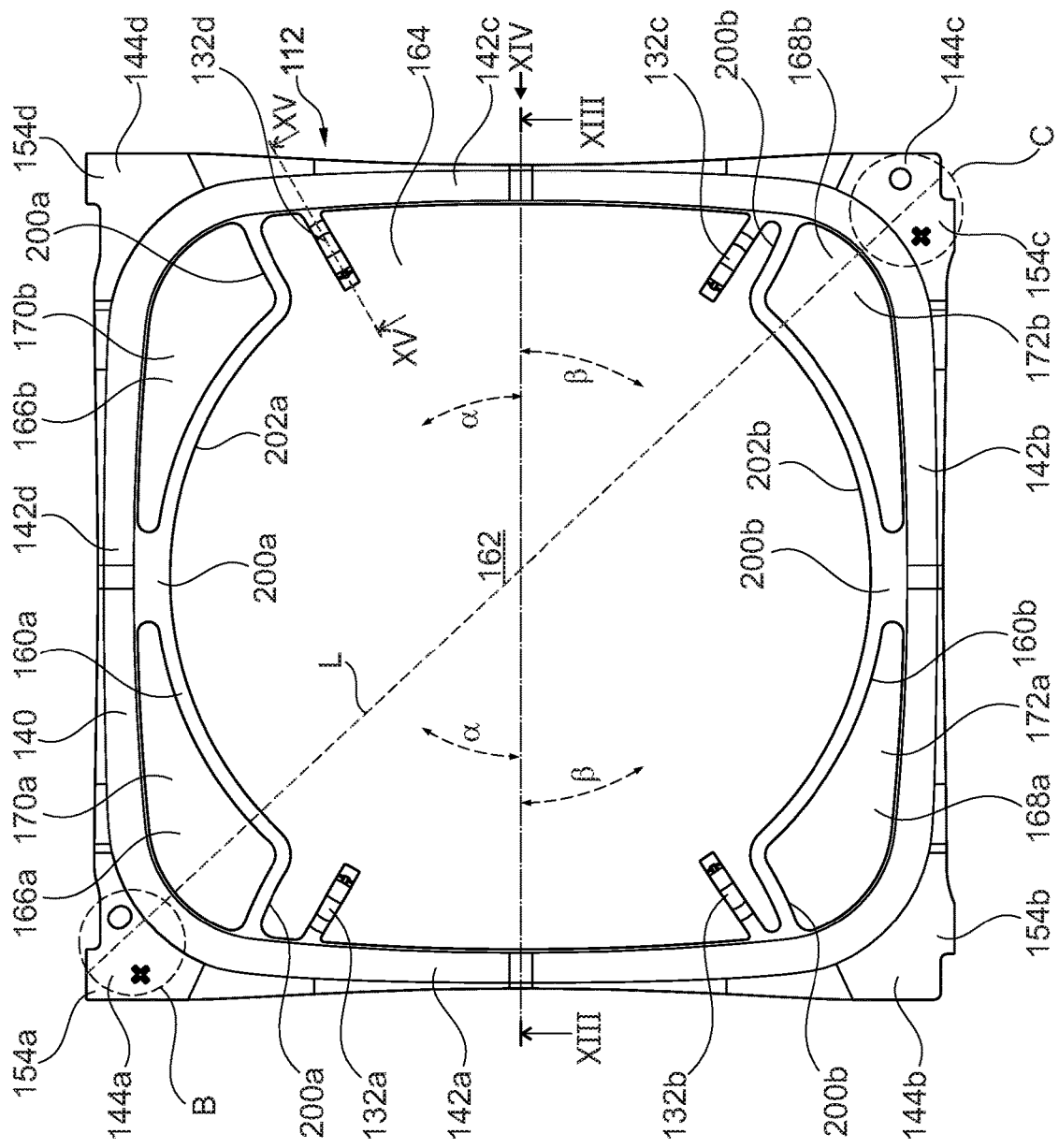
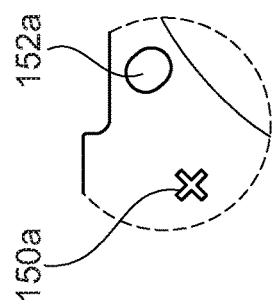
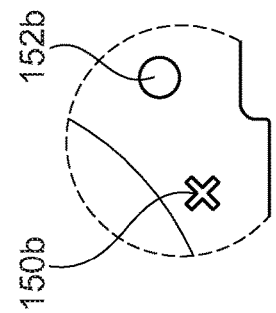

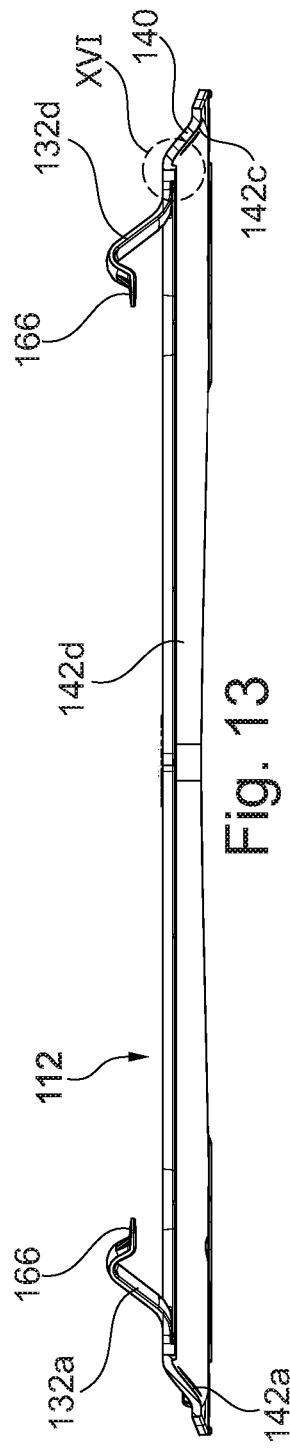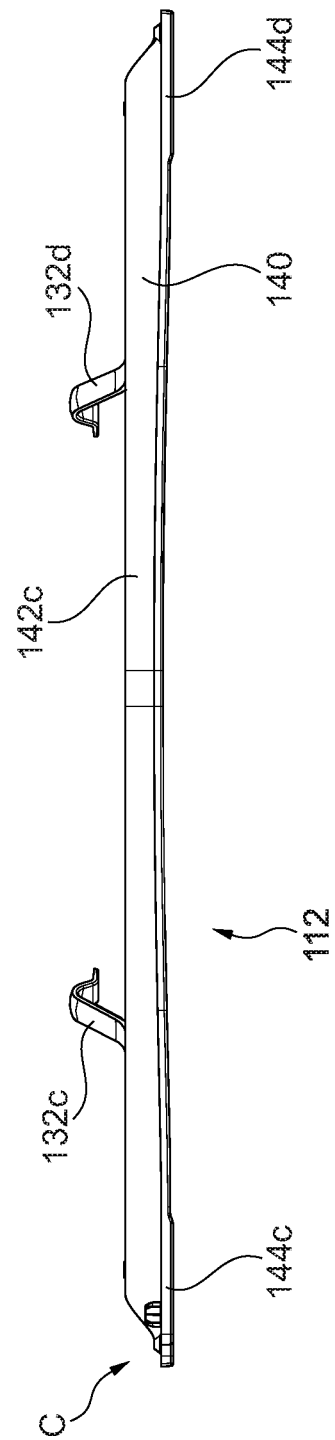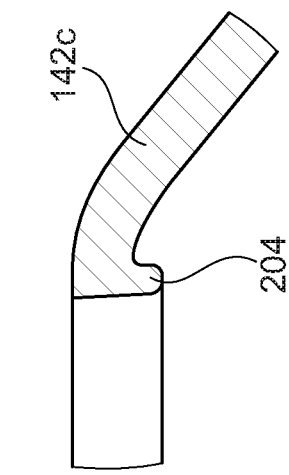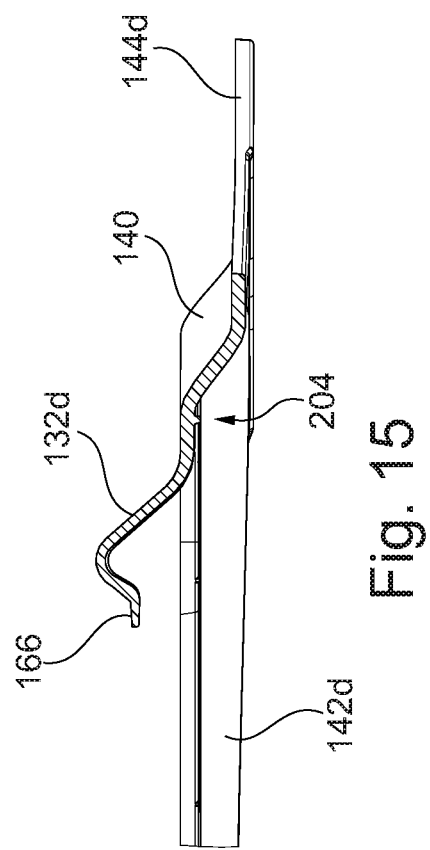

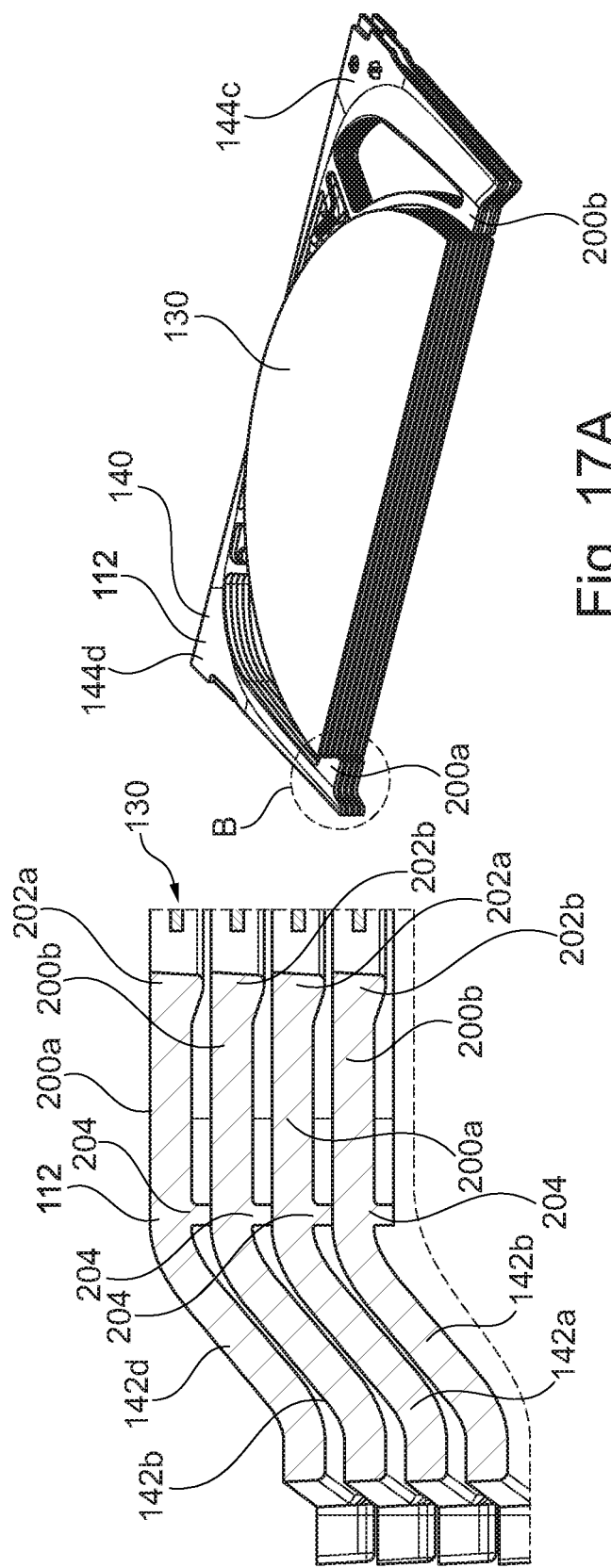

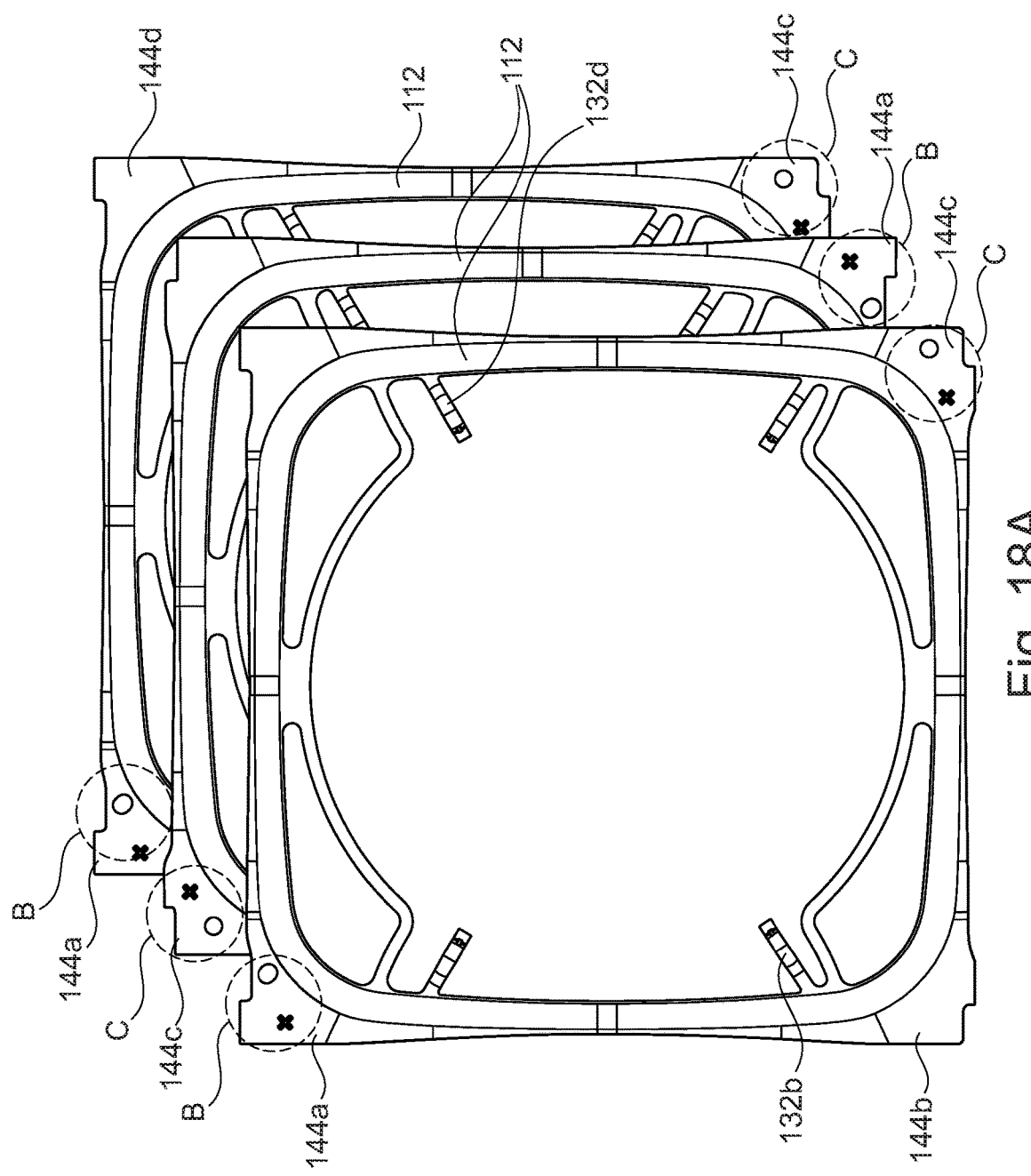

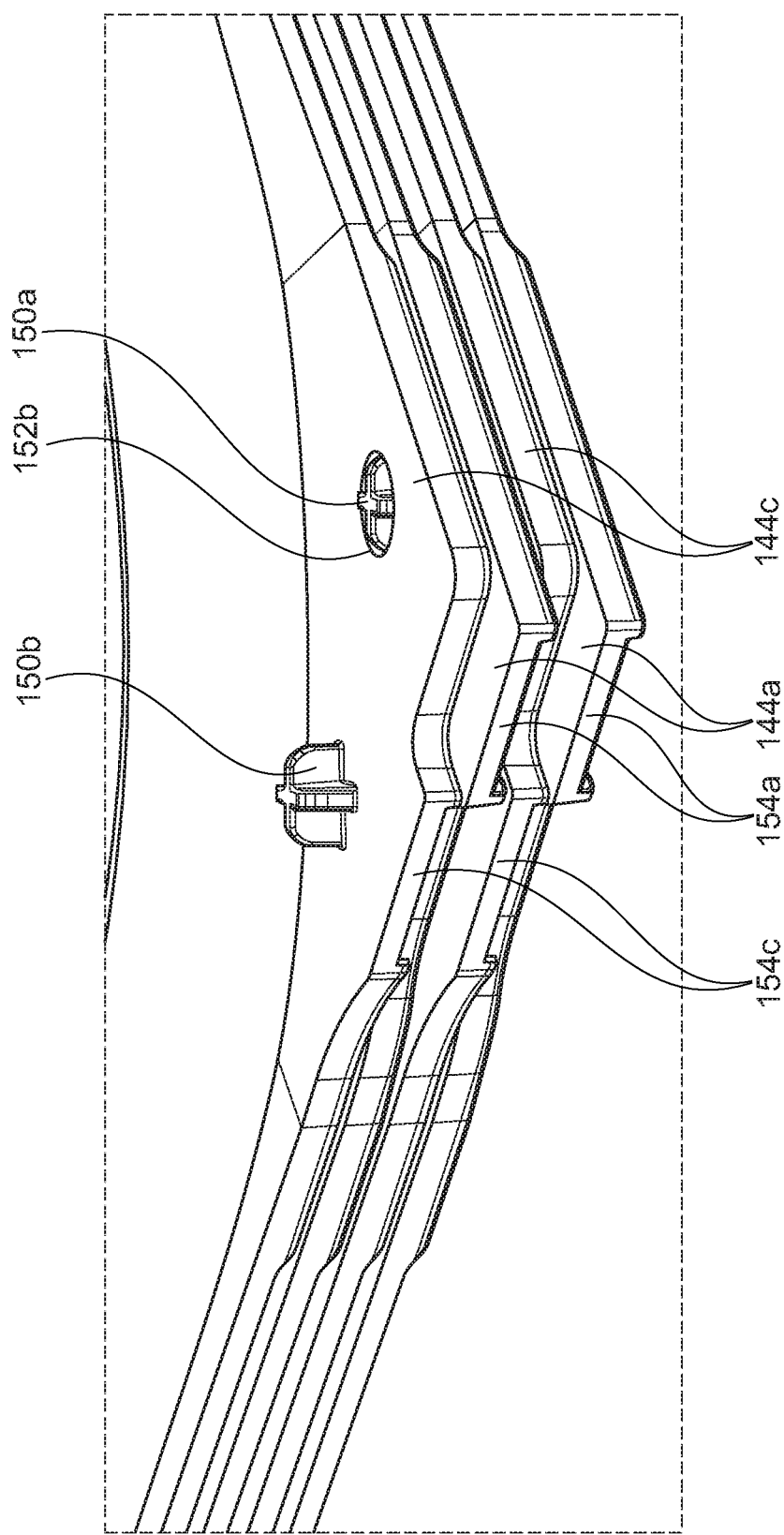

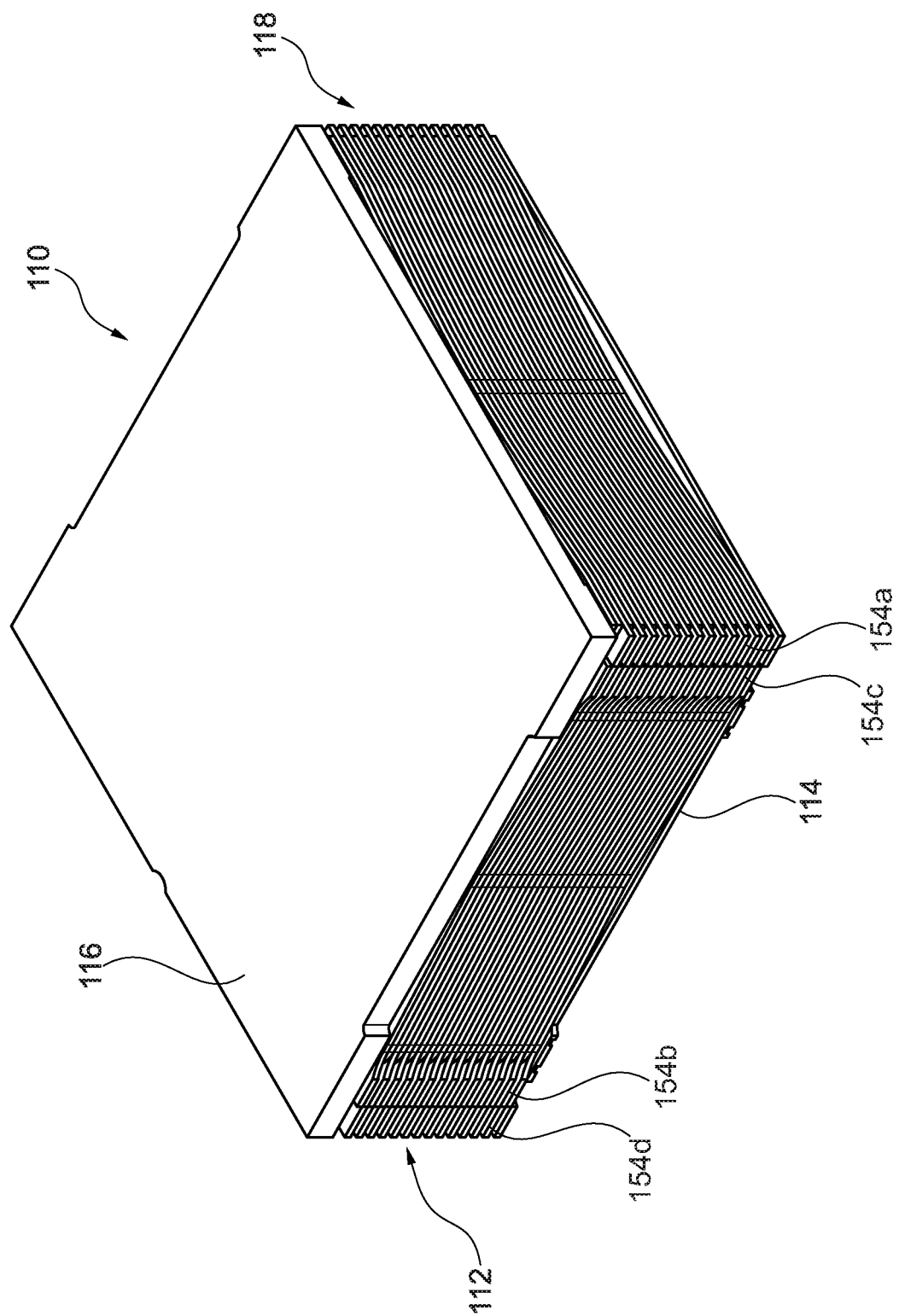

SUBSTRATE CARRIER AND SUBSTRATE CARRIER STACK

BACKGROUND OF THE INVENTION

1. Field of the Invention

This disclosure relates generally to the handling, storage, treatment, and processing of substrates in semiconductor production. In particular, this disclosure relates to the handling, storage, treatment, and processing of substrates in the form of unprocessed or preprocessed or processed semiconductor wafers. However, a substrate to be handled or stored may also be a mask or reticle or the like which contains pattern information needed for forming patterns on semiconductor wafers in the manufacturing of semiconductors or semiconductor circuits, for example.

Since the introduction of the 300-mm wafer semiconductor material, Front Opening Unified Pods, or "FOUPs," have become the standard storage and transport method of substrates and similar materials. FOUPs have been used to isolate and hold silicon wafers for use in semiconductor production. Semiconductors, fundamental in the design of digital circuitry, microprocessors, and transistors, require these wafers to remain in as close to immaculate condition as storage units allow. Accordingly, FOUPs allow wafers to be transferred between other machines used in the processing and measurement of wafers.

2. Description of the Related Art

Prior FOUPs generally serve to preserve wafers from the surrounding clean room environment. In conventional semiconductor projects, FOUPs allow wafers to enter the apparatus via a load port and front opening door. Often, robot handling mechanisms may place the wafers into the FOUP, where they are clamped in place by fins and held for later use. Yet conventional FOUPs are hampered by methods and system designs which may contaminate their contents, chafe wafers, and delay loading and unloading of substrate wafer contents as a result of multifarious construction. Thus, there is a need to more efficiently and accurately accomplish the desired tasks of FOUPs.

It has long been known that, at least in certain processes, the semiconductor substrates outgas after processing for a relatively long time. Gaseous components resulting from the processing are discharged to the environment. These gases can form compounds with the ambient air, in particular with oxygen and/or hydrogen, as contained in the water of the air humidity, which then precipitate again on the surface of the substrates as impurities or even as surface layers. Both are impurities that either require post-processing to remove these contaminants or make the substrates completely unusable for further use in production (also referred to as "yield loss"). Therefore, it is a long standing practice to submit the semiconductor wafers to a purging treatment, namely to bathe the semiconductor wafers after the processing or a respective processing step in a purging gas flow, e.g., a nitrogen gas flow or a dry clean air flow. The purging gas flow serves to remove solid and gaseous impurities by the movement of the gas and, depending on the purging gas used, may avoid a reaction of the outgassing with ambient air. To this end, nitrogen as purging gas is preferred since then the atmosphere surrounding the substrates has only a small proportion of oxygen and hydrogen. The nitrogen is conventionally taken from gas containers stored in the factory and is passed into storage devices in which the semiconductor wafers are stored after the respective processing step and before the semiconductor wafers are submitted to the next processing step.

However, it has long been known that despite these measures, the previously described undesired reactions and their precipitates on the substrate surfaces cannot be reliably and sufficiently prevented so far. It is therefore still common practice that, in the production of electronic components, substrates are regularly either removed as scrap or must be freed from such impurities or such unwanted layers in a time and cost intensive manner. This process may affect a substantial portion of the processed wafers, causing significant costs.

New kinds of devices for storing, handling, treating and transporting of substrates in the form of semiconductor wafers were proposed by TEC-SEM AG, Tägerwilen (CH).

The laid-open publication WO 2014/107818 A2 originating from TEC-SEM AG and published on Jul. 17, 2014 proposed a substrate carrier and a substrate carrier stack made up from a plurality of substrate carriers. The proposed substrate carrier stack includes a plurality of substrate carriers stacked in a vertical direction such that for each pair of vertically adjacent substrate carriers of the substrate carrier stack a respective lower substrate carrier supports a respective upper substrate carrier, wherein each substrate carrier has an outer carrier frame which extends in a horizontal frame plane around an inner zone including an inner opening and is provided with a substrate seat for accommodating and carrying a plate-shaped substrate within an inner accommodation space of the substrate carrier stack, wherein the inner accommodation space or portions thereof are defined by the inner openings of the substrate carriers of the substrate carrier stack.

Each substrate carrier of the proposed substrate carrier stack has at its outer carrier frame at least one upper supporting formation and at least one lower supporting formation such that a lower substrate carrier of a respective pair of vertically adjacent substrate carriers of the substrate carrier stack supports with its at least one upper supporting formation the upper substrate carrier of this pair of vertically adjacent substrate carriers at its at least one lower supporting formation.

Each substrate carrier of the proposed substrate carrier stack further includes the following features:
the outer carrier frame includes a first frame web extending along a first frame web axis, a second frame web extending along a second frame web axis, a third frame web extending along a third frame web axis, and a fourth frame web extending along a fourth frame web axis,
the first frame web axis intersects the fourth frame web axis at right angles at a first vertex associated with the first frame web and to the fourth frame web and a first frame vertex region of the outer carrier frame at which the first frame web and the fourth frame web are integrally connected,
the first frame web axis intersects the second frame web axis at right angles at a second vertex associated with the first frame web and to the second frame web and a second frame vertex region of the outer carrier frame at which the first frame web and the second frame web are integrally connected,
the third frame web axis intersects the fourth frame web axis at right angles at a fourth vertex associated with the third frame web and to the fourth frame web and a fourth frame vertex region of the outer carrier frame at which the third frame web and the fourth frame web are integrally connected, the third frame web axis intersects the second frame web axis at a third vertex associated with third frame web and to the second frame web and a third frame vertex region of the outer carrier frame at which the third frame web and the second frame web are integrally connected, a plurality of substrate holding arms extend inwardly and upwardly from the outer carrier frame which overlap with the inner zone and form the substrate seat, which is located at a distance above the vertical extent of the carrier frame and is adapted to carry a plate-shaped substrate having a circular circumference and a diameter corresponding to a predetermined allowable diameter or within a predetermined allowable diameter range given by a predetermined allowable minimum diameter and a predetermined allowable maximum diameter, the substrate seat defines a horizontal carrying plane which, in case that a plate-shaped substrate having a circular circumference and a diameter corresponding to the predetermined allowable diameter or the predetermined allowable maximum diameter is carried and held horizontally by the substrate seat, is coplanar with a lower surface of this plate-shaped substrate.

Accordingly, the outer carrier frames of the substrate carriers, in view of the above-described arrangement of the frame webs and the frame axes, have a generally or at least roughly quadratic or rectangular shape.

The disclosure of WO 2014/107818 A2 is incorporated herein by reference in its entirety.

The laid-open publication US 2017/0372930 A1, also originating from TEC-SEM AG and published on Dec. 28, 2017, discloses substrate carriers of this kind and a substrate carrier stack of this kind which have additional characteristic features. As proposed in US 2017/0372930 A1, each substrate carrier of the proposed substrate carrier stack includes, in addition to the above-mentioned features, also the following features:

a plurality of partition webs extend from the outer carrier frame through the inner zone, which define the inner opening and at least two auxiliary openings of the inner zone, wherein the inner opening and the substrate seat are arranged and dimensioned such that a plate-shaped substrate carried by the substrate seat and having a circular circumference and a diameter corresponding to the predetermined diameter or being within the predetermined diameter range does not overlap with any portion of the partition webs, at least one first arc-shaped portion of the partition webs extends in a space between the fourth frame web and the inner opening defining at least one first auxiliary opening, at least one second arc-shaped portion of the partition webs extends in a space between the second frame web and the inner opening defining at least one second auxiliary opening, the arc-shaped portions have a radius of curvature which is adapted to the predetermined diameter or predetermined diameter range;

wherein the arc-shaped portions of the partition webs of the substrate carriers of the substrate carrier stack limit the inner accommodation space of the substrate carrier stack at least in a direction parallel to a first horizontal axis of the stack of carriers which is parallel to the first and third web frame axes of the substrate carriers;

wherein the first auxiliary openings and the second auxiliary openings of the inner zones of the substrate carriers of the substrate carrier stack form at least one first purging channel and at least one second purging channel of the substrate carrier stack which extend vertically parallel to the inner accommodation space at opposing sides thereof; and wherein the substrate carrier stack is provided with purging structures which enable horizontal purging flows within the substrate carrier stack through spaces between substrates held by the substrate seats of the substrate carriers.

Instead of providing openings in opposing frame webs of the outer carrier frame for forming vertical purging channels extending through the frame webs as proposed according to WO 2014/107818 A2, the substantially improved solution according to US 2017/0372930 A1 provides for the purging channels within the inner zone, which are defined by the partition webs. This allows larger opening cross-sections for the vertical purging channels, which serve to provide for horizontal purging flows within the substrate carrier stack through spaces between substrates held by the substrate seats of the substrate carriers. For enabling the horizontal purging flows between the vertical purging channels, namely emerging from one of the vertical purging channels and entering into another of the vertical purging channels, the substrate carrier stack preferably have suitable purging structures which cooperate with the vertical purging channels.

The substrate carriers proposed according to US 2017/0372930 A1 have two first positioning formations and two second positioning formation, which are provided in the form of two protrusions and two recesses or openings. A first pair of a protrusion and a neighboring recess and a second pair of a protrusion and a neighboring recess are arranged at diametrically opposing frame vertex regions of the outer carrier frame. A respective protrusion may protrude into a corresponding recess of the next substrate carrier above or below the respective substrate carrier within the stack. Accordingly, for each pair of vertically adjacent substrate carriers the two first positioning formations of the lower substrate carrier of this pair of vertically adjacent substrate carriers are engaged or engageable with an associated particular one of the two second positioning formations of the upper substrate carrier of this pair of vertically adjacent substrate carriers. This safeguards or contributes to a proper relative positioning of the two substrate carriers of this pair of vertically adjacent substrate carriers.

According to the disclosure of US 2017/0372930 A1, namely in view of the relative arrangement of the protrusions and recesses on the substrate carriers being shown in the figures of US 2017/0372930 A1, two subtypes of these substrate carriers are needed, which are stacked alternatingly on each other in the substrate carrier stack, for allowing that a respective protrusion of one substrate carrier may protrude into a respective recess of another substrate carrier being the vertical adjacent substrate carrier located above or below in the substrate carrier stack.

Herein the structural details of the substrate carriers and the substrate carrier stacks as already disclosed in US 2017/0372930 A1 as well as some additional structural details of the substrate carriers and the substrate carrier stacks developed by TEC-SEM AG and further also an improved kind of such a substrate carrier and such a substrate carrier stack as developed by TEC-SEM AG are disclosed and described in detail. The disclosure of US 2017/0372930 A1 is incorporated herein by reference in its entirety.

Older types of substrate carriers having a generally or roughly circular shape and substrate carrier stacks including such substrate carriers having a generally or roughly circular shape and associated storage and opener devices are known from WO 2005/006407 A1 and WO 2007/006166 A2 originating from TEC-SEM AG as well. The disclosure of WO 2005/006407 A1 or corresponding publication US 2006/

0151404 A1 and of WO 2007/006166 A2 or corresponding publication US 2010/0179681 A1 are incorporated herein by reference in their entirety.

SUMMARY OF THE INVENTION

Preferred embodiments of the present invention provide substrate carriers and substrate carrier stacks including such substrate carriers which are able to be used advantageously for substrate handling, substrate storage, substrate treatment, and substrate processing in semiconductor manufacturing or like processes.

Preferred embodiments of the present invention also provide substrate carriers and substrate carrier stacks including such substrate carriers which are able to be used advantageously to submit substrates to a purging treatment.

Preferred embodiments of the present invention further provide substrate carriers and substrate carrier stacks including such substrate carriers which include structures that safeguard or contribute to a proper relative positioning of the substrate carriers within the substrate carrier stack.

Preferred embodiments of the present invention provide substrate carriers and substrate carrier stacks including such substrate carriers which achieve further advantages in at least one of handling of the substrate carrier stack and its substrate carriers, substrate storage, substrate treatment, and substrate processing, on basis of a proper relative positioning of the substrate carriers within the substrate carrier stack.

A preferred embodiment of the present invention provides a substrate carrier stack including a plurality of substrate carriers stacked in a vertical direction such that, for each pair of vertically adjacent substrate carriers of the substrate carrier stack, a respective lower substrate carrier supports a respective upper substrate carrier, wherein each of the plurality of substrate carriers includes an outer carrier frame which extends in a horizontal frame plane around an inner zone including an inner opening and is provided with a substrate seat that accommodates and carries a plate-shaped substrate within an inner accommodation space of the substrate carrier stack, wherein the inner accommodation space or portions thereof are defined by the inner openings of the substrate carriers of the substrate carrier stack.

Each substrate carrier includes at its outer carrier frame at least one upper supporting formation and at least one lower supporting formation such that a lower substrate carrier of a respective pair of vertically adjacent substrate carriers of the substrate carrier stack supports with the at least one upper supporting formation the upper substrate carrier of the pair of vertically adjacent substrate carriers at the at least one lower supporting formation.

Each substrate carrier of the substrate carrier stack further includes the following features:

the outer carrier frame includes a first frame web extending along a first frame web axis, a second frame web extending along a second frame web axis, a third frame web extending along a third frame web axis, and a fourth frame web extending along a fourth frame web axis, the first frame web axis intersects the fourth frame web axis at right angles at a first vertex associated with the first frame web and to the fourth frame web and a first frame vertex region of the outer carrier frame at which the first frame web and the fourth frame web are integrally connected, the first frame web axis intersects the second frame web axis at right angles at a second vertex associated with the first frame web and to the second frame web and a second frame vertex region of the outer carrier frame at which the first frame web and the second frame web are integrally connected, the third frame web axis intersects the fourth frame web axis at right angles at a fourth vertex associated with the third frame web and to the fourth frame web and a fourth frame vertex region of the outer carrier frame at which the third frame web and the fourth frame web are integrally connected, the third frame web axis intersects the second frame web axis at a third vertex associated with third frame web and to the second frame web and a third frame vertex region of the outer carrier frame at which the third frame web and the second frame web are integrally connected, a plurality of substrate holding arms extend inwardly and upwardly from the outer carrier frame which overlap with the inner zone and form the substrate seat, which is located at a distance above the vertical extent of the carrier frame and is adapted to carry a plate-shaped substrate having a circular circumference and a diameter corresponding to a predetermined allowable diameter or within a predetermined allowable diameter range given by a predetermined allowable minimum diameter and a predetermined allowable maximum diameter, the substrate seat defines a horizontal carrying plane which, in case that a plate-shaped substrate having a circular circumference and a diameter corresponding to the predetermined allowable diameter or the predetermined allowable maximum diameter is carried and held horizontally by the substrate seat, is coplanar with a lower surface of the plate-shaped substrate, a plurality of partition webs extend from the outer carrier frame through the inner zone, which define the inner opening and at least two auxiliary openings of the inner zone, wherein the inner opening and the substrate seat are arranged and dimensioned such that a plate-shaped substrate carried by the substrate seat and having a circular circumference and a diameter corresponding to the predetermined diameter or being within the predetermined diameter range does not overlap with any portion of the partition webs, at least one first arc-shaped portion of the partition webs extends in a space between the fourth frame web and the inner opening defining at least one first auxiliary opening, at least one second arc-shaped portion of the partition webs extends in a space between the second frame web and the inner opening defining at least one second auxiliary opening, and the arc-shaped portions have a radius of curvature which is adapted to the predetermined diameter or predetermined diameter range;

wherein the arc-shaped portions of the partition webs of the substrate carriers of the substrate carrier stack limit the inner accommodation space of the substrate carrier stack at least in a direction parallel to a first horizontal axis of the stack of carriers which is parallel to the first and third web frame axes of the substrate carriers.

In order to allow the substrates held by the substrate carriers to be favorably submitted to a purging treatment, the first auxiliary openings and the second auxiliary openings of the inner zones of the substrate carriers of the substrate carrier stack define at least one first purging channel and at least one second purging channel of the substrate carrier stack which extend vertically parallel to the inner accommodation space at opposing sides thereof, wherein the substrate carrier stack is preferably provided with purging structures which enable horizontal purging flows within the substrate carrier stack through spaces between substrates held by the substrate seats of the substrate carriers.

Substantial improvements over prior art approaches are achieved. According to preferred embodiments of the present invention, the first and second purging channels are able to have rather large opening cross-sections, which enable and contribute to achieving laminar purging gas flow within the substrate carrier stack, which is desired for an effective purging treatment of substrates like semiconductor wafers.

In the above discussion of the substrate carrier stacks provided by preferred embodiments of the present invention, a proper horizontal positioning of the substrate carrier stack on a horizontal support or the like (or generally a horizontal reference plane) is assumed. This is a positioning which will typically or preferably be applied when the substrate carrier stack is used for the purpose of storing, transporting, handling, and treating of substrates such as semiconductor wafers which are held by respective substrate carriers. If the substrate carrier stack is positioned differently, such as, on an inclined plane or even rotated about, e.g., 90 degrees, the frame plane of the outer carrier frame of a respective substrate carrier would not be a "horizontal" plane in a strict sense, and also some other indications relating to terms such as "horizontal" or "horizontally" and "vertical" or "vertically" would not apply in a strict sense. In view of these considerations, these indications should be understood to implicitly relate to an intrinsic Cartesian coordinate system of the substrate carrier stack, having one vertical axis and two horizontal axes, independently of an actual orientation of the substrate carrier stack with respect to a horizontal reference plane.

Concerning the frame web axes and the vertices it is to be noted, that the frame axes are preferably to be assumed to extend at least partially within the respective associated frame web, but this is not mandatory. Further, it is not mandatory that the respective vertex is assumed to be located within the respective frame vertex region. Whether and to which extent such assumptions make sense will depend on the exact geometry of the frame web and the frame vertex regions and therewith the outer carrier frame, for example, which should have a roughly quadratic or rectangular shape. Generally one may assume that the frame web axes coincide with straight centroidal lines of the respective frame web. Depending on the shape of the frame webs and their extent in vertical direction, this assumption might have the consequence that the vertices are located above the respective associated frame vertex region of the outer frame web.

According to a preferred embodiment of the present invention, the frame vertex regions are vertically aligned with each other and coinciding with the lowermost portions of a respective substrate carrier. In such a case it would alternatively make sense to assume the vertices to be located within the respective associated frame vertex region, for example to coincide with a centroidal point of the frame vertex region. According to this preferred embodiment, the frame webs would extend upwardly from the associated frame vertex regions. In such a case, preferably the frame webs extend along a substantial portion of the distance between the frame vertex regions at a distance from the associated frame web axis. To this end, the frame webs are able to favorably have a convex shape at a bottom side or bottom edge.

According to a preferred embodiment, the frame vertex regions of the outer carrier frames of the substrate carriers each include a planar or substantially planar outer vertex portion and a curved or slanting inner vertex portion which is integrally connected with the outer vertex portion and stands up, extending upwardly and towards the inner zone, from the outer vertex portion. The planar or substantially planar outer vertex portions are vertically aligned with each other and coincide with the lowermost portions of a respective substrate carrier. The frame webs of the outer carrier frames of the substrate carriers each include a respective curved or slanting web portion which extends along the respective frame web and stands up, extending upwardly and towards the inner zone, from a respective outer vertex portion or a respective lower web edge or a substantially planar outer web portion which extends at least partially along the respective frame web. The curved or slanting web portions, each extending between a respective pair of inner vertex portions and merging into the inner vertex portions of the respective pair, and the inner vertex portions are shaped in such a manner that a continuous carrier frame profile is provided to extend around the inner zone and includes an upper and inner edge confining the inner zone. According to a favorable variant of this preferred embodiment, the frame webs have a convex shape at the lower web edge, such that there is a vertical gap between the vertical level of the outer vertex regions and the lower web edge of the respective frame web extending there between, over a substantial portion of the distance between the associated frame vertex portions.

As discussed above, the first and second purging channels and the purging structures enable a purging treatment of substrates in the form of semiconductor wafers after a respective processing step. Such a purging treatment is an important step in the processing of semiconductor wafers and in the manufacturing of semiconductor devices. The substrate carriers and the substrate carrier stack according to preferred embodiments of the present invention are able to be used favorably to submit the wafers held in the seats of the substrate carriers to an appropriate purging treatment, in which the wafers are bathed in a purging gas flow, e.g., nitrogen flow or dry clean air flow, so that gaseous and solid pollutants, in particular outgassings from the wafers resulting from a preceding processing step, are purged out of the substrate carrier stack.

Preferably, the substrate carriers are provided with purging structures which enable horizontal purging flows within the substrate carrier stack through spaces between substrates held by the substrate seats of the substrate carriers. Therewith additional elements included into the substrate carrier stack to achieving the horizontal purging flows are able to be avoided.

According to a preferred embodiment of the present invention, each substrate carrier includes a first partition web which extends between the first frame web and the third frame web and includes one first arc-shaped portion extending in the space between the fourth frame web and the inner opening and bridging a substantial portion of, preferably most of the distance between the first frame web and the third frame web, and each substrate carrier includes a second partition web which extends between the first frame web and the third frame web and includes one second arc-shaped portion extending in the space between the second frame web and the inner opening and bridging a substantial portion of, preferably most of the distance between the first frame web and the third frame web.

Preferably, the first partition web includes a first connecting portion merging at one end into the first arc-shaped portion and at the other end into the first frame web close to the first frame vertex region and a second connecting portion merging at one end into the first arc-shaped portion and at the other end into the third frame web close to the fourth frame vertex region of the respective substrate carrier, and the second partition web includes a first connecting portion merging at one end into the second arc-shaped portion and at the other end into the first frame web close to the second frame vertex region, and a second connecting portion merging at one end into the second arc-shaped portion and at the other end into the third frame web close to the third frame vertex region of the respective substrate carrier. Further, the first partition web is able to further include a third connecting region connecting the first arc-shaped portion with the fourth frame web and therewith defining two first auxiliary openings of similar or same size of the respective substrate carrier, and the second partition web is able to include a third connecting region connecting the second arc-shaped portion with the second frame web and therewith defining two second auxiliary openings of similar or same size of the respective substrate carrier.

According to a preferred embodiment of the present invention, a substrate carrier stack further includes a cover which is stacked on the plurality of substrate carriers such that the upmost substrate carrier of the substrate carriers supports the cover. This is preferably the case for purging treatments of substrates within the substrate carriers stack, however, a cover may not be need for all feasible use scenarios.

According to a preferred embodiment of the present invention, a substrate carrier stack further includes a base on which the plurality of substrate carriers is stacked such that the base supports the lowermost substrate carrier of the substrate carriers. This is preferably the case for purging treatments of substrates within the substrate carriers stack, however, a base may not be need for all feasible use scenarios.

According to the terminology used here, the cover (if provided) and the base (if provided) belong to the substrate carrier stack. The substrate carrier stack including the cover and the base preferably is able to be handled collectively, as one integral unit or unitary structure, which is able to serve the purpose of storing, transporting, handling, and treating of substrates which are held by a respective of the substrate carriers. Accordingly, this unit or this substrate carrier stack may also be denoted as a substrate holder, a substrate storage and transportation device, or a substrate treatment device which is modular, since it includes separate modules, namely the substrate carriers and—if provided—the cover and—if provided—the base. To access the seat of a respective substrate carrier to load a respective substrate on the substrate seat or to unload a respective substrate from the substrate seat an opener apparatus is able to be used, which includes a movement mechanism that relatively moves the upper substrate carrier and the lower substrate carrier of a respective pair of vertically adjacent substrate carriers of the substrate carrier stack vertically, such that a gap between the upper substrate carrier and the lower substrate carrier is opened, so that the substrate seat of the lower substrate carrier is able to be accessed from a horizontal direction for loading or unloading, e.g., by a robot arm. In this respect, a conventional opener apparatus such as that described in WO 2014/107818 A2 can easily be adapted to operate on a substrate carrier stack of the kind as provided by preferred embodiments the present invention.

It is proposed that the purging structures are provided in the form of purging passages, wherein each respective pair of vertically adjacent substrate carriers of the substrate carrier stack is provided with purging passages which pass through the arc-shaped portions of the partition webs of the substrate carriers of this pair of vertically adjacent substrate carriers such that a respective portion of the inner accommodation space is connected through at least one first purging passage with a respective first purging channel to allow a flow of purging gas from the first purging channel into the portion of the inner accommodation space or vice versa and is connected through at least one second purging passage with a respective second purging channel to allow a flow of purging gas from the portion of the inner accommodation space into the second purging channel or vice versa.

The at least one first purging channel and the at least one first purging passage are able to be used as a supply purging channel and as a supply purging passage, and the at least one second purging channel and the at least one second purging passage are able to be used as a discharge purging channel and as a discharge purging passage. Alternatively, the at least one second purging channel and the at least one second purging passage are able to be used as a supply purging channel and as a supply purging passage, and the at least one first purging channel and the at least one first purging passage are able to be used as a discharge purging channel and as a discharge purging passage. Appropriately, the arrangement is able to be such that purging gas supplied into the at least one supply purging channel is able to be supplied via at least one supply purging passage into a clearance space between respective pairs of neighboring substrates, namely a substrate carried by the substrate seat of an upper substrate carrier and a substrate carried by the substrate seat of a lower substrate carrier, and is able to be discharged from this clearance space via at least one discharge purging passage into the at least one discharge purging channel that discharges the purging gas via the at least one discharge purging channel. For a majority of the substrate carriers of the substrate carrier stack, the proposed purging passages passing through the arc-shaped portions of a respective pair of vertically adjacent substrate carriers are suitable to serve as a supply purging passage and as a discharge purging passage and are able to be sufficient for achieving an appropriate purging gas flow. It is preferably assumed here that all substrate carriers carry a respective substrate (this may not be always the case) and that the substrates are in agreement with a predetermined allowable substrate thickness or substrate thickness range for which the substrate carriers and the substrate carrier stack are designed, so that there are appropriate clearance spaces between respective pairs of adjacent substrates.

The substrate carrier stack is able to be provided with at least one supply port, which is connected with the at least one supply purging channel, to supply purging gas from an external purging gas source into the substrate carrier stack, and is able to be provided with at least one discharge port, which is connected with the at least one discharge channel, to discharge purging gas from the substrate carrier stack to an external purging gas drain.

Preferably, the purging passages are defined by an upper surface area of a respective arc-shaped portion of the partition webs of the lower substrate carrier of the respective pair of vertically adjacent substrate carriers and a respective lower surface area of a respective arc-shaped portion of the partition webs of the upper substrate carrier of the respective pair of vertically adjacent substrate carriers.

Preferably, a respective first purging passage extends completely along a respective of the first and second arc-shaped portions and at least substantial portions of the first and second connection portion of the respective of the first and second partition webs, which is defined by the upper surface of the respective partition web of the lower substrate carrier of the respective pair of vertically adjacent substrate carriers and the lower surface of the respective partition web of the upper substrate carrier of the respective pair of vertically adjacent substrate carriers, wherein a respective second purging passage extends completely along a respective of the second and first arc-shaped portions and at least substantial portions of the first and second connection portion of the respective of the second and first partition webs, which are defined by the upper surface of the respective partition web of the lower substrate carrier of the respective pair of vertically adjacent substrate carriers and the lower surface of the respective partition web of the upper substrate carrier of the respective pair of vertically adjacent substrate carriers, and wherein the first and second purging passages are located at opposing sides of the inner accommodation space.

Preferably, the purging passages are elongated nozzle openings including an opening width in the vertical direction which tapers towards the respective portion of the inner accommodation space. This preferably achieves an acceleration of the horizontal purging gas flows, which helps to achieve an effective purging treatment of the substrates.

According to a preferred embodiment of the present invention, most of the purging passages connect a respective portion of the inner accommodation space between an upper carrying plane defined by the substrate seat of the upper substrate carrier of another pair of vertically adjacent substrate carriers and a lower carrying plane defined by the substrate seat of the lower substrate carrier of this other pair of vertically adjacent substrate carriers with a respective first channel or with a respective second channel. The purging passages, which connect a respective portion of the inner accommodation space between a respective upper carrying plane and a respective lower carrying plane with the respective first channel or with the respective second channel, preferably are formed as a respective elongated curved purging passage which extends circumferentially about the respective portion of the inner accommodation space at a vertical distance from the lower carrying plane which exceeds a predetermined allowable thickness or thickness range of plate-shaped substrates for which the substrate carrier stack is designed and at a vertical distance from the upper carrying plane.

According to a preferred embodiment of the present invention, a majority of the substrate carriers of the substrate carrier stack include their respective arc-shaped portions located relatively to one particular associated lower substrate carrier which is positioned below the respective substrate carrier in the substrate carrier stack in such a manner that the carrying plane of the substrate seat of this associated lower substrate carrier of the substrate carrier stack intersects the arc-shaped portions of the respective substrate carrier of the majority of the substrate carriers.

Generally, all substrate carriers of the substrate carrier stack except one lower most substrate carrier or, preferably, a predetermined number of lowermost substrate carriers of the substrate carrier stack will include their respective arc-shaped portions located relatively to one particular associated lower substrate carrier of the substrate carrier stack in the mentioned manner and connect a respective portion of the inner accommodation space with a respective first channel and with a respective second channel.

The lowermost substrate carrier or a predetermined number of lowermost substrate carriers of the substrate carrier stack are able to include their respective arc-shaped portions located in the vertical extension range of a cylindrical protrusion of the base which extends upwardly into the inner accommodation space. The cylindrical protrusion is able to include a planar upper surface and a diameter corresponding to the predetermined allowable diameter or within the predetermined allowable diameter range of the substrates. Preferably, the planar upper surface is located below the carrying plane of the lowermost substrate carrier of the substrate carrier stack at a vertical distance which is of the same order as the distance between the carrying planes defined by the substrate seats of a respective pair of vertically adjacent substrate carriers. Preferably, this vertical distance corresponds to the vertical distance between the lower surface of an upper substrate carried by the substrate seat of the upper substrate carrier and the upper surface of a lower substrate carried by the substrate seat of the lower substrate carrier of such a pair of vertically adjacent substrate carriers.

For a majority of the substrate carriers of the substrate carrier stack, the carrying plane defined by the respective substrate seat is able to be located below purging passages which pass through the arc-shaped portions of the partition webs of the substrate carriers of a pair of vertically adjacent substrate carriers which is positioned above the respective substrate carrier in the substrate carrier stack.

Generally, all substrate carriers of the substrate carrier stack except one uppermost substrate carrier or, preferably, a predetermined number of uppermost substrate carriers of the substrate carrier stack will have the carrying plane defined by their respective substrate seat located below such purging passages provided by substrate carriers which are positioned above the respective substrate carrier in the substrate carrier stack.

It is proposed that the cover mentioned above includes purging formations which cooperate with the at least one first purging channel and the at least one second purging channel and which provide purging passages associated with the substrate seat of an uppermost substrate carrier or associated with the substrate seat of a respective substrate carrier of a predetermined number of uppermost substrate carriers, wherein the purging passages provided by the purging formations connect a respective portion of the inner accommodation space associated with the respective substrate seat directly or indirectly with a respective first purging channel and a respective second purging channel. Preferably, the purging passages provided by the purging formations connect a respective portion of the inner accommodation space between a planar lower surface area of the cover and the carrying plane defined by the seat of the uppermost substrate carrier, or between a respective upper carrying plane and a respective lower carrying plane defined by the seats of a respective pair of vertically adjacent substrate carriers, with a respective first purging channel or with a respective second purging channel, wherein the purging passages provided by the purging formations preferably are a respective elongated curved purging passage which extends circumferentially around the respective portion of the inner accommodation space at a vertical distance from the lower carrying plane which exceeds a predetermined allowable thickness or thickness range of plate-shaped substrates for which the substrate carrier stack is designed and at a vertical distance from the upper carrying plane or the planar surface area, respectively.

The purging formations are able to include a first partition ridge including a first arc-shaped region and a second partition ridge including a second arc-shaped region, which extend aligned with a respective of the first and second arc-shaped portions of the first and second partition webs of the substrate carriers, wherein the first partition ridge preferably includes first and second extension portions merging at one respective end into the first arc-shaped portion and the second partition ridge preferable includes first and second extension portions merging at one respective end into the second arc-shaped portion, wherein the first and second extension portions extend aligned with respective of the first and second connecting portions of the first and second partition webs of the substrate carriers, wherein the purging passages provided by the purging formations comprise for each portion of the inner accommodation space to be connected with a respective purging channel a respective first purging passage extending through the first partition ridge and a respective second purging passage extending through the second partition ridge.

Preferably, the first and second purging passages provided by the purging formations extend aligned with the first and second purging passages defined by the upper surfaces of the first and second partition webs of the lower substrate carrier of a respective pair of vertically adjacent substrate carriers and the lower surfaces of the first and second partition webs of the upper substrate carrier of the respective pair of vertically adjacent substrate carriers.

It is preferred that the purging passages are provided within the substrate carrier stack at defined equidistant vertical positions in a vertically staggered manner, such that the purging passages are located (a) at approximately half of the vertical distance between the planar lower surface area of the cover and the upper surface of a substrate carried by the substrate seat of the uppermost substrate carrier, or (b) at approximately half of the vertical distance between the lower surface of a substrate carried by the substrate seat of an upper substrate carrier of a pair of vertically adjacent substrate carriers and the upper surface of a substrate carried by the substrate seat of the lower substrate carrier of this pair of vertically adjacent substrate carriers, or (c) at approximately half of the vertical distance between the lower surface of a substrate carried by the substrate seat of the lowermost substrate carrier and the planar upper surface of the cylindrical protrusion of the base, if all substrate seats carry a respective plate-shaped substrate having a predetermined substrate thickness and having a circular circumference with a predetermined substrate diameter for which the substrate carrier stack is designed, or (d) in the vertical extension range of the cylindrical protrusion of the base.

Favorably, the upper supporting formation and the lower supporting formation of a respective substrate carrier are able to be provided in the form of an upper sealing formation and a lower sealing formation, one of the sealing formations preferably including at least one continuous sealing lip or sealing ridge extending continuously around the inner zone, and the other of the sealing formations preferably including at least one continuous sealing surface strip extending continuously around the inner zone, wherein, for each respective pair of vertically adjacent substrate carriers of the substrate carrier stack, the lower sealing formation of the respective upper substrate carrier is engaged or engageable with the associated upper sealing formation of the respective lower substrate carrier for sealing the inner zone and therewith the inner accommodation space from the surroundings of the substrate carrier stack. According to the preferred embodiment described above, also the at least one first purging channel and the at least one second purging channel are able to be sealed from the surroundings of the substrate carrier stack by the proposed sealing of the inner zone. The upper sealing formation of the uppermost substrate carrier is able to be engaged or engageable with an associated sealing formation of the cover and the lower sealing formation of the lowermost substrate carrier is able to be engaged or engageable with an associated sealing formation of the base, to seal the inner accommodation space, the at least one first purging channel, and the at least one second purging channel from the surroundings of the substrate carrier stack. The cover is able to be designed to have such a weight that the weight of the cover achieves or contributes to an adequate sealing engagement between sealing formations associated with each other.

It is proposed that one of the cover and the base includes a first port which communicates with the first purging channel and that one of the cover and the base includes a second port which communicates with the second purging channel, so that purging gas is able to be supplied into the substrate carrier stack via one of the first port and the second port defining and functioning as a supply port and is able to be discharged from the substrate carrier stack via the other of the first port and the second port serving as a discharge port, to achieve a purging gas flow through the inner accommodation space via that first and second purging channels and the purging passages. In particular, for example, one of the cover and the base is able to include the first port and the other of the cover and the base is able to include the second port. However, alternatively, one of the cover and the base is also able to include the first port and the second port. For example, having the base include the first port and the second port might be favorably for certain interfacing arrangements for connecting the ports with a supply line and a return line for purging gas, for example. For other interfacing arrangements, it might be favorable if the cover includes the first and second ports.

The first port is able to communicate with the first purging channel via a first laminarisator integrated respectively into the cover or the base to achieve or contribute to a substantially laminar purging gas flow through the first purging channel. Additionally, or alternatively, the second port is able to communicate with the second purging channel via a second laminarisator integrated respectively into the cover or the base to achieve or contribute to a substantially laminar purging gas flow through the second purging channel. At least one of the first laminarisator and the second laminarisator includes at least one of a gas filtering medium, for example, a laminarisation fabric, and a gas distribution manifold being adapted to reduce or prevent turbulences in purging gas passing therethrough.

Preferably, the first and second purging channels and the purging passages are dimensioned and positioned so as to achieve or contribute to a substantially laminar purging gas flow through the inner accommodation space. To this end, further the vertical distances between the carrying planes of the seats of the substrate carriers are preferably dimensioned so as to achieve or contribute to a substantially laminar purging gas flow through the inner accommodation space.

According to a preferred embodiment of the present invention, the frame vertex regions of the outer carrier frames of the substrate carriers each include a substantially planar outer vertex portion and a curved or slanting inner vertex portion which is integrally connected with the outer vertex portion and stands up, extending upwardly and towards the inner zone, from the outer vertex portion, wherein the frame webs of the outer carrier frames of the substrate carriers each include a respective curved or slanting web portion which extends along the respective frame web and stands up, extending upwardly and towards the inner zone, from a respective outer vertex portion or a respective lower web edge or a substantially planar outer web portion which extends at least partially along the respective frame web, wherein the curved or slanting web portions, each extending between a respective pair of inner vertex portions and merging into the inner vertex portions of the respective pair, and the inner vertex portions are shaped in such a manner that a continuous carrier frame profile is provided and extends around the inner zone and includes an upper and inner edge confining the inner zone.

In this case, the upper sealing formation of a respective substrate carrier is able to favorably be provided by a continuous surface portion of the continuous carrier frame profile, wherein the continuous surface portion extends along an upper side of the continuous carrier frame profile around the inner zone in close proximity thereto and defines and functions as a continuous sealing surface strip.

Preferably, the lower sealing formation of a respective substrate carrier is provided in the form of a continuous sealing lip or sealing ridge, which extends along a lower side of the continuous carrier frame profile around the inner zone in close proximity thereto.

According to preferred embodiments of the present invention, all substrate carriers of the substrate carrier stack are able to be of the same type.

Preferably, for each pair of vertically adjacent substrate carriers of the substrate carrier stack the substrate carriers are able to be stacked on each other such that the first frame web of the lower substrate carrier supports the third frame web of the upper substrate carrier, that the second frame web of the lower substrate carrier supports the fourth frame web of the upper substrate carrier, that the third frame web of the lower substrate carrier supports the first frame web of the upper substrate carrier, and that the fourth frame web of the lower substrate carrier supports the second frame web of the upper substrate carrier, so that respective first and third frame vertex regions of the outer carrier frames of the substrate carriers overlap at a first vertical edge region of the substrate carrier stack, respective first and third frame vertex regions of the outer carrier frames of the substrate carriers overlap at a third vertical edge region of the substrate carrier stack, respective second and fourth frame vertex regions of the outer carrier frames of the substrate carriers overlap at a second vertical edge region of the substrate carrier stack, and respective second and fourth frame vertex regions of the outer carrier frames of the substrate carriers overlap at a fourth vertical edge region of the substrate carrier stack.

In other words, the two substrate carriers of each pair of vertically adjacent substrate carriers of the substrate carrier stack are able to be rotated about a vertical rotation axis by 180 degrees relatively to each other to provide the substrate carrier stack. Preferably, certain features of the substrate carriers have a rotational symmetry of order two and certain features of the substrate carriers have a rotational symmetry of order one with respect to a rotation about a vertical rotation axis, such that the frame webs of a respective substrate carrier are able to be distinguished from each other.

Preferably, each substrate carrier of the substrate carrier stack includes at least one first positioning formation and at least one second positioning formation, wherein for each pair of vertically adjacent substrate carriers the at least one first positioning formation of the lower substrate carrier of this pair of vertically adjacent substrate carriers is engaged or engageable with the at least one second positioning formation of the upper substrate carrier of this pair of vertically adjacent substrate carriers, to safeguard or contribute to a proper relative positioning of the two substrate carriers of this pair of vertically adjacent substrate carriers.

Preferably, the first and second positioning formations are arranged and structured such that a respective first positioning formation, for example, one of a protrusion and an opening and a recess, of one substrate carrier is able to engage with a respective second positioning, for example the other of a protrusion and an opening or a recess, of another substrate carrier being the vertical adjacent substrate carrier located above or below in the substrate carrier stack, even if the substrate carrier stack includes only substrate carriers which are identically provided with the first and second positioning formations.

In particular, each substrate carrier of the substrate carrier stack is able to be identically provided with the at least one first positioning formation and the at least one second positioning formation, which are arranged at diametrically opposing portions of the outer carrier frame, such that the at least one first positioning formation of the lower substrate carrier of the respective pair of vertically adjacent substrate carriers is engageable with the at least one second positioning formation of the upper substrate carrier of this respective pair of vertically adjacent substrate carriers if the two substrate carriers of this respective pair of vertically adjacent substrate carriers are stacked on each other such that the first frame web of the lower substrate carrier supports the third frame web of the upper substrate carrier, the second frame web of the lower substrate carrier supports the fourth frame web of the upper substrate carrier, the third frame web of the lower substrate carrier supports the first frame web of the upper substrate carrier, and the fourth frame web of the lower substrate carrier supports the second frame web of the upper substrate carrier.

In other words, the positioning formations are able to be arranged such that the respective two substrate carriers of each respective pair of vertically adjacent substrate carriers of the substrate carrier stack must have been rotated about a vertical rotation axis by 180 degrees relatively to each other when the substrate carrier stack is assembled from a number of individual substrate carriers which are identically provided with the positioning formations. Otherwise, the first and second positioning formations would not engage with each other. If the substrate carrier stack includes a base and a cover, as considered below, the base is able to include at least one first positioning formation engaged or engageable with the at least one second positioning formation of the lowermost substrate carrier of the substrate carrier stack, and the cover is able to include at least one second positioning formation engaged or engageable with the at least one first positioning formation of the uppermost substrate carrier of the substrate carrier stack, so that a proper positioning of the base and the cover with the respect to the substrate carriers is facilitated or even guaranteed. The described solution safeguards a particular vertical sequence of the substrate carriers in the substrate carrier stack, which is able to be the basis for particular further inventive features of the substrate carrier stack to achieve further advantages and improvements over prior art solutions as described herein.

With reference to the particular relative arrangement of adjacent substrate carriers in the substrate carrier stack proposed above, it is to be noted that this relative arrangement of vertically adjacent substrate carriers has the consequence that respective first and second auxiliary openings of the substrate carriers stacked on each other form the at least one first purging channel, and that respective first and second auxiliary openings of the substrate carriers stacked on each other define the at least one second purging channel. To this end, the partition webs, and, in particular, the arc-shaped portions thereof are preferably provided in a complementary manner, such that each first arc-shaped portion is able to cooperate with an associated second arc-shaped portion or associated second arc-shaped portions of the vertically adjacent substrate carrier or carriers, and that each second arc-shaped portion is able to cooperate with an associated first arc-shaped portion or associated first arc-shaped portions of the vertically adjacent substrate carrier or carriers. According to a preferred embodiment referred to in the foregoing, which includes two first auxiliary openings and two second auxiliary openings in the inner zone of each substrate carrier, two first purging channels and two second purging channels are obtained in the substrate carrier stack.

Preferably, the frame vertex regions of the outer carrier frames of the substrate carriers are able to each include a planar or substantially planar outer vertex portion, wherein the first and second positioning formations are able to be provided at a respective of the planar or substantially planar outer vertex portions.

Preferably, each substrate carrier is provided with at least one vertical protrusion as one of a first and a second positioning formation and with at least one recess or opening as the other of a first and a second positioning formation.

According to a preferred embodiment of the present invention, each substrate holding arm of the plurality of substrate holding arms of a respective substrate carrier is provided at an associated of the frame webs in a region between the two frame vertex regions which are associated with the respective frame web, wherein the substrate holding arms are provided at the respective frame web at varying distances from the respective nearest of the two frame vertex regions which are associated with the respective frame web. Preferably, pairs of substrate holding arms of a respective substrate carrier, which are provided at diametrically opposed frame web portions of two frame webs including parallel frame web axes, have different distances from the respective nearest frame vertex region.

Favorably, the substrate holding arms are able to be arranged in the substrate carrier stack in at least four sets of vertically staggered substrate holding arms, wherein vertically directly neighboring substrate holding arms of a respective set are arranged offset with respect to each other horizontally, such that these neighboring substrate holding arms, which belong to a respective pair of vertically adjacent substrate carriers, do not overlap vertically at least at upper seat elements thereof which define the substrate seat together with corresponding upper seat elements of the other substrate holding arms of the respective substrate carrier.

The plurality of substrate holding arms of a respective substrate carrier preferably includes a first substrate holding arm and a second substrate holding arm, which are provided at one of the first frame web and the second frame web of the frame webs, and a third substrate holding arm and a fourth substrate holding arm, which are provided at that frame web of the third frame web and the fourth frame web of the frame webs, whose frame web axis extends parallel or substantially parallel to the frame web axis of the frame web at which the first substrate holding arm and the second substrate holding arm are provided.

A connection point of the first substrate holding arm, where the first substrate holding arm merges into the respective frame web, and a connection point of the fourth substrate holding arm, where the fourth substrate holding arm merges into the respective frame web, is able to have the same distance from the respective nearest frame vertex region, and a connection point of the second substrate holding arm, where the second substrate holding arm merges into the respective frame web, and a connection point of the third substrate holding arm, where the third substrate holding arm merges into the respective frame web, is able to have the same distance from the respective nearest frame vertex region. However, the distance of the connection points of the first substrate holding arm and the fourth substrate holding arm from the respective nearest frame vertex region are able to differ from the distance of the connection points of the second substrate holding arm and the third substrate holding arm from the respective nearest frame vertex region.

The proposed arrangements of the substrate holding arms discussed above enable or cause vertically adjacent neighboring substrate holding arms of vertically adjacent substrate carriers within the substrate carrier stack to not vertically overlap, so that a relatively small pitch, namely smaller vertical distances between the substrate seats within the substrate carrier stack, are able to be provided, resulting in a high storage density for the substrates within the substrate carrier stack.

According to a preferred embodiment of the present invention, the substrate carriers each are provided with a set of interfacing elements arranged at an outer circumference of the outer carrier frame, at which it is possible to individually and directly interact with the respective substrate carrier without necessarily directly interacting with other substrate carriers of the substrate carrier stack.

The interfacing elements are able to be projections which protrude from a neighborhood of the outer circumference of the respective outer carrier frame horizontally, such that the projections are able to be engaged from below to individually support a respective substrate carrier and relatively moving the respective substrate carrier vertically with respect to at least one other substrate carrier positioned below the respective substrate carrier in the substrate carrier stack.

This arrangement enables a handling or opener apparatus to interact in a technically simple manner with a respective substrate carrier, such that the respective substrate carrier is able to individually be supported or moved relatively to at least one other substrate carrier positioned below the respective substrate carrier in the substrate carrier stack, e.g., to access the substrate seats of the substrate carriers for loading and unloading of substrates.

Preferably, each substrate carrier includes one pair of projections protruding in a common horizontal direction and another pair of projections protruding in an opposed common horizontal direction, wherein the projections are provided at a respective of the frame vertex regions, preferably at a planar or substantially planar outer vertex portion of the respective frame vertex region, or at a respective frame web close to a respective frame vertex region, such that the projections are arranged at the substrate carrier stack in four sets of vertically staggered projections.

Preferably, a first projection is provided at the first frame vertex region or at the fourth frame web near the first frame vertex region, and a fourth projection is provided at the fourth frame vertex region or at the fourth frame web near the fourth frame vertex region, the first and fourth projections protrude in the same horizontal direction, and a second projection is provided at the second frame vertex region or at the second frame web near the second frame vertex region, and a third projection is provided at the third frame vertex region or at the second frame web near the third frame vertex region, the second and third projections protrude in the same direction which is opposed to the horizontal direction in which the first and fourth projections protrude.

Alternatively, a first projection is provided at the first frame vertex region or at the first frame web near the first frame vertex region, and a second projection is provided at the second frame vertex region or at the first frame web near the second frame vertex region, the first and second projections protrude in the same horizontal direction, and a third projection is provided at the third frame vertex region or at the third frame web near the third frame vertex region, and a fourth projection is provided at the fourth frame vertex region or at the third frame web near the fourth frame vertex region, the third and fourth projections protrude in the same direction which is opposed to the horizontal direction in which the first and fourth projections protrude.

According to a preferred embodiment of the present invention, the first and fourth projections or the first and second projections are projections of a first type and the second and third projections or the third and fourth projections are projections of a second type, wherein a projection of the first type and a projection of the second type have different shapes or/and are positioned differently at or relatively to the respective frame vertex region. This simplifies an individual interaction with a selected of the substrate carriers by, for example, suitable interfacing formations of an external handling or movement device.

The projections are able to be arranged at the substrate carrier stack in plural sets of vertically staggered projections, wherein the projections of a respective set are arranged such that vertically directly adjacent projections do not overlap vertically or do not completely overlap vertically. Enlarged vertical distances between vertically aligned projections are obtained, which preferably are projections of the same type.

The substrate carriers of the substrate carrier stack are identically provided with the projections according to preferred embodiments of the present invention.

Preferably, the substrate carriers are integrally molded from a plastic material, preferably, by injection molding. The substrate carriers are able to be molded from a plastic material that reduces static electricity. This is to be recommended in particular for clean room applications, for example. Preferably, the substrate carriers are molded from polyether ether ketone, PEEK, or polycarbonate, PC.

A preferred embodiment of the present invention provides a substrate carrier stack including a plurality of substrate carriers which are stacked or stackable on each other and carry a respective plate-shaped substrate within an inner accommodation space of the substrate carrier stack, wherein the substrate carrier stack includes at least one first purging channel and at least one second purging channel, which extend vertically parallel or substantially parallel to the inner accommodation space at opposing sides thereof, and purging structures which enable horizontal purging flows within the substrate carrier stack through spaces between substrates held by the substrate carriers, wherein the substrate carriers each include an outer carrier frame provided with a seat to carry a respective substrate, and wherein the outer carrier frame extends around the first and second purging channels and the inner accommodation space. This substrate carrier stack and the substrate carriers included therein are able to be characterized by further features of the substrate carrier stack and the substrate carriers described in the foregoing.

A preferred embodiment of the present invention provides a substrate carrier, which includes an outer carrier frame which extends in a frame plane around an inner zone including an inner opening and defines or is provided with a substrate seat that accommodates and carries a plate-shaped substrate. The substrate carrier further includes at the outer carrier frame at least one upper supporting formation and at least one lower supporting formation, such that the substrate carrier is able to define and function as a lower substrate carrier which supports with its at least one upper supporting formation another substrate carrier of the same type at its at least one lower supporting formation, which is stacked on the substrate carrier, and such that the substrate carrier is able to define and function as an upper substrate carrier which is supported at its at least one lower supporting formation by the at least one upper supporting formation of another substrate carrier of the same type, on which the substrate carrier is stacked.

The substrate carrier further includes the following features:

the outer carrier frame includes a first frame web extending along a first frame web axis, a second frame web extending along a second frame web axis, a third frame web extending along a third frame axis, and a fourth frame web extending along a fourth frame web axis, the first frame web axis intersects the fourth frame web axis at right angles at a first vertex associated with the first frame web and to the fourth frame web and a first frame vertex region of the outer carrier frame at which the first frame web and the fourth frame web are integrally connected, the first frame web axis intersects the second frame web axis at right angles at a second vertex associated with the first frame web and to the second frame web and a second frame vertex region of the outer carrier frame at which the first frame web and the second frame web are integrally connected, the third frame web axis intersects the fourth frame web axis at right angles at a fourth vertex associated with the third frame web and to the fourth frame web and a fourth frame vertex region of the outer carrier frame at which the third frame web and the fourth frame web are integrally connected, the third frame web axis intersects the second frame web axis at a third vertex associated with third frame web and to the second frame web and a third frame vertex region of the outer carrier frame at which the third frame web and the second frame web are integrally connected, and a plurality of substrate holding arms extend inwardly and upwardly from the outer carrier frame which overlap with the inner zone and form the substrate seat, which is located at a distance above the vertical extent of the carrier frame and is adapted to carry a plate-shaped substrate having a circular circumference and a diameter corresponding to a predetermined allowable diameter or within a predetermined allowable diameter range given by a predetermined allowable minimum diameter and a predetermined allowable maximum diameter, the substrate seat defines a carrying plane which, in case that a plate-shaped substrate having a circular circumference and a diameter corresponding to the predetermined allowable diameter or the predetermined allowable maximum diameter is carried and held horizontally by the substrate seat, is coplanar with a lower surface of this plate-shaped substrate, a plurality of partition webs extend from the outer carrier frame through the inner zone, which define the inner opening and at least two auxiliary openings of the inner zone, wherein the inner opening and the substrate seat are arranged and dimensioned such that a plate-shaped substrate carried by the substrate seat and having a circular circumference and a diameter corresponding to the predetermined diameter or being within the predetermined diameter range does not overlap with any portion of the partition webs, at least one first arc-shaped portion of the partition webs extends in a space between the fourth frame web and the inner opening defining at least one first auxiliary opening, at least one second arc-shaped portion of the partition webs extends in a space between the second frame web and the inner opening defining at least one second auxiliary opening, and the arc-shaped portions have a radius of curvature which is adapted to the predetermined diameter or predetermined diameter range.

Preferably, the substrate carrier is adapted to be combined with a number of other substrate carriers of the same or similar type to provide a substrate carrier stack according to a preferred embodiment of the present invention as described in the foregoing, by stacking the substrate carriers on each other such that the arc-shaped portions of the partition webs of the substrate carriers of the substrate carrier stack limit the inner accommodation space of the substrate carrier stack at least in a direction parallel or substantially parallel to a first horizontal axis of the stack of carriers which is parallel or substantially parallel to the first and third web frame axes of the substrate carriers, wherein the first auxiliary openings and the second auxiliary openings of the inner zones of the substrate carriers of the substrate carrier stack combine to define at least one first purging channel and at least one second purging channel of the substrate carrier stack which extend vertically parallel to the inner accommodation space at opposing sides thereof.

Preferably, purging structures of the substrate carrier and of the other substrate carriers of the same or similar type combined therewith enable horizontal purging flows within the substrate carrier stack through spaces between substrates held by the substrate seats of the substrate carriers.

Favorably the substrate carrier is able to be characterized by one or plural further features of a respective substrate carrier of the substrate carrier stack according to preferred embodiments of the present invention as described in the foregoing.

A preferred embodiment of the present invention further provides a method of treating semiconductor wafers including the steps of:

loading semiconductor wafers into a substrate carrier stack according to a preferred embodiment of the present invention as described in the foregoing, so that each semiconductor wafer is held by the seat of a respective substrate carrier of the substrate carrier stack;

bathing the semiconductors in purging gas flows passing through spaces between the substrates by supplying purging gas into one of the first purging channel and the second purging channel of the substrate carrier stack and discharging purging gas from the other of the first purging channel and the second purging channel of the substrate carrier stack, and unloading the semiconductor wafers from the substrate carrier stack.

The above and other features and preferred embodiments of the present invention according to various aspects thereof will be apparent from the accompanying drawings and from the detailed description that follows.

BRIEF DESCRIPTION OF THE DRAWINGS

FIG. 11A and FIG. 11B are perspective views of a substrate carrier according to a fifth preferred embodiment of the present invention, wherein FIG. 11A is a perspective view showing the upper side of the substrate carrier and FIG. 11B is a view showing the lower side/underside of the substrate carrier.

FIG. 12A is a top down view on the upper side of the substrate carrier of the fifth preferred embodiment of the present invention, and FIGS. 12B and 12C show enlarged details thereof.

FIG. 13 is a cross-sectional side view of the substrate carrier according to sectional axis XIII-XIII in FIG. 12A.

FIG. 14 is a side view of the substrate carrier according to a view direction XIV in FIG. 12A.

FIG. 15 is a close up side sectional view of a portion including a substrate holding arm of the substrate carrier according to section XV-XV in FIG. 12A.

FIG. 16 is a close up side sectional view of a detail XVI in FIG. 13.

FIG. 17A is a perspective view of plural substrate carriers of a substrate carrier stack according to the fifth preferred embodiment of the present invention with substrates held by a respective substrate carrier in the substrate carrier stack, and FIG. 17B is a cross-sectional side view through the substrate carriers of FIG. 17A and circumferential edges of the substrates of detail B in FIG. 17A, according to a section corresponding to the section of the substrates in FIG. 17A.

FIG. 18A shows three substrate carriers of the fifth preferred embodiment of the present invention in top down views superimposed on each other for illustrating a proper rotational positioning of the substrate carriers relative to a vertical axis in a substrate carrier stack according to a preferred embodiment of the present invention, and FIG. 18B is a partial top down view on the substrate carriers stacked on each other.

FIG. 20 is a perspective view on vertex regions of the four substrate carriers according to FIG. 19 stacked on each other, with mutually engaged positioning formations to attain and maintain a proper relative positioning of the substrate carriers within a substrate carrier stack.

FIG. 21 shows a substrate carrier stack including substrate carriers of the fifth preferred embodiment stacked on each other together with a base and a cover of the substrate carrier stack.

DETAILED DESCRIPTION OF THE PREFERRED EMBODIMENTS

Figure 1:
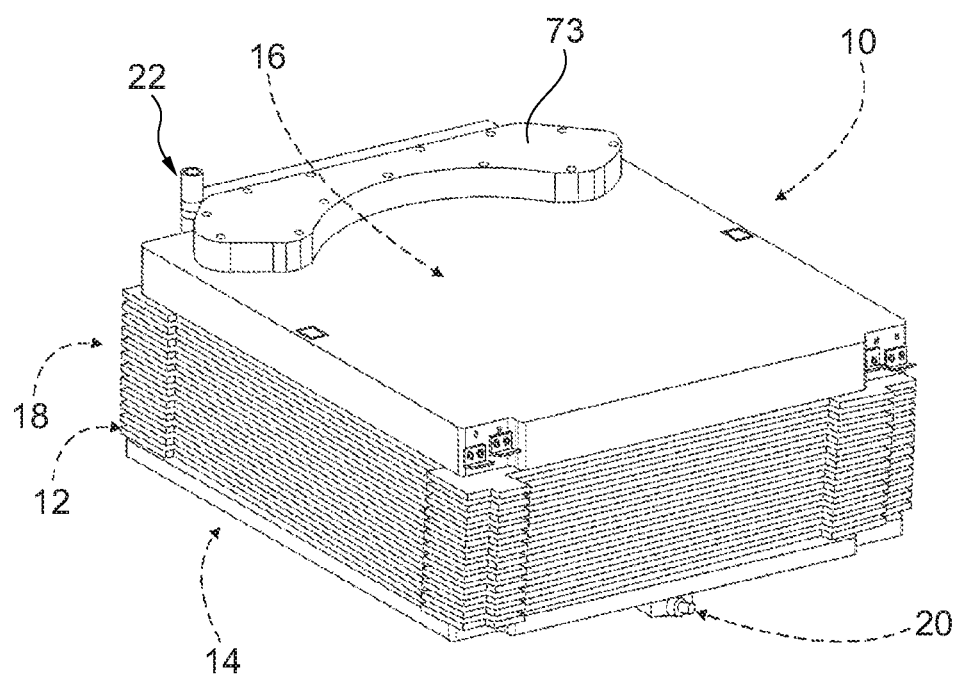
FIG. 1 is a perspective view of a substrate carrier stack according to a first preferred embodiment of the present invention, which includes plural substrate carriers, a base, and a cover.

FIG. 1 is a perspective view of a first preferred embodiment of a substrate carrier stack 10 including a plurality of substrate carriers 12 stacked on each other, wherein the substrate carriers are stacked on a base 14 of the substrate carrier stack and a cover 16 of the substrate carrier stack is stacked on the substrate carriers. According to, for example, the terminology of US 2017/0372930 A1, the substrate carrier stack 10 may be denoted as "substrate holder", which includes multiple separate "modules", namely the substrate carriers 12, the base 14, which may be denoted as "top module" or "cap piece" or "upper cap" or similar, and the cover 16, which may be denoted as "bottom module" or "bottom piece" or "bottom cap" or similar. The stacked substrate carriers 18, namely the plurality of individual substrate carriers 12 stacked on each other without the base 14 and the cover 16, may be denoted as "stacked module".

The base 14 and the cover 16 are able to be considered to be included in the substrate carrier stack 10, according to preferred embodiments of the present invention. This substrate carrier stack including the base 14 and the cover 16 is also able to be denoted as "Tec-Cell." However, it is to be noted, that it may not always be necessary that a base and a cover are provided and used. This will depend on, for example, the particular applications for which the substrate carriers are used. Accordingly, also the plurality of individual substrate carriers 12 stacked on each other, i.e., the stacked substrate carriers 18 without the base 14 and the cover 16, are able to constitute a substrate carrier stack according to preferred embodiments of the present invention.

Each of the substrate carriers is able to hold a respective substrate, for example, a substrate in the form of a semiconductor wafer, as will become apparent in the following. The substrate carrier stack is able to include disparate substrate carriers or substrate carriers of different types. Preferably, plenum structures for processing gasses or purging gases and sealing structures for keeping the interior environment of the substrate carrier stack and therewith the substrates held by the substrate carriers isolated from the ambient are realized. Each of the substrate carriers, the base, and the cover are able to include structures which provide or cooperate to provide such plenum structures and sealing structures of the substrate carrier stack.

As shown in FIG. 1, the base 14 is able to include a nozzle or connector 20 which is able to be connected to a gas supply or return, such that the gas is able to be introduced to the interior environment, such that the substrates interact with the gas or are treated by the gas. The gas nozzle or gas connector 20 is able to be of any design and arranged differently, e.g., on any side of the base 14. A plurality of such nozzles or connectors 20 are able to be provided. Further, the cover 16 is able to be provided alternatively, or additionally, with one or a plurality of gas nozzles or gas connectors, such as the gas nozzle or gas connector 22. Preferably, overall at least two gas nozzles or gas connectors are provided, so that a gas circulation through the interior environment of the substrate carrier stack is able to be achieved. In a preferred embodiment of the present invention, two such nozzles or connectors are provided, such that one of the nozzles or connectors is able to be an entry nozzle, an entry connector, or an inlet for the gas and the other is able to be a return or a waste nozzle or a return or waste connector or outlet for the gas. It may be also noted that the nozzles or connectors are able to bring in any gas, or other product, such as a liquid, for any reason, and that the nozzles or connectors are able to be connected to another device, which is able to treat, pressurize, or provide the gas or other products, and is able to be in any location. However, a particularly relevant application is to submit substrates held by the substrate carriers to a purging treatment, which involves providing a purging gas flow within the substrate carrier stack which passes the substrates, so that the nozzles or connectors introduce and discharge purging gases into and from the substrate carrier stack.

Figure 2:
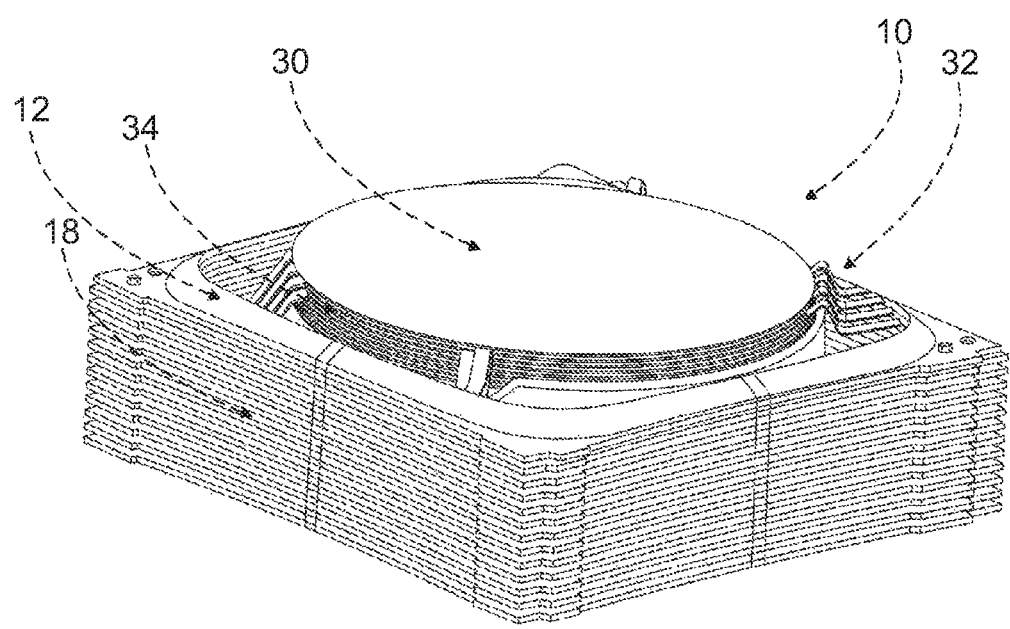
FIG. 2 is a perspective view of the substrate carrier stack according to FIG. 1, with substrates held by the substrate carriers, and the base and the cover being removed.

FIG. 2 is a perspective view of the stacked substrate carriers 18, i.e., the plurality of individual substrate carriers 12 stacked on each other, without the base 14 and the cover 16. As shown in FIG. 2, each substrate carrier 12 is able to hold a respective substrate 30. To this end, the substrate carriers 12 each include a plurality of substrates holding arms 32 which commonly define a substrate seat of the respective substrate carrier. According to a preferred embodiment of the present invention, a respective substrate carrier 12 includes four substrate holding arms 32.

The plurality 34 of the substrates 30 held by the substrate carriers 12 of the substrate carrier stack 10 are positioned at defined vertical positions, with defined vertical spaces between vertically neighboring substrates. Depending on the use scenario, it may be possible that not all of the substrate carriers of the substrate carrier stack hold a respective substrate in their respective substrate seat. If all substrate carriers 12 of the substrate carrier stack 10 hold a respective substrate of the same kind, it is preferred that these substrates are positioned by the substrate seats at equidistant vertical positions.

It should be noted that the substrate carriers are able to include any number of substrate holding arms allowing a proper holding of a substrate held by the substrate seat defined by holding ends of the substrate holding arms. Typically, including at least three substrate holding arms per substrate carrier is preferable. Preferably, four substrate holding arms per substrate carrier are provided, as in the preferred embodiments shown in the figures. In principle, the substrate holding arms are able to be of any design.

It should not be ruled out that in alternative preferred embodiments the substrate carrier stack or its substrate carriers are able to be provided with barriers such that each substrate is able to be separated or isolated from the one above or below in the substrate carrier stack. The barrier, which preferably should not be touching the substrates, is able to provide protection of the substrates such that in an instance where a substrate may be contaminated or wherein, if a substrate cracks or breaks, material from the contaminated or broken substrate does not fall on or contaminate other substrates. Such barriers are able to be formed integrally with a respective substrate carrier or are able to be separate elements which are included in the substrate carrier stack.

Figure 3:
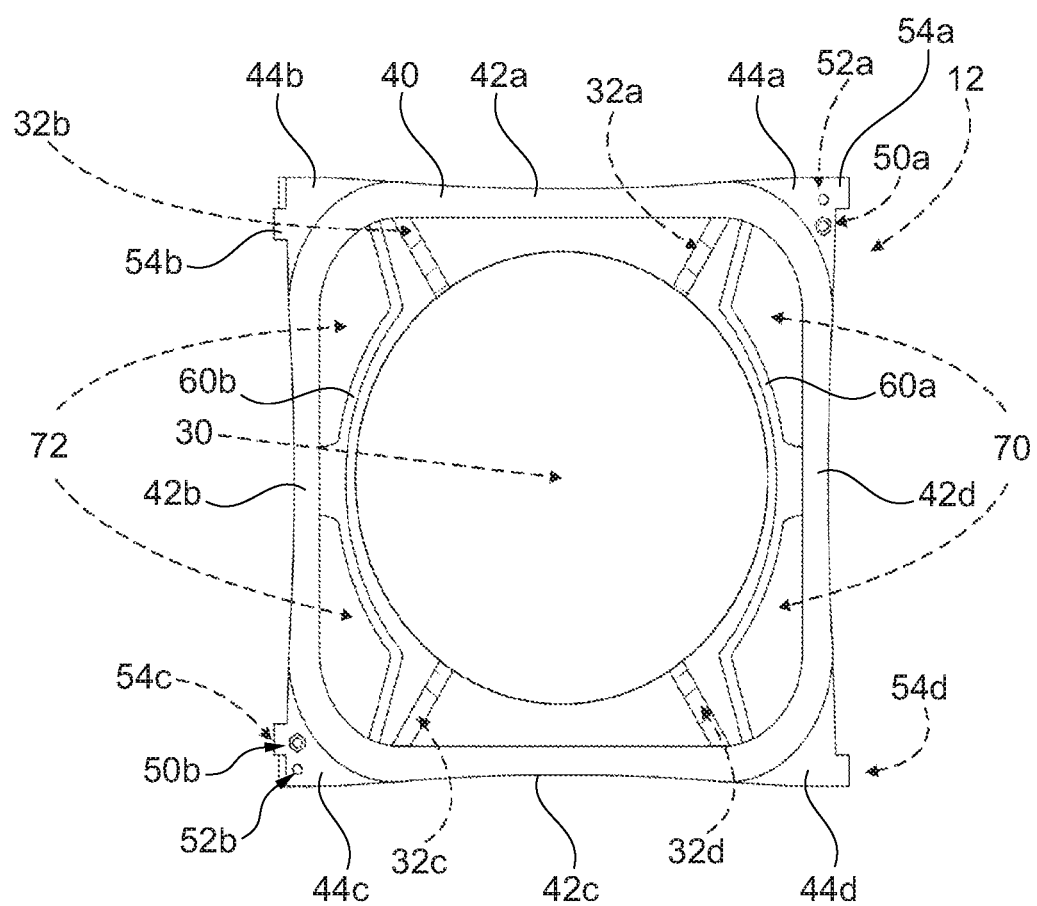
FIG. 3 is a top down view of a substrate carrier holding a substrate according to a first subtype of a second preferred embodiment of the present invention which differs slightly from the substrate carriers of the first preferred embodiment of the present invention including the substrate carrier stack according to FIGS. 1 and 2.
Figure 4A:
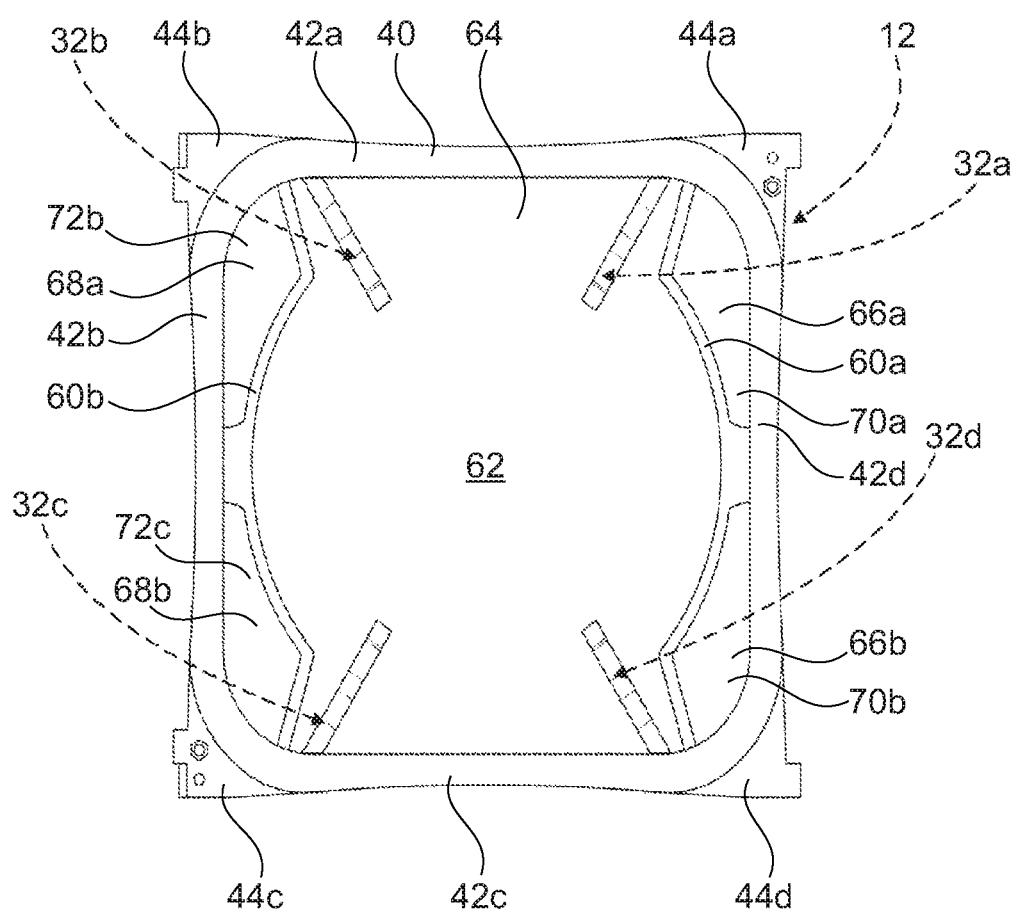
FIG. 4A is a top down view of the substrate carrier according to FIG. 3 without the substrate.

FIG. 3 is a top down view of a substrate carrier 12 of a second preferred embodiment of the present invention holding a substrate 30. Since the substrate carriers of the second preferred embodiment differ only slightly from the substrate carriers 12 of the substrate carrier stack 10 according to the first preferred embodiment shown in FIGS. 1 and 2, the same reference numbers are used for both preferred embodiments. FIG. 4A is a top down view of the substrate carrier of the second preferred embodiment without the substrate.

Figure 4B:
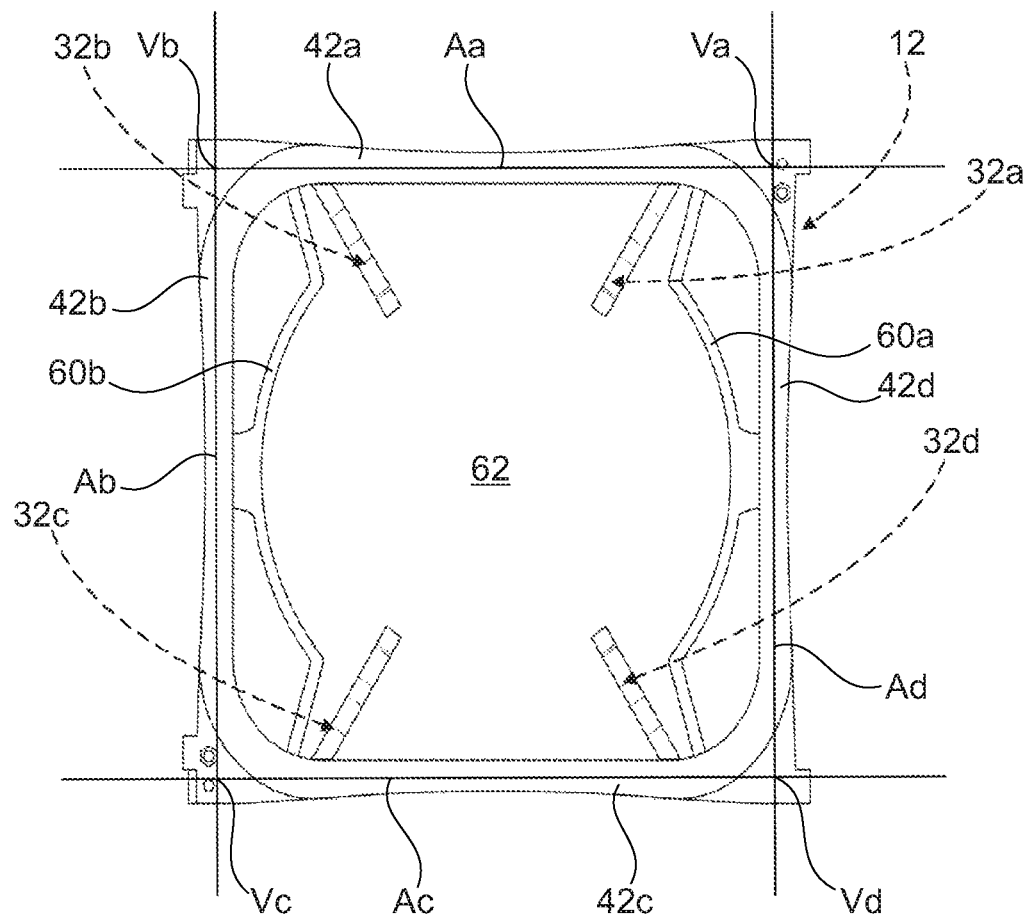
FIG. 4B is a corresponding drawing in which axes and vertex points associated with portions of the substrate carrier have been added.

Similar to the substrate carriers 12 of the first embodiment, the substrate carrier 12 of the second preferred embodiment includes an outer carrier frame 40, which includes four frame webs 42a, 42b, 42c, and 42d, which are integrally connected in pairs at a respective frame vertex region of the outer carrier frame. The four frame vertex regions of the outer carrier frame 40 are designated by the reference numbers 44a, 44b, 44c, and 44d. As shown in FIG. 4B, the frame webs extend along associated frame web axes Aa, Ab, Ac, and Ad, which intersect at right angles in pairs at a respective vertex associated with a respective of the vertex regions. Accordingly, the outer carrier frame is at least substantially of a quadratic or rectangular shape, in case of preferred embodiments being shown of generally quadratic or rectangular shape, as is apparent from FIG. 3, FIG. 4A, and the other figures. FIG. 4B illustrates the frame web axes Aa, Ab, Ac, and Ad, and vertexes Va, Vb, Vc, and Vd, which can easily be associated with the frame webs and frame vertex regions of the outer carrier frame 40 of the substrate carrier 12 of FIG. 3 and FIG. 4A.

The substrate carrier 12 of the second preferred embodiment, like the substrate carrier 12 of the first preferred embodiment, includes four substrate holding arms 32, which are assigned the individual reference numbers 32a, 32b, 32c, and 32d and form with their respective free holding end the substrate seat for the substrate. The free holding end may also be denoted as seat portion of the respective substrate holding arm. As shown in FIG. 4A, the four substrate holding arms 32a, 32b, 32c, and 32d protrude inwardly from the outer carrier frame 40, in a direction towards or substantially towards a center of the substrate holder. The lengths of the arms are able to be of any length. For example, the lengths of the arms are able to be determined by the intended substrate size. Further, in a preferred embodiment of the present invention the arms are made in a single mold or piece with the substrate carrier, such that the lengths are fixed. However, it shall not be ruled out that the substrate holding arms are able to be adjustable via a hanger or extension in other preferred embodiments of the present invention.

It may be appropriate that the substrate carrier 12 includes guides or latches or other formations along its exterior, top, and bottom sides, such that guides are able to interface with the below or above substrate carrier in a substrate carrier stack including the substrate carriers, such that the substrate carriers when stacked are secured or interact such that the stack does not fall or become misaligned. Further, a proper and predefined relative positioning of the two substrate carriers of such a pair of vertically adjacent substrate carriers is able to be safeguarded or contributed to by such guides or latches or other formations, which are able to be of any type, any number, and on any side of the module. According to a preferred embodiment of the present invention, at least one protrusion of one substrate carrier fits into an opening or a recess in the below or above substrate carrier, such that the two substrate carriers become able to resist lateral movement. Further, a proper and predefined relative positioning and orientation of the substrate carriers of such a pair of vertically adjacent substrate carriers and correspondingly of all substrate carriers of the substrate carrier stack are able to be safeguarded or contributed to in this way.

For example, as shown in the figures, the substrate carriers 12 are able to be provided with protrusions 50a, 50b and recesses or openings 52a, 52b. A first pair of a protrusion 50a and a neighboring recess or opening 52a, and a second pair of a protrusion 50b and a neighboring recess or opening 52b, are arranged at diametrically opposing frame vertex regions 44a and 44c of the outer carrier frame 40. Each protrusion 50a, 50b is able to protrude into a corresponding respective opening or recess of the vertically adjacent above substrate carrier stacked on the respective substrate carrier, and into each opening or recess 52a, 52b a corresponding respective protrusion of the vertically adjacent below substrate carrier, on which the respective substrate carrier is stacked, is able to protrude. Preferably, upwardly protruding protrusions are assumed, as shown in the figures. However, alternatively, downwardly protruding protrusions are possible. In this case, each protrusion is able to protrude into a corresponding respective opening or recess of the vertically adjacent below substrate carrier, on which the respective substrate carrier is stacked, and into each opening or recess a corresponding respective protrusion of the vertically adjacent above substrate carrier stacked on the respective substrate carrier is able to protrude. A combination of upwardly and downwardly protruding protrusions is also possible.

In principle, the protrusions and recesses or openings are able to be of any number, and are able to be on any side or location on the respective substrate carrier. These extrusions are also able to aid in the self-centering and self-aligning ability of each substrate carrier with the below or above substrate carrier, as well as aid in the ability to resist lateral movement and de-alignment, as discussed above.

Figure 4C:
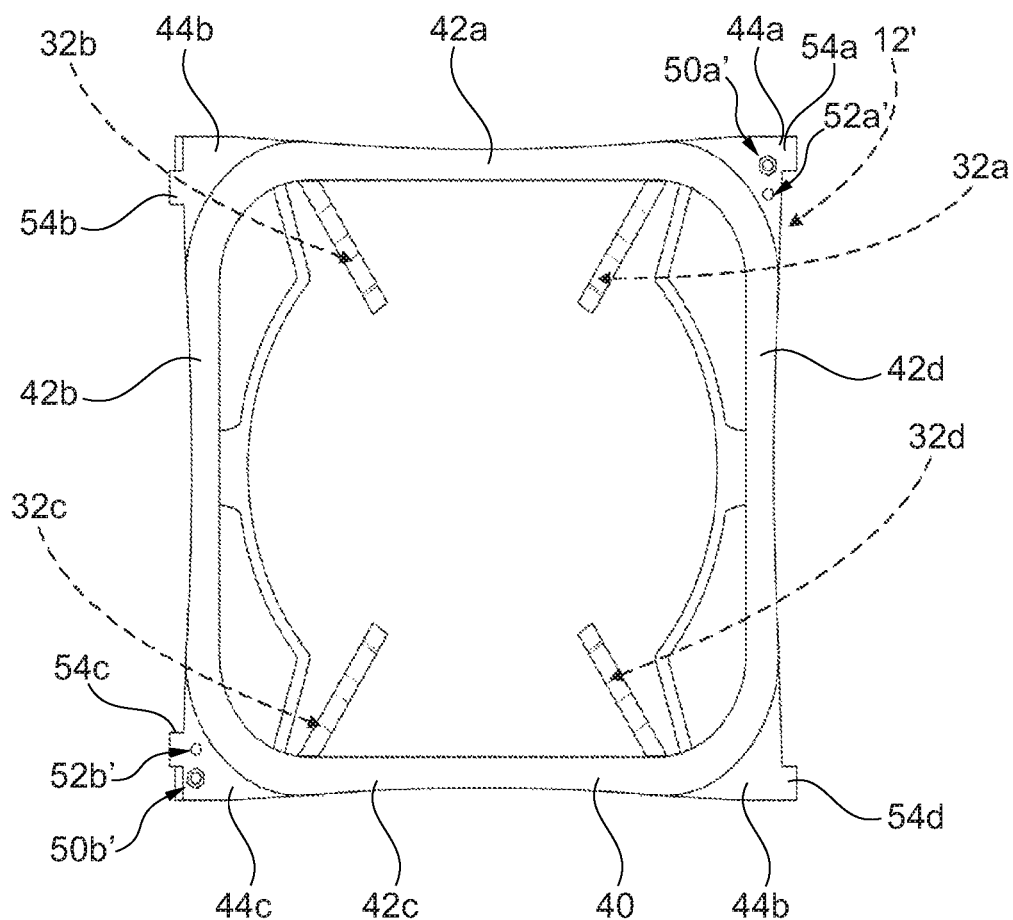
FIG. 4C is a corresponding drawing of a substrate carrier according to a second subtype of the second preferred embodiment of the present invention.

The arrangement of the protrusions 50a, 50b and recesses or openings 52a, 52b shown in FIGS. 3, 4A, and 4B is such that, in a substrate carrier stack including identical substrate carriers stacked on each other, the protrusions of all substrate carriers would be vertically aligned and the recesses or openings of all substrate carriers would be vertically aligned, so that no protrusion is able to engage with an associated recess or opening of the vertically adjacent below or above substrate carrier. This applies also in the case that the substrate carriers would have been stacked on each other in alternating relative rotational positions corresponding to rotations by 180 degrees about a vertical rotation axis, so that alternatingly the frame vertex regions 44a and 44c are located above each other at diametrically opposing vertical edge regions of the substrate carrier stack. Obviously, at least two subtypes of substrate carries are needed, namely the substrate carrier 12 of a first subtype as shown in FIGS. 3, 4A, and 4B and a substrate carrier 12' of a second subtype as shown in FIG. 4C.

The substrate carrier 12' of a second subtype includes a first pair of a protrusion 50a' and a neighboring recess or opening 52a', and a second pair of a protrusion 50b' and a neighboring recess or opening 52b', which are arranged at diametrically opposing frame vertex regions 44a and 44c of the outer carrier frame 40 like the realization of substrate carrier 12 of the first subtype. However, the substrate carrier 12' of a second subtype has interchanged positions of the protrusions and the recesses or openings compared to the substrate carrier 12 of the first subtype. In the substrate carrier stack, the substrate carriers 12 and 12' of the two subtypes must be alternatingly stacked on each other, so that each protrusion is able to protrude into an associated recess or opening of the vertically adjacent above substrate carrier and the above discussed advantages are able to be achieved. Besides the reference signs 12', 50a', 52a', and 52b', the same reference signs used for the substrate carrier 12 of the first subtype are also used for the substrate carrier 12' of the second subtype, since there are preferably no further differences between these two subtypes. In the following description, when it is referred to "substrate carriers 12" of a substrate carrier stack, the reference sign 12 may relate to substrate carriers 12 of the first subtype as well as to substrate carriers 12' of the second subtype.

Figure 10:
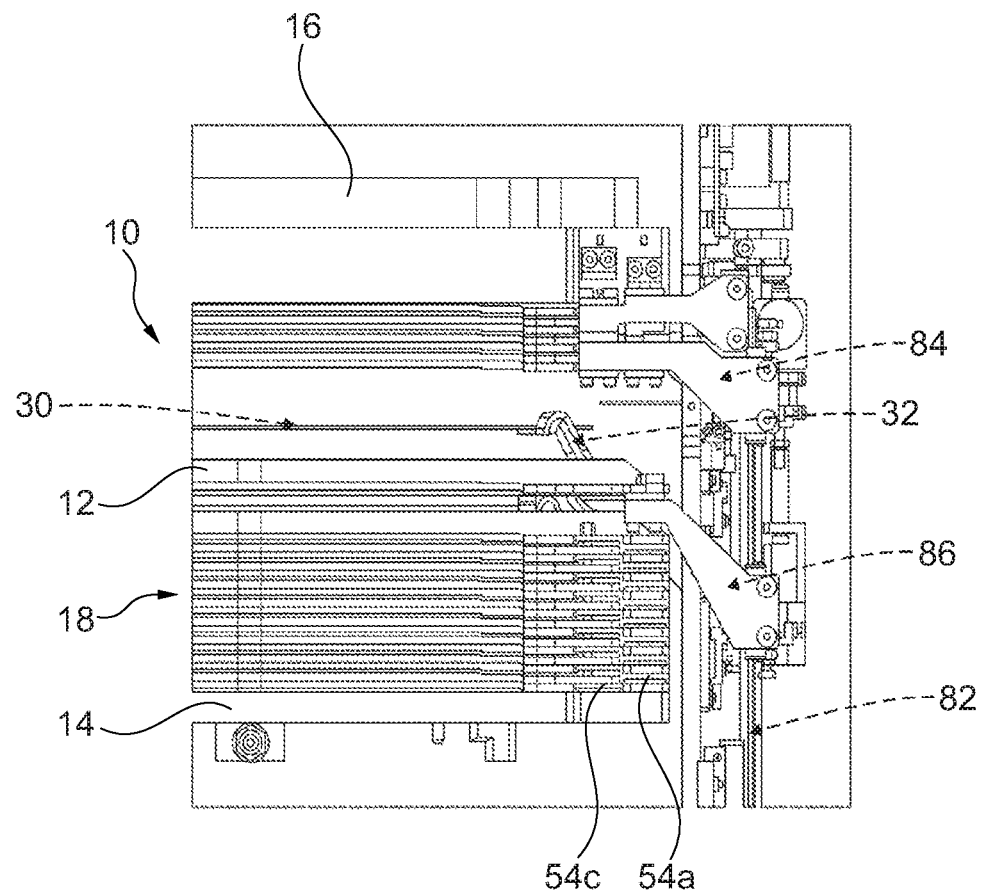
FIG. 10 is a side sectional perspective view of the substrate carrier stack according to the fourth preferred embodiment together with a movement mechanism of an opener apparatus, wherein the substrate carrier stack is showed in an opened state with a vertical gap between a lower substrate carrier of an upper partial substrate carrier stack and an upper substrate carrier of a lower partial substrate carrier stack.

The substrate carriers 12, 12' according to the two sub-types include, at an outer circumference of the outer carrier frame 40, particular formations, in the present case, projections 54a, 54b, 54c, and 54d, which project in a sideward or horizontal direction and allow an interaction device or mechanism, e.g., a handling, supporting, or movement device or mechanism to interact with a respective substrate carrier in a substrate carrier stack. For example, a movement mechanism of an opener apparatus as exemplified below in the context of FIG. 10 is able to interact with a respective substrate carrier by engaging with such projections. Accordingly, these formations may generally be denoted as "interfacing formations," and in the present case as "interfacing projections."

In the present case, there are four such interfacing projections 54a, 54b, 54c, and 54d, which are located respectively at the frame vertex regions 44a, 44b, 44c, and 44d. A first type of these projections, namely the projections 54a and 54d are located at the frame vertex regions 44a and 44d and project in a sideward direction with respect to frame web 42d, and a second type of these projections, namely the projections 54b and 54c are located at the frame vertex regions 44b and 44c and project in a sideward direction with respect to frame web 42b, so that the projections of the first type and the projections of the second type project in opposing directions from the outer carrier frame 40. The projections 54b and 54c of the second type are located somewhat more inwardly along the frame web axis Ab at the respective frame vertex region than the projections 54a and 54d of the first type along the frame web axis Ad at the respective frame vertex region. This allows a stacking of the substrate carriers 12, 12' according to the two sub-types alternatingly on each other to achieve horizontally staggered interfacing projections, as shown in FIGS. 8A, 8B, 9, and 10 for a corresponding preferred embodiment of the present invention. To this end, the substrate carriers of the two sub-types are stacked on each other in relatively rotated relative positions on basis of rotations of 180° about a vertical axis, so that alternating interfacing projections of the first type and interfacing projections of the second type protrude in the sideward direction from the substrate carrier stack and do not overlap or overlap only slightly in a vertical direction. This is favorable for simplifying the engagement of engagement formations of an interaction device or mechanism as mentioned above with a respective substrate carrier of the substrate carrier stack.

As shown in FIGS. 29A, 29B, 29C, 29D, 30A, 30B, 30C, and 30D, the projections 54a, 54b, 54c, and 54d and the substrate holding arms 32a, 32b, 32c, and 32d are able to be formed in various configurations.

It should be noted, that the substrate carriers 12 of the substrate carrier stack 10 of FIGS. 1 and 2 include different kinds of interfacing projections which protrude in sideward or horizontal direction from the outer carrier frame of the respective substrate carrier. According to the arrangement shown in FIGS. 1 and 2, interfacing projections of a respective identical type project from a respective frame web or respective frame vertex regions of the respective substrate carriers and overlap completely in vertical direction. It may be assumed that this is the only relevant difference between the preferred embodiment of FIGS. 1 and 2 and the preferred embodiment of FIGS. 3, 4A, 4B, and 4C, so that the preceding and following detailed description of the substrate carriers 12, 12' according to FIGS. 3, 4A, 4B, and 4C may be understood to be also a description of corresponding details of corresponding substrate carriers 12 of a first subtype and corresponding substrate carriers 12' of a second subtype of the substrate carrier stack of FIGS. 1 and 2.

The substrate carriers of the preferred embodiments of the present invention discussed above are provided with partition webs 60a and 60b, which divide an inner zone 62 of the respective substrate carrier 12, 12' into multiple openings. The outer carrier frame 40 extends around the inner zone, and the partition webs 60a and 60b extend between the frame webs 42a and 42c and are integrally connected with these frame webs 42a and 42c such that a large inner opening 64 and two pairs of smaller inner openings 66a, 66b and 68a, 68b are formed. The large inner opening 64 is located between a first pair of smaller inner openings 66a, 66b, which extend between the frame web 42d and the partition web 60a, and a second pair of smaller inner openings 68*a*, 68*b*, which extend between the frame web 42*b* and the partition web 60*b*. For example, the smaller inner openings have identical or corresponding symmetric shapes, as shown in the figures. Preferably, for stability reasons, the partition webs 60*a* and 60*b* are integrally connected at a medial region with the respective neighboring frame web 42*d* and 42*b*, respectively, so that a respective pair of smaller inner openings is obtained. Instead, a respective larger inner opening on both sides of the lager inner opening 64 is able to be provided, if no such integral connection with the neighboring frame web at the medial region of the respective partition web is included.

The large inner openings 64 of the substrate carriers 12, 12' define an inner accommodation space of a substrate carrier stack including the substrate carriers 12, 12'. In this inner accommodation space, the substrates or semiconductor wafers are held by respective substrate carriers, as shown in FIG. 2 and also in FIGS. 8A, 8B, and 9 to be discussed below. The substrates or wafers are held in an inner region of the inner accommodation space which is delimited in opposing sideward directions by a respective arc-shaped portion of the partition webs 60*a* and 60*b* of the substrate carriers 12, 12' of the substrate carrier stack. As shown in FIG. 3, the arc-shaped portions of the partition webs have a radius of curvature corresponding to the diameter of the substrate or wafer, so that the arc-shaped portions extend in the top down view of FIG. 3 with a small defined radial distance along a portion of the outer circumference of the substrate or wafer. This distance is able to be substantially smaller than indicated in this figure.

The smaller inner openings 66*a*, 66*b* and 68*a*, 68*b* of the substrate carriers define purge gas distribution channels or purging channels 70 and 72 of the substrate carrier stack, as shown in FIG. 3. Channel 70 is able to include a pair of channels 70*a* and 70*b* corresponding to the smaller inner openings 66*a*, 66*b*, and channel 72 is able to include a pair of channels 72*a* and 72*b* corresponding to the smaller inner openings 68*a*, 68*b*, as shown in FIG. 4A. One of these distribution channels 70 and 72 (or pairs of channels 70*a*, 70*b* and 72*a*, 72*b*) is able to define and function as a supply channel (or as a pair of supply channels) and the other is able to define and function as a removal or collector channel (or as a pair of removal or collector channels).

As shown, these channels or pairs of channels are arranged diagonally opposite or in opposing sideward directions, such that the substrates or wafers are arranged there between in the substrate carrier stack. Generally, the design is not limited to the design shown in the figures. The channels are able to be of any number, size, and design, as shown, or as one skilled in the art would foresee. In addition, the channels are able to aid in distributing gas to the substrates in any fashion, such that air or purging gas is able to be provided to each substrate in a laminar fashion such as is illustrated schematically or symbolically in FIG. 8B.

In particular, and with reference to FIG. 1, each of the channels or pairs of channels is able to be connected in the substrate carrier stack with respective nozzles or connectors of the substrate carrier stack, such as the nozzle or connector 20 of the base 14 and a corresponding further nozzle or connector 22 of the cover 16, so that the substrates held by the substrate carriers are able to be submitted to a purging treatment as discussed above. The purging gas is passed to the substrates via one of the channels or pairs of channels so that the purging gas passes between adjacent substrates held within the substrate carrier stack by a respective substrate carrier, and is collected by the other of the channels or pairs of channels after having passed between the substrates, as is illustrated schematically or symbolically in FIG. 8B.

Figure 5:
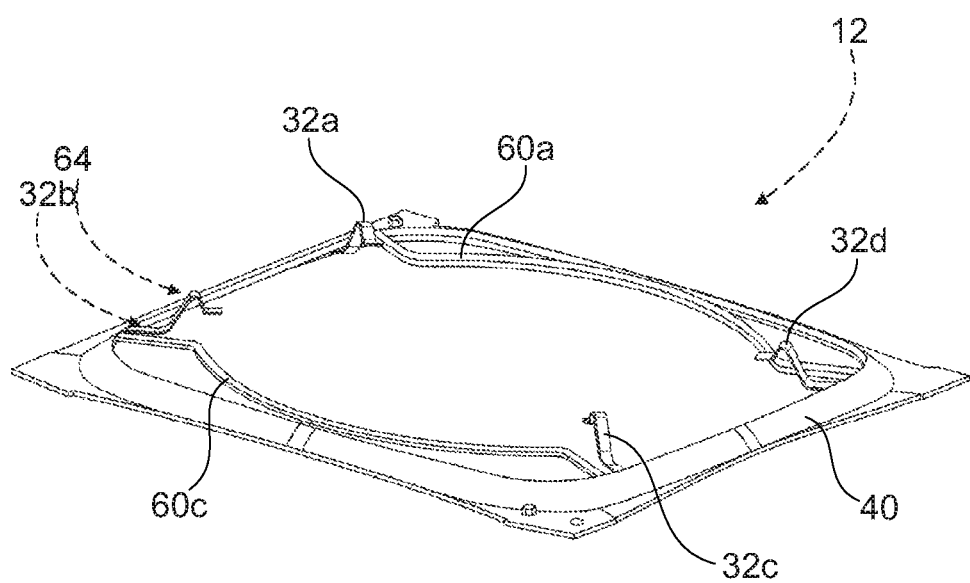
FIG. 5 is a perspective view of a substrate carrier without a substrate according to a third preferred embodiment of the present invention, which differs slightly from the first and second preferred embodiments of the present invention.

FIG. 5 is a perspective view of a third preferred embodiment of the present invention of a substrate carrier according to preferred embodiments of the present invention, which is shown without a substrate held by the substrate holding arms. This preferred embodiment differs only slightly from the first and second preferred embodiments.

The substrate carrier 12 shown in FIG. 5 includes four substrate holding arms 32*a*, 32*b*, 32*c*, and 32*d*, similarly to the first and second preferred embodiments. In the perspective view, it can be seen that the substrate holding arms are present and how they are arranged and formed. In particular, it can be seen how the substrate holding arms extend inwardly and upwardly from the outer carrier frame 40, to define a substrate seat which is located at a vertical distance above the upper boundary of the outer carrier frame 40. The outer carrier frame 40 may also be denoted as "holder body" in agreement with the terminology of US 2017/0372930 A1. The term "substrate carrier body" also is appropriate according to an alternative terminology.

In the perspective view, it can be seen that the arm 32*b* arches upward at point 64, and includes a free holding end or seat portion at a higher point than the connection point of the arm to the outer carrier frame 40. It may be noted that the angle, length, and degree of the arch and seat portion in relation to the outer carrier frame is able to be of any characteristic. Furthermore, when stacked, the above or below holder and substrate, via the arm, is able to be offset from the substrate below, such that the substrates do not touch, or contaminate each other, and such that a small distance, such as 0.5 mm, for example, is able to be held between the substrates. It may be also noted that the arches allow for the substantial weight of the stack to be transferred from substrate carrier to substrate carrier in the substrate carrier stack, and not through the substrates or arms themselves.

Figure 6:
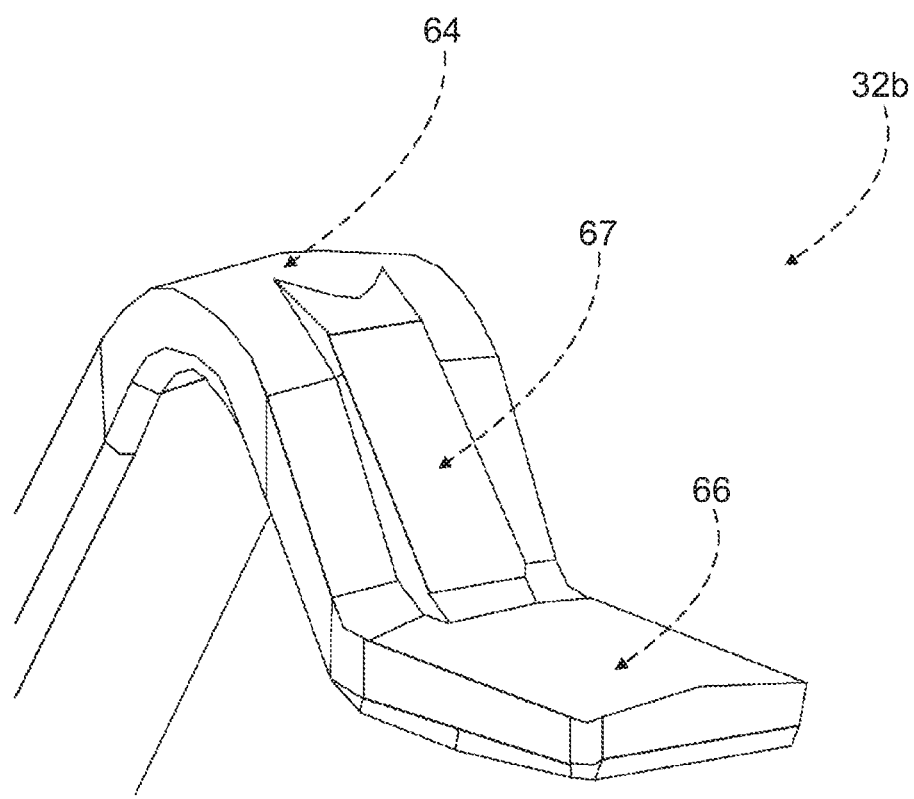
FIG. 6 is a close up sectional perspective view of substrate holding arm of a substrate carrier, which could be one of the substrate carriers according to each of the preceding figures.

FIG. 6 is a close up sectional view of a substrate holding arm of one or all of the preferred embodiments described in the foregoing, e.g., of substrate holding arm 32*b* according to the preferred embodiment shown in FIG. 5. The other three substrate holding arms of this preferred embodiment and the substrate holding arms of the other preferred embodiments are able to be shaped analogously at their upper and inward end portions defining the respective substrate seat.

FIG. 6 displays a section of the substrate holding arm 32*b*. This section of the arm includes an upper arch portion 64 and a seat portion 66 at a free end. As shown in FIG. 6, the upper surface of the seat portion 66 is able to be slightly angled downwardly in the two opposing sideward directions, from an upper middle line extending inwardly. Generally, the upper surface of the seat portion is able to be curved convex in a circumferential direction (with respect to the outer edge of a substrate) or transverse direction. In principle, the upper arch portion 64 is able to be of any suitable angle, degree, or length, and the seat portion 66 is able to be of any suitable length. The arm section between the upper arch portion 64 and the seat portion 66 is able to include a slight longitudinal protrusion 67, which is able to aid to keep the substrate in a defined position resting on the formed substrate seat, hindering the substrate from being moved, jostled, or otherwise inadvertently or advertently removed from sitting in its proper position on the seat portion 66.

Figure 7:
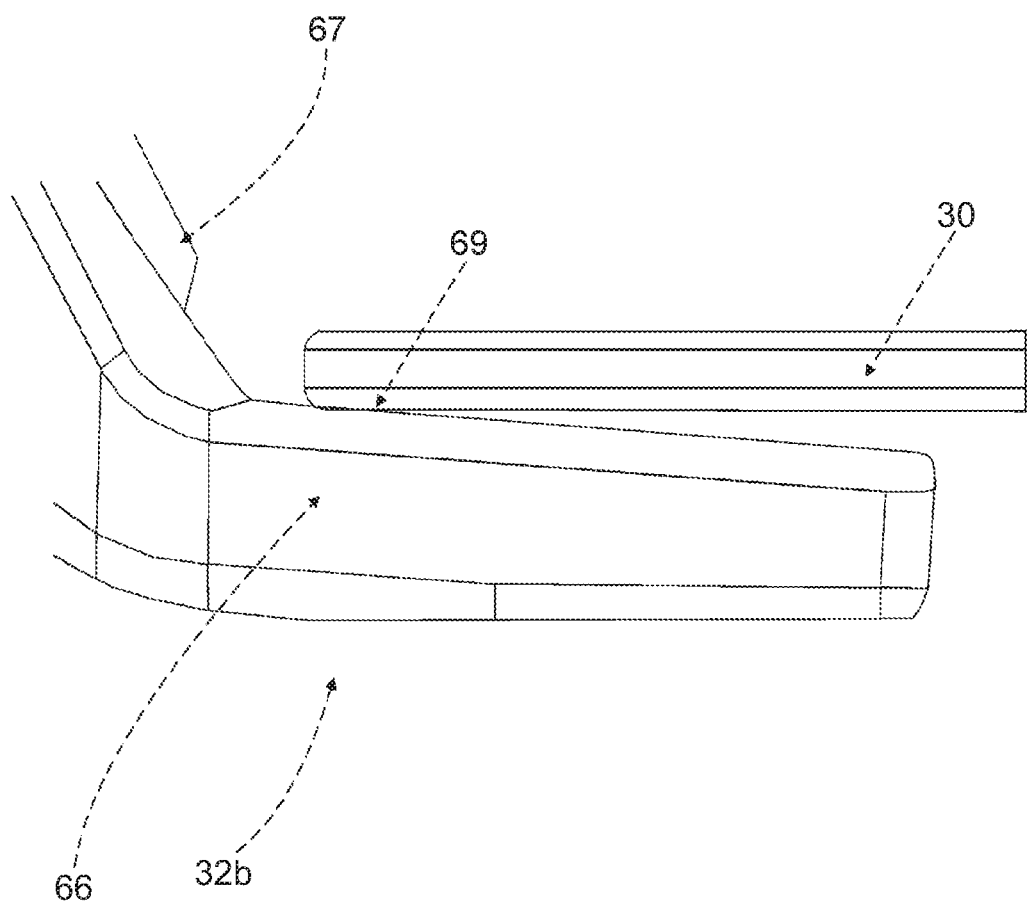
FIG. 7 is a close up side sectional view of the substrate holding arm according to FIG. 5, with a substrate held by the respective substrate carrier.

FIG. 7 is a close up side sectional view of the substrate holding arm 32*b* of FIG. 6 with a substrate 30 being present and held on the substrate seat defined by the seat portion 66 of the holding arm and the other substrate holding arms of the respective substrate carrier. As shown in FIG. 7, the seat portion 66 is able to be angled downward inwardly, with respect to the rest of the structure of the substrate holding arm 32, as well as the substrate 30. Together with the mentioned implementation of the seat portion 66 to include an upper middle line from which the upper surface of the seat portion 66 extends slightly angled downwardly in the two opposing transverse directions, this provides for the realization of a contact point or minute contact patch 69 between the substrate 30 and the seat portion 66.

Generally, it is advisable to make this contact point or contact patch 69 as small as possible in order to reduce chafing of, and contamination on, the substrate, and to allow the contact point or contact patch 69 to be located at the furthest edge of the substrate, such that the substrate's lower surface is not, or is not likely to be, contaminated by or in contact with the substrate holding arm at any other point. Furthermore, the longitudinal protrusion 67 is able to protrude nearer to the outer circumference of the substrate 30 to form a stop which limits the accommodation space of the formed substrate seat in a radial direction, so that the substrate attains and maintains a defined position on the substrate seat.

Figure 8A:
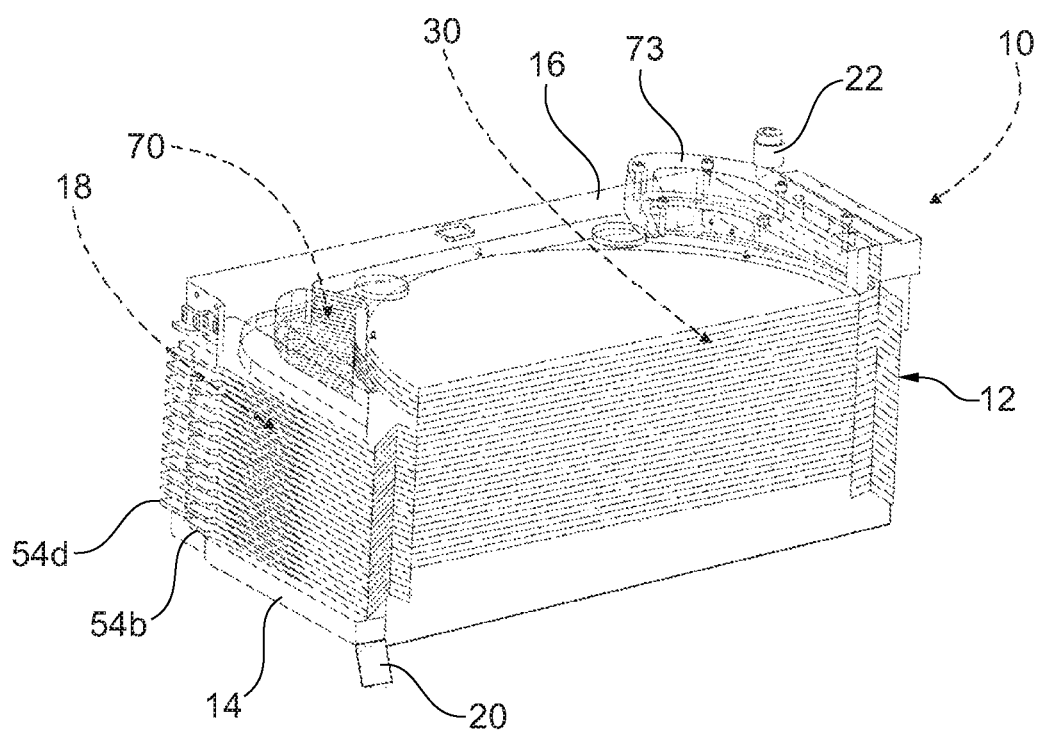
FIGS. 8A and 8B are cross-sectional perspective views of a substrate carrier stack according to a fourth preferred embodiment of the present invention, which differs slightly from the substrate carrier stack and the substrate carriers of the preceding figures, wherein FIG. 8B schematically indicates horizontal purging flows within the substrate carries stack passing through spaces between substrates held by the substrate carriers.
Figure 8B:
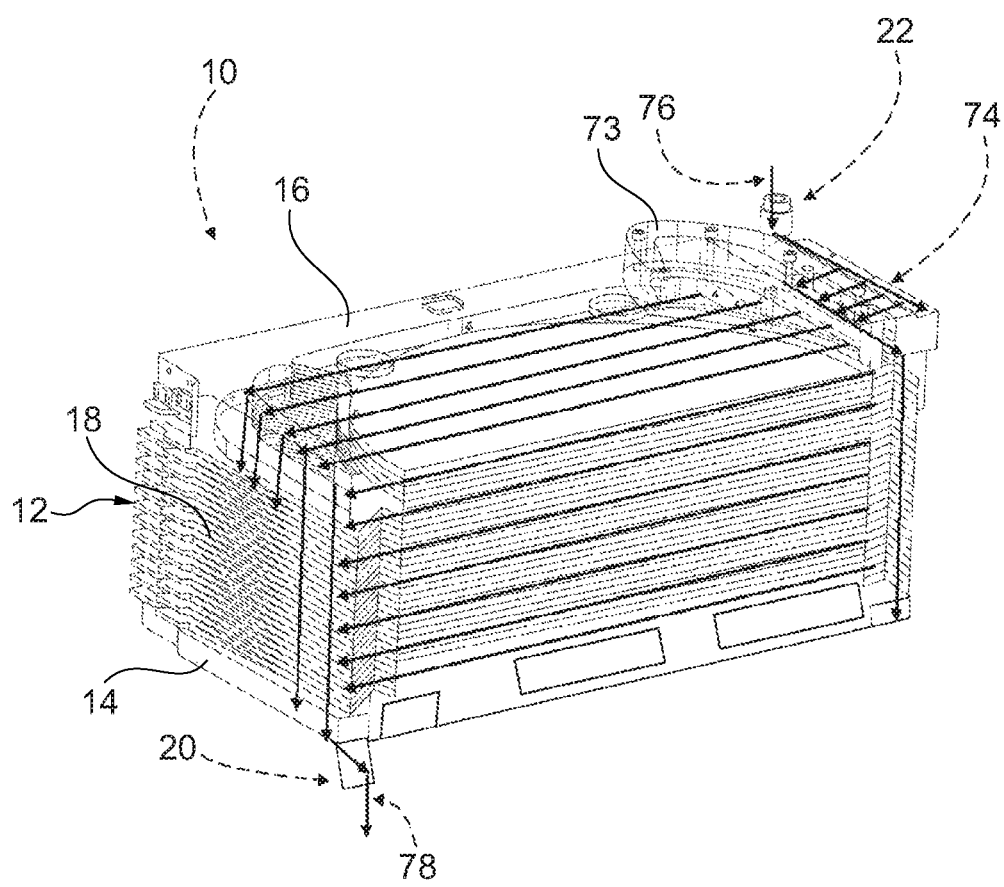

FIGS. 8A and 8B are a cross-sectional perspective views of a fourth preferred embodiment of a substrate carrier stack (or "substrate holder") including multiple substrate carriers (or "modules") according to preferred embodiments of the present invention. However, one may assume that the substrate carriers are basically identical or very similar to a respective substrate carrier 12 of the first subtype or a respective substrate carrier 12' of the second subtype according to FIGS. 3, 4A, 4B, and 4C, so that FIGS. 8A and 8*b* could be understood to exemplify a substrate carrier stack 10 according to the second preferred embodiment. This substrate carrier stack 10 includes a cover 16 stacked on the substrate carriers 12. This cover 16 is able to be basically identical or very similar to the cover 16 of the preferred embodiment shown in FIG. 1. Further, the substrate carrier stack 10 includes a base 14 on which the substrate carriers 12 are stacked. This base 14 is shown only schematically. In principle, the base 14 is able to be basically identical or very similar to the base 14 of the preferred embodiment shown in FIG. 1. The base 14 includes a gas nozzle or gas connector 20 and the cover 16 includes a gas nozzle or gas connector 22.

Like the preferred embodiments described in the foregoing, the substrate carrier stack 10 holds substrates or wafers using the substrate carriers 12 within an inner accommodation space of the substrate carrier stack in a limited space configuration, such that the substrate carrier stack is able to store or house many substrates in a limited space, and wherein the substrates and substrate carriers are centered and aligned. As described on the basis of the second preferred embodiment of the present invention, the substrate carriers are able to be designed such that air or gas is able to flow through internal purge gas distribution channels of the substrate carrier stack 10, which are defined by openings such as the openings 66 and 68 (or pairs of openings 66*a*, 66*b* and 68*a*, 68*b*) of the substrate carriers. These purge gas distribution channels, one of which is assigned the reference number 70 in FIG. 8A, are able to be directly or indirectly connected with a respectively associated one of a gas nozzle or gas connector 20 of the base 14 and a gas nozzle or gas connector 22 of the cover 16. Preferably the cover 16 and the base 14 are provided with purge gas distribution and connection structures to connect the respective gas nozzle or gas connector with at least one associated of the vertical internal purge gas distribution channels of the substrate carrier stack 10. An inner space of such a structure 73 of the cover 16 is able to be connected via a horizontal gas distribution channel 74 with the gas nozzle or gas connector 22. An input purging gas flow and an output purging gas flow are symbolically represented by arrows 76 and 78 in FIG. 8B, and the resulting vertical and horizontal purging gas flows are symbolically represented by further arrows. The gas distribution and connection structures and vertical and horizontal channels are able to achieve or contribute to laminar purging gas flows passing horizontally between adjacent substrates held within the substrate carrier stack.

In the present preferred embodiment, the supplied entry purging gas flow 76 is able to enter into the gas inlet (or "gas nozzle" or "gas connector" according to the above terminology) 22, and is able to then enter via the gas distribution channel 74 and via an internal space of the structure 73 of the cover 16 into a vertical internal purge gas distribution channel of the substrate carrier stack similar to the purge gas distribution channel 70 shown on FIG. 8A. In this way, the supplied purging gas is able to be distributed in latitudinal and vertical directions, to permeate and flow horizontally towards the substrates and through the spaces between neighboring substrates held within the inner accommodation space of the substrate carrier stack. Preferably, laminar and even purging gas flows across the substrates held by the substrate carriers are achieved, so that the purging gas is able to interact with the respective substrate and one or plural desired functions are performed, such as a cleaning processing, etc. The gas flow is able to then enter into the other vertical internal purge gas distribution channel 70 of the substrate carrier stack and is able to be further discharged via a gas flow exiting recess or another structure of the base 14 towards the gas outlet (or "gas nozzle" or "gas connector" according to the above terminology) 20, for being pushed into the gas outlet 20, where the purging gas is able to exit the substrate carrier stack 10 as exhaust purging gas 78. This discharged gas may be contaminated and may be submitted to appropriate further processing, release, reuse, recycling, and the like.

Figure 9:
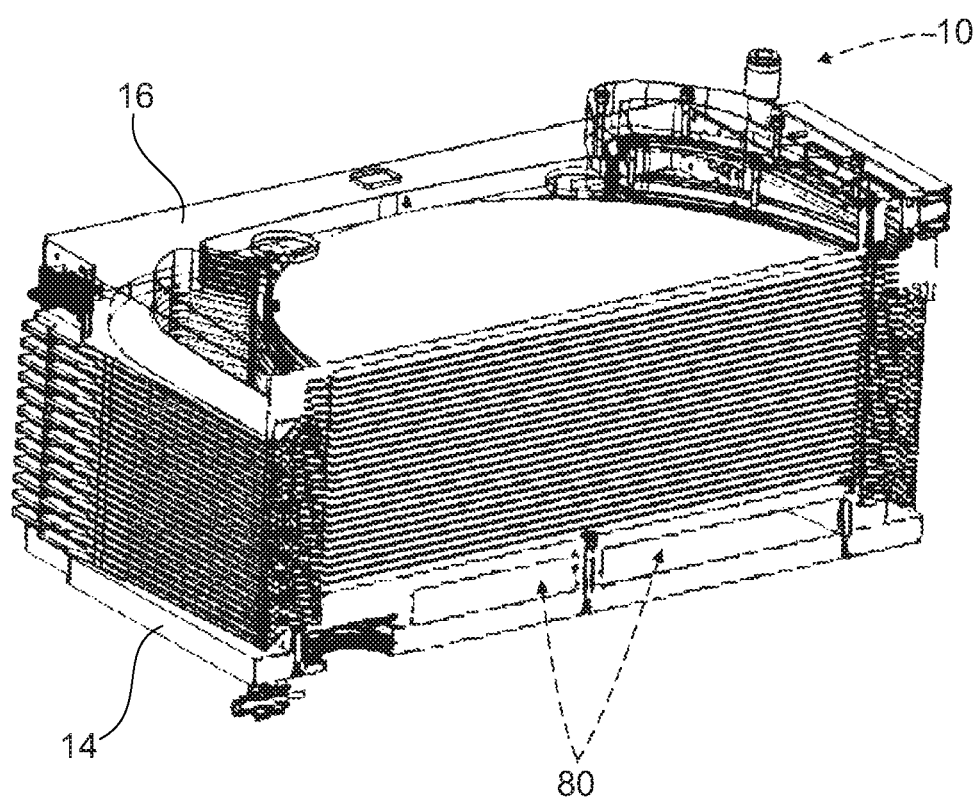
FIG. 9 is a further cross-sectional perspective view of the substrate carrier stack according to FIGS. 8A and 8B.

FIG. 9 is a further cross-sectional perspective view of the substrate carrier stack according to FIG. 8. The base 14 is schematically shown to include recesses or cavities 80, which are able to serve as purge gas distribution and connection structures of the base to exhaust purging gas, or alternatively, to enter purging gas in case of a reversed purging gas flow through the substrate carrier stack. Such gas distribution and connection structures on the entry side as well as on the exit side, together with the mentioned vertical internal purge gas distribution channels, are able to achieve or contribute to laminar purging gas flows passing horizontally between neighboring substrates held within the substrate carrier stack. Additional or alternate laminarisation structures are preferably able to be provided at the entry side or at the exit side or on both of these sides of the substrate carries stack, preferably integrated respectively into the base 14 and/or the cover 16.

FIG. 10 is a cross-sectional perspective view of a substrate carrier stack 10 according to a preferred embodiment of the present invention, e.g., a substrate carrier stack like the preferred embodiments shown in FIGS. 8A, 8B, and 9, including a plurality of substrate carriers 12 and 12' of the two subtypes as described above with respect to FIGS. 3, 4A, 4B, and 4C. In FIG. 10, the substrate carrier stack is shown in a partially unstacked, opened condition, together with a movement mechanism of an opener apparatus 82 to open a loading and unloading gap between two neighboring substrate carriers, such that a respective substrate 30 is able to be loaded on the substrate seat of the lower of the two adjacent substrate carriers or such that a respective substrate 30 is able to be unloaded from this substrate seat. Such a substrate seat is represented by substrate holding arm 32 which supports substrate 30. In order to unload or load a substrate, a suitable loading and unloading arm arrangement is able to be provided, such as a robotic arm device, for example.

The movement mechanism is able to include supporting and movement arms 84 located at different sides or corners of the substrate carrier stack, which are able to interact with a respectively selected substrate carrier of the substrate carrier stack. Multiple of such set of arms are able to be provided, namely, e.g., two such sets of arms represented by the supporting and movement arms 84 and 86 shown in FIG. 10. A respective arm is able to be adapted to engage with an associated particular projection of the interfacing projections 54a, 54b, 54c and 54d of first and second type which project in a sideward or horizontal direction from a respective frame web or frame vertex region of the substrate carriers. In the case of vertically adjacent arms 84 and 86, one of the arms is able to be adapted to engage a projection 54a of the first type and the other of the arms is able to be adapted to engage a projection 54c of the second type of a respective substrate carrier.

By providing a respective set of these supporting and movement arms, a loading and unloading gap between two adjacent substrate carriers is able to be opened as mentioned, so that a lower partial substrate carrier stack and a upper partial substrate carrier stack are provided. Accordingly, the respective set of arms are able to carry an upper plurality of substrate carriers stacked on each other at a vertical distance from a lower plurality of substrate carriers stacked on each other, as shown in FIG. 10.

It should be noted that the view of FIG. 10 only displays one corner of the substrate carrier stack 10, and that similar arms and structures are able to be provided at another corner of the substrate carrier stack or at every corner of the substrate carrier stack, as already mentioned. The arms are able to travel up and down along the vertical extent of the substrate carrier stack such as on a pneumatic slide, or by use of a conveyor or band and gear mechanism, among others, for example. The arms are able to be operated to assume an engagement state to engage with respective projections of first and second type and a disengagement state to disengage from, and not engage with, respective projections of first and second type of the substrate carriers, so that a desired pair of adjacent substrate carriers in the substrate carrier are able to be selected and opened to have the loading and unloading gap there between.

Figure 11B:
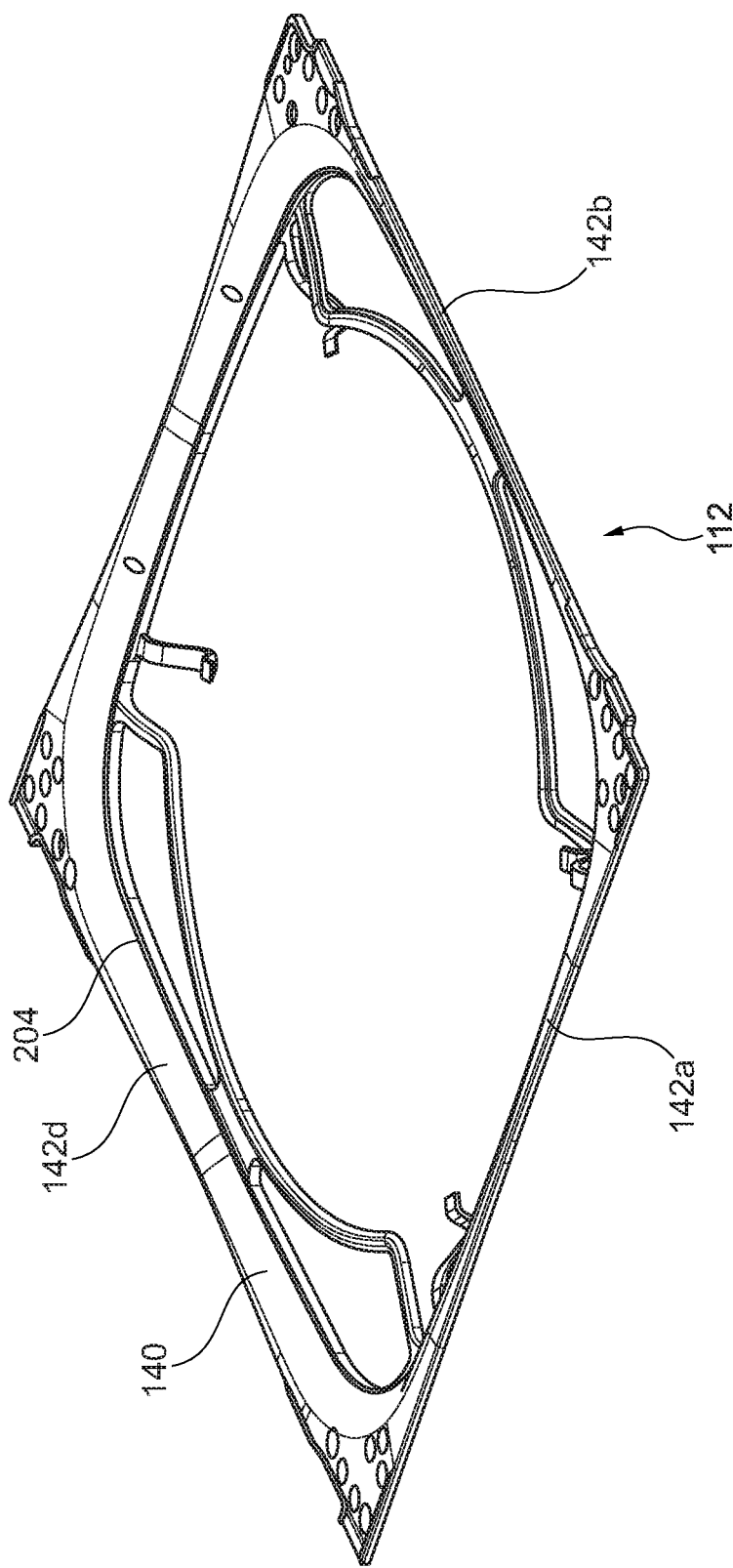

In the following, a substrate carrier and a substrate carrier stack including plural substrate carriers of this kind according to a fifth preferred embodiment are described on the basis of FIG. 11A, FIG. 11B, and the following figures. FIGS. 11A and 11B, as well as FIG. 12A, FIG. 12B, FIG. 12C, and FIG. 13 through FIG. 16 show an individual substrate carrier 112 and details thereof, whereas FIG. 17A and FIG. 17B, FIG. 18A and FIG. 18B, FIG. 19 and FIG. 20 illustrate and describe plural substrate carriers 112 and substrates 130 and their cooperation and interaction within a substrate carrier stack 110. In this description, the reference signs according to the preceding description of the preferred embodiments of FIGS. 1 to 10 are used for similar or analogous elements, respectively increased by 100. If not stated otherwise, the preceding description of the first to fourth preferred embodiments applies also to the fifth preferred embodiment, so that the following description can concentrate on differences of the fifth preferred embodiment from the preceding preferred embodiments and on describing further structural details which are also able to apply to the preceding preferred embodiments.

Like the preceding preferred embodiments, the substrate carrier 112 includes an outer carrier frame 140. The outer carrier frame 140 includes a first frame web 142a, a second frame web 142b, a third frame web 142c, and a fourth frame web 142d, which respectively merge in pairs at a first frame vertex region 144a, a second frame vertex region 144b, a third frame vertex region 144c, and a fourth frame vertex region 144d, so that the integral outer carrier frame 140 is formed. Further, a first pair of substrate holding arms 132a and 132b project inwardly from the first frame web 142a, which are integrally formed with this frame web, and a second pair of substrate holding arms 132c and 132d project inwardly from the third frame web 142c, which are integrally formed with this frame web.

All these structural details, including the at least roughly or even generally quadratic or at least rectangular shape of the substrate carrier 112 correspond to the corresponding structural details of the substrate carriers of the preceding preferred embodiments. However, the substrate holding arms are arranged in a particular symmetry and asymmetry with respect to each other and their location along the respective frame web. Substrate holding arm 132a and substrate holding arm 132d are located symmetrically with respect to each other and with respect to the respective neighboring frame vertex region 144a and 144d, and substrate holding arm 132b and substrate holding arm 132c are located symmetrically with respect to each other and with respect to the respective adjacent frame vertex region 144b and 144c, whereas substrate holding arm 132a and substrate holding arm 132b are located asymmetrically with respect to each other and the respective neighboring frame vertex region 144a and 144b, and substrate holding arm 132d and substrate holding arm 132c are located asymmetrically with respect to each other and with respect to the respective neighboring frame vertex region 144d and 144c.

In more concrete terms, all four substrate holding arms are oriented in a corresponding or analogous manner inwardly from the outer carrier frame into a more or less diametrical or diagonal direction, and substrate holding arm 132a and substrate holding arm 132d have at their respective merging point into the respective frame web the same distance from the respective next neighboring frame vertex region 144a and 144d, and substrate holding arm 132b and substrate holding arm 132c have at their respective merging point into the respective frame web the same distance from the respective next neighboring frame vertex region 144b and 144c. However, substrate holding arm 132a and substrate holding arm 132b, and similarly substrate holding arm 132d and substrate holding arm 132c, have different distances from the respective next adjacent frame vertex region at their respective merging point into the respective frame web. Corresponding angular positions α and β with respect to section line XIII-XIII of the four substrate holding arms, are indicated in FIG. 12A, wherein the angle α is smaller than the angle β. This is a noticeable difference with respect to the preceding embodiments.

Like in the preceding preferred embodiments, the substrate carrier according to the fifth preferred embodiment includes a first partition web 160a and a second partition web 160b, which divide the inner zone 162 of the substrate carrier 112 into a large inner opening 164 and a first pair of smaller inner openings 166a and 166b and a second pair of smaller inner openings 168a and 168b. These partition webs are integrally formed with the outer carrier frame 140, and the first partition web 160a merges at one end into the first frame web 142a between the first substrate holding arm 132a and the next neighboring frame vertex region 144a, and merges at the other end into the third frame web 142c between the fourth substrate holding arm 132d and the next neighboring frame vertex region 144d. Similarly, the second partition web 160b merges at one end into the first frame web 142a between the second substrate holding arm 132b and the next neighboring frame vertex region 144b, and merges at the other end into the third frame web 142c between the third substrate holding arm 132c and the next neighboring frame vertex region 144c.

Similarly to the preceding preferred embodiments, the first partition web 160a includes a first arc-shaped portion 202a, and the second partition web 160b includes a second arc-shaped portion 202b. The first arc-shaped portion 202a is connected by three connecting portions 200a of the first partition web 160a with the first frame web 142a, the third frame web 142c, and, in a middle region of the first arc-shaped portion 202a, with the fourth frame web 142d. Accordingly, the two smaller inner openings 166a and 166b are provided between the first partition web 160a and the fourth frame web 142d, instead of only one smaller inner opening. The latter, however, is possible in principle according to an alternate preferred embodiment. Correspondingly, the second arc-shaped portion 202b of the second partition web 160b is connected via three connecting portions 200b with the first frame web 142a, the third frame web 142c, and, at a middle region of the second arc-shaped portion 202b, with the second frame web 142b. Accordingly, the two smaller inner openings 168a and 168b are provided between the second partition web 160b and the second frame web 142b, instead of only one smaller inner opening. The latter, however, is possible in principle according to an alternate preferred embodiment.

Similarly to the preceding preferred embodiments, diametrically opposing frame vertex regions, namely, e.g., the first frame vertex region 144a and the third frame vertex region 144c, as shown in the figures, are provided with positioning formations, namely, positioning protrusions and positioning recesses or positioning openings. In the present preferred embodiment, the first frame vertex region 144a is provided with a pair of a protrusion 150a and an opening or recess 152a, shown in detail B in FIG. 12A and in FIG. 12B, and the third frame vertex region 144c is provided with a pair of a protrusion 150b and a recess or an opening 152b, shown in detail C in FIG. 12A and in FIG. 12C.

However, the two protrusions 150a and 150b are located on one side of a straight line L extending diametrically over the drawing plane of FIG. 12A between the first frame vertex region 144a and the third frame vertex region 144c, and the openings or recesses 152a and 152b are located on the other side of the straight line L. The arrangement is such that protrusion 150a of a respective substrate carrier 112 is able to protrude into opening or recess 152b of another substrate carrier 112 of identical type stacked thereon in a proper relative rotational position, and protrusion 150b is able to protrude into opening or recess 152a of this other substrate carrier 112 properly stacked thereon. In order to enable this mutual engagement between the protrusions 150a and 150b of a lower substrate carrier and the openings or recesses 152a and 152b of an upper substrate carrier of the same type, the two substrate carriers are to be stacked on each other in alternating relative rotational positions corresponding to rotations by 180° about a vertical rotating axis. In this way, a substrate carrier stack is able to be formed by providing for such alternating relative rotational positions between pairs of next neighboring substrate carriers 112 in the substrate carrier stack 110. This is further explained below with reference to FIGS. 18, 19, and 20. Accordingly, the substrate carrier stack 110 is able to include only one type of substrate carriers 112, without a need to provide for at least two sub-types of substrate carriers.

Concerning these positioning formations which safeguard a proper relative positioning of vertically next neighboring substrate carriers 112 within the substrate carrier stack 110, in the present case including the protrusions 150a and 150b and the openings or recesses 152a and 152b, it is preferred that these positioning formations are designed such that certain dimensional variations between substrate carriers of the same type caused by manufacturing tolerances and, if applicable, varying relative dimensioning between substrate carriers possibly resulting from temperature differences between two substrate carriers or portions thereof are able to be accommodated. To this end, the openings or recesses 152a and 152b are able to include a somewhat larger opening width than the transverse extension of the protrusions 150a and 150b. For example, a gap of 0.25 mm between the outer circumference of the protrusion and the inner circumference of the opening or recess is able to be provided if the protrusion is located centrally within the recess or opening. For accommodating larger dimensioning deviations which might accumulate over the extent of the frame webs, at least one of the openings or recesses is formed to have a longitudinally extended shape along a diagonal or diametrical direction, e.g., a direction such as given by line L in FIG. 12A. As shown in FIG. 12B, in comparison to FIG. 12C, the opening or recess 152a is dimensioned in this way. For example, if the protrusion 150b of the lower substrate carrier is located centrally within opening 152a, there is able to be a gap of 0.25 mm on both sides in transverse direction between the protrusion 150b and the inner circumference of the opening or recess 152a and a gap of 1 mm on both sides in the diagonal or diametrical direction between the outer circumference of protrusion 150b and the inner circumference of longitudinally extended opening 152a. To have such a longitudinal extension of the opening only for one of the two openings provides the advantage that the engagement between protrusion 150a of the lower substrate carrier with the opening 152b of the upper substrate carrier is able to define and function as a rotational center to bring protrusion 150b of the lower substrate carrier into engagement with opening 152a of the upper substrate carrier just by rotating the upper substrate carrier with respect to the lower substrate carrier.

It should be noted that there are other possibilities to enable a plurality of substrate carriers of the same type (without any sub-types) to be stacked on each other with mutual engagement of respective positioning formations such as protrusions and openings or recesses, even without the need to rotate the substrate carriers with respect to a vertical axis in the manner explained above, for example. For example, an upward protrusion located at a certain point of the upper side of the substrate carrier is able to be accompanied by a recess at a matching point at the lower side of the substrate carrier, so that such protrusions and associated recesses of plural substrate carriers are vertically aligned. Such an arrangement is not ruled out in principle, but an arrangement providing the requirement to mutually rotate the substrate carriers with respect to each other in the described sense leads to further advantages. For example, one advantage is that the mutual rotation of substrate carriers with respect to each other is able to compensate or at least reduce negative effects which could result from production inaccuracies of the substrate carriers. Otherwise a production inaccuracy which influences the vertical extent of a respective substrate carrier at a certain point or region could be continuously added at the same angular position of the substrate carrier stack, so that a significant tilt of the substrate carrier stack could potentially result. More important advantages are achieved on the basis of the mentioned particular arrangement of the substrate holding arms, since in this way a vertical overlap of vertical next neighboring substrate holding arms is able to be avoided, as to be described in more detail on the basis of FIGS. 18A, 18B, and 19 below. This allows that the substrate carriers held in the substrate seats of next neighboring substrate carriers are able to be positioned with rather small vertical distances from each other, allowing a high storage density for the substrates in a substrate carrier stack of this kind. This is also reflected by the shape of the substrate holding arms of the fifth preferred embodiment according to FIGS. 11A, 13, 14, and 15 in comparison with the shape of the substrate holding arms of the preceding preferred embodiments according to FIGS. 5, 6, and 7. The substrate holding arms of the fifth preferred embodiment extend less upwardly than the substrate holding arms of the preceding embodiments so that the substrate seat is located at a smaller height above the upper rim of the outer carrier frame 140 than the substrate seat of the substrate holding arms of the preceding preferred embodiments is located above the upper rim of the outer carrier frame 40.

The described inner openings 164, 166a, 166b, 168a, and 168b define, like the corresponding openings of the preceding embodiments, an inner accommodation space of the substrate carrier stack 110 that accommodates the substrates 130 and first inner vertical purging channels or purge gas distribution channels 170a, 170b, and second inner vertical purging channels or purge gas distribution channels 172a, 172b of the substrate carrier stack 110 on two opposing sides of the portion of the inner accommodation space where the substrates 130 are located. In this respect, it can be referred to the above explanations on the basis of the preceding embodiments. Furthermore, proper sealing engagements between the outer carrier frames 140 of vertically next neighboring substrate carriers 112, between the lowermost substrate carrier and the base 114, and between the uppermost substrate carrier and the cover 116 are preferable, so that proper purging gas flows without losses and contaminations from the outer environment of the substrate carrier stack 110 are achieved. To this end, each substrate carrier 112 is provided with a sealing lip or sealing ridge 204 at a lower side of the outer carrier frame 140, which extends around the inner zone 162 of the substrate carrier. Preferred and realized according to the shown preferred embodiment, the sealing lip 204 is located adjacent to or at the inner edge of the outer carrier frame 140. In the shown preferred embodiment, this inner edge of the outer carrier frame 140, which delimits the inner space 162, is also an upper edge of the outer carrier frame, in view of the cross-sectional shape of the outer carrier frame 140 or a respective frame web which can be seen for example in FIGS. 13, 15, 16, and 17B.

In order to achieve sealing, each substrate carrier 112 and the base 114 support the respective substrate carrier stacked thereon only using the sealing lip or sealing ridge 204, so that the sealing ridge or sealing lip 204 is engaged with the respective associated upper ring surface portion of the base 114 or the outer carrier frame 140 respective lower substrate carrier 112 under relatively high pressing forces. This respective ring surface portion of the respective lower element forms like the sealing lip or sealing ridge 204 a supporting formation as well as a sealing formation of the respective element. A proper sealing engagement between the cover 116 and the uppermost substrate carrier is able to be achieved by designing the cover to have an appropriate minimum weight.

Preferably, the engagement between the position formations associated with each other, in the present preferred embodiment, the protrusions 150a, 150b and the openings or recesses 152a, 152b, and the engagement between the sealing ridges or sealing lips 204 and the associated upper sealing ring surface portions of the outer carrier frame 140, are the only portions or elements of contact or at least mutual form-fit engagement between vertically next neighboring substrate carriers 112 in the substrate carrier stack 112. Further, it is proposed that the positioning engagement between the positioning formations is an engagement which causes no vertically directed forces which act between next neighboring substrate carriers.

Preferably, the same is true for the engagement between the uppermost substrate carrier 112 and the cover 116 and for the engagement between the base 114 and the lowermost substrate carrier 112. Vertical forces preferably act between the respective elements of these two pairs of elements only via the respective sealing formations, an upper ring sealing surface portion of the base 114 and a lower ring sealing surface portion or—preferably—also a sealing ridge or sealing lip of the cover 116 according to the present preferred embodiment.

For the purging treatment of substrates 130 held by the substrate carriers 112 within the substrate carrier stack 110, horizontal purging gas flows between vertically neighboring substrates 130 are preferred, which emanate from the first vertical purging channels 170a and 170b and enter into the second vertical purging channels 172a and 172b, or emanate from the second vertical purging channels 172a and 172b and enter into the first vertical purging channels 170a and 170b, which are respectively defined by the inner openings 166a and 166b and 168a and 168b. The purging gas traverses the partition webs 160a and 160b on either side of the substrates, in particular at least the first and second arc-shaped portions 202a and 202b thereof. In the shown preferred embodiment, these partition webs on either side of the inner accommodation space include, alternatingly, first partition webs 160a and second partition webs 160b, due to the relative rotational positioning of next adjacent substrate carriers, as described in the foregoing. This is able to be achieved in a simple manner by dimensioning the thicknesses of the partition webs such that there is a gap between next neighboring partition webs, in particular at least between next neighboring arc-shaped portions thereof.

However, instead, it is preferred to provide for longitudinal purging nozzles or line nozzles, which are able to be obtained by appropriately shaping the upper and lower surface of the respective partition web, such that a nozzle opening is obtained in a sectional view which tapers in the inward direction, such as shown in FIG. 17B. Preferably, the smallest opening width which defines the nozzle opening is provided at or very near to the inner edge of the partition webs. As shown in FIG. 17B, it is sufficient to suitably shape only one surface of the lower surface of the partition web of the upper substrate carrier and the upper surface of the partition web of lower substrate carrier. In view of the overall shape of the substrate carriers, it is preferred that the lower surface of the upper substrate carrier is shaped to provide the tapering, as shown in FIG. 17B, for example. By providing such longitudinal purging nozzles or line nozzles, the flowing speed of the purging gas emanating from the respective vertical purging channels is accelerated in the course of passing the partition webs, which helps to achieve laminar purging gas flows through the spaces between neighboring substrates.

FIG. 17B shows a cross-sectional side view of detail B in FIG. 17A, namely, medial regions of the arc-shaped portions 202a and 202b of the partition webs 160a and 160b with their connection portions 200a and 220b of the partition webs 160a and 160b, with neighboring edge portions of the substrate carriers 130 stored within the corresponding substrate carrier stack. As shown in FIG. 17B, the vertical purging channels on one side of the substrates 130 are horizontally connected by horizontal channels delimited by neighboring connection portions 200a and 200b of the stacked substrate carriers, so that a horizontal purging gas flow between next neighboring substrates is obtained also along the horizontal extent of these connection portions 200a and 202b. Corresponding line nozzle portions open inwardly towards the substrate carriers as shown in FIG. 17B. These line nozzles preferably extend along the complete extent of the arc-shaped sections 202a and 202b of the partition webs 160a and 160b and also over a substantial or complete extent of the two connection portions 200a and 200b at both ends of the arc-shaped portions which merge into and connect the arc-shaped portions with the respective frame web of the outer carrier frame 140.

Due to the substrate holding arms, which extend upwardly and inwardly from the upper edge of the outer carrier frame 140, a substrate 130 held by a respective substrate carrier 12 is preferably located not within the vertical extent of the arc-shaped portions 202a and 202b and the connecting portions 200b of the partition webs 160a and 160b of this substrate carrier, but at a vertical distance above these elements of the respective substrate carrier 112. The four respective edge sections of the substrates 130 shown in FIG. 17B are held by a respective one of four further substrate carriers, which are not shown in FIG. 17B and are located below the four shown substrate carriers in the substrate carrier stack. FIG. 17A shows eight substrates 130, namely the four substrates 130 indicated also in FIG. 17B as well as four additional substrates 130 which are held in the respective substrate seat of the four substrate carriers shown in FIG. 17B as well as in FIG. 17A.

The vertical distance between a respective substrate held in the seat of a substrate carrier and the upper edge or rim of the outer carrier frame 140 of the substrate carrier is able to vary among preferred embodiments of the present invention. For example, the distance between next neighboring wafers held by the identically dimensioned substrate carriers 112 of a substrate carrier stack 110 preferably is in the range of 2.4 mm to 3.4 mm or, more preferred, in the range of 2.7 mm to 3.1 mm. In the preferred example, as shown, this distance is about 2.9 mm. This applies of course only if all substrate carriers of the substrate carrier stack carry a respective substrate in the form of such a wafer. If substrates of another thickness are to be handled and stored, these parameters could be adapted appropriately.

Assuming a typical wafer thickness of 0.8 mm, the highly preferred distance of 2.9 mm between next neighboring substrates of this typical wafer thickness corresponds to a pitch of 3.7 mm between the next neighboring horizontal carrying planes which are defined by the substrate seats of the substrate carriers 112 of the substrate carrier stack 110. If substrates of another thickness are handled and stored, this pitch is able to be adapted appropriately. All of these parameters are able to be adapted appropriately depending on the use scenario for the substrate carriers and preferences which might apply.

The mentioned horizontal carrying planes are not physical elements of the substrate seats, but are instead hypothetical, theoretical, or virtual geometric constructs used to describe real elements and positional and other relations between real elements, like horizontal frame planes associated with the outer carrier frames of the substrate carriers, frame web axes and vertexes associated with the frame webs and frame vertex regions of a respective outer carrier frame, and other axes such as coordinate axes and the like. These horizontal carrying planes are defined to be geometric planes which are coplanar with a lower surface of a respective plate-shaped substrate, which has a diameter corresponding to a predetermined allowable diameter or the predefined allowable maximum diameter of the substrate seat and is carried in an ideally centered position horizontally by the respective substrate seat. For example, in a case that the holding ends 166 of the substrate holding arms, which define and function as seat portions 166 defining the substrate seat, would be inclined, e.g., such as shown in FIG. 7, and noticeable also in FIGS. 13 and 15, the lower surface of a substrate having a diameter not exactly in agreement with the predetermined allowable diameter or the predetermined allowable maximum diameter would be held at a slight vertical distance from this virtual horizontal carrying plane defined by the substrate seat, but would be parallel to this virtual horizontal carrying plane, if the substrate is positioned ideally centered in the substrate seat. For a substrate which is positioned slightly off center in the substrate seat, the lower surface of the substrate and the virtual horizontal carrying plane might extend slightly inclined with respect to each other.

Further, even if a substrate is placed in an ideally centered positioned within the substrate seat and has exactly a diameter corresponding to the predetermined allowable diameter or the predetermined allowable maximum diameter associated with the substrate seat, there might be very small deviations between the virtual horizontal carrying plane associated with this substrate seat and the lower surface of the substrate due to manufacturing tolerances which might influence the actual arrangement and shape of the substrate holding arms, so that the lower surface of a substrate and the virtual horizontal carrying plane might not be exactly coplanar and might even show a minute inclination with respect to each other.

Of course, all explanations, definitions and teachings given herein have to be understood and interpreted by the skilled person in view of the fact that there always might be very small deviations from an ideal dimensioning and ideal shape caused by potentially unavoidable manufacturing tolerances. Such manufacturing tolerances even might have a rather strong impact for devices like the substrate carriers disclosed herein, in particular if these substrate carriers are molded from a suitable plastic material by injection molding, as it is preferred. Such an injection molding for producing the substrate carriers with acceptable manufacturing tolerances enabling a particular use scenario can favorably be done but requires a proper optimization of the mold used for the injection molding and of the injection molding process. Such optimizations belong to work of the skilled person in the field of injection molding of structures of various shapes. It is recommended to provide a mold including symmetrically located injection positions, for example, as illustrated in FIG. 12A, by injection positioning marks at the bottom side of the shown substrate carrier 112. Additional and other injection positions may of course be appropriate, since the marks shown in FIG. 11B serve only for illustration purposes and are not intended to give a complete teaching for the case that the substrate carriers shall be manufactured by injection molding. Of course, other suitable manufacturing methods are able to be used as well.

With reference again to FIG. 17B, it is preferred that the longitudinal line nozzles are located at vertical heights in the substrate carrier stack which correspond to the middle of the vertical distance between the lower surface of the vertically next neighboring upper substrate 130 and the upper surface of the vertically next neighboring lower substrate, assuming substrates of a particular wafer thickness, e.g., the above mentioned typical wafer thickness, for which the substrate carriers might particularly be designed. Of course, the presence of such next neighboring substrates, one being located within the vertical thickness range of the partition web of the respective upper substrate carrier and the other being located in the vertical thickness range of the partition web of the respective lower substrate carrier, is assumed here, although it is not necessary that always all substrate seats of the substrate carriers of a substrate carrier stack hold a respective substrate.

This proposed arrangement of the line nozzles (or alternatively of longitudinal exit openings between next adjacent partition webs, if no line nozzles are provided), in which the purging gas emanates towards the spaces between next adjacent substrates at about equal vertical distances from the lower surface of the upper substrate and the upper surface of the lower surface contributes to the achievement of laminar purging gas flows through the spaces between the substrates, as is desired. The above recommendations for the dimensioning of the distances between next neighboring substrates and therewith the pitch between the horizontal carrying planes of the substrate seats are based on a selected or typical wafer thickness and are given in view of the general desire to provide for laminar horizontal purging gas flows and relatively high storage density for the substrates. These recommendations might need adaptation depending on the particular use scenario, in particular, concerning the pitch in the case that substrates of substantially different thickness are to be treated.

As shown in FIG. 17B, there is a radial distance between the outer circumference of the arc-shaped portions 202a, 202b of the partition webs 160a and 160b, and the outer circumference of the substrates 130. It is preferred that the output openings of the line nozzles or of the general line openings defined by the partition webs are located about 3 mm radially outwardly of the substrate edges (wafer edges). To achieve an effective purging treatment with laminar horizontal purging gas flows between the substrates, a purging gas flow of about 5 mm per second across the surfaces of the substrates is recommended, but higher or lower purging gas flows might be appropriate as well.

Figure 19:
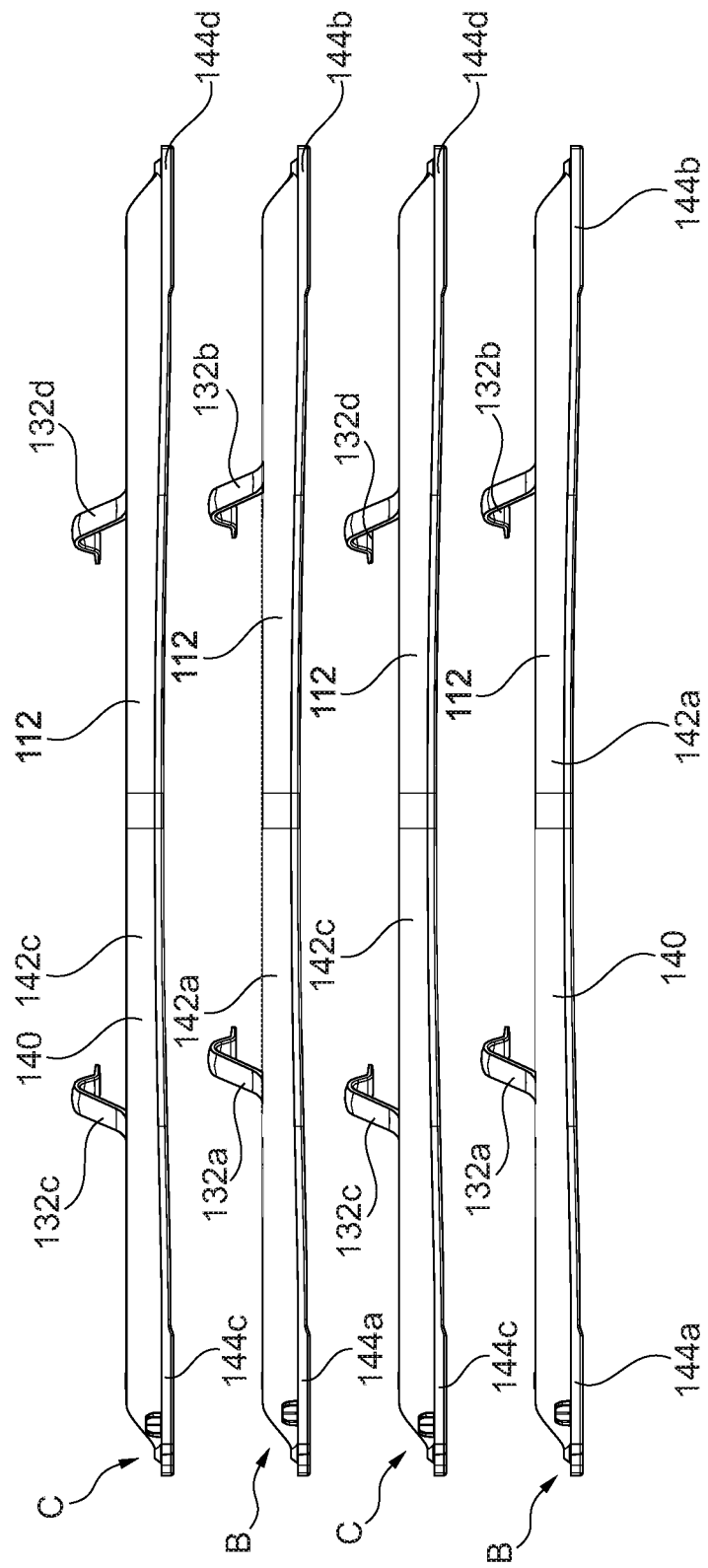
FIG. 19 is a side view on four such substrate carriers vertically displaced with respect to each other but with proper relative rotational positions to provide a substrate carrier stack.

The alternate positioning of the substrate carriers 112 within a substrate carrier stack achieved and maintained by the positioning formations provided in the present case by the protrusions 150a, 150b and the openings or recesses 152a, 152b, such that adjacent substrate carriers in the substrate carrier stack have been rotated by 180° about a vertical axis of rotation, is illustrated in FIG. 18A. Three such substrate carriers are shown with appropriate alternate relative positioning, where the relative displacement of the three substrate carriers in the drawing plane shall symbolically represent a vertical displacement there between such as shown in FIG. 19 for four substrate carriers relatively positioned in this way. In FIG. 19, as well as in FIG. 18A, the location of the details C and B, as defined and shown in FIGS. 12A, 12B, 12C, and 14 is indicated. In FIG. 19, a small variation of the position of the shown protrusion with respect to a sloping upper surface portion of the outer carrier frame 140 for the shown substrate carriers may be identified. In this respect, it is to be noticed that FIG. 19 is a view corresponding to the view direction given by arrow XIV in FIG. 12A or corresponding to the opposite view direction on the respective substrate carrier.

FIG. 18A and FIG. 19 show the relative arrangement of the substrate holding arms of vertically neighboring substrates, as achieved by the explained particular symmetric and asymmetric arrangement of the substrate holding arms. What is achieved is that the vertically next neighboring substrate holding arms, for example in FIG. 19, the substrate holding arms 132a and 132c, and the substrate holding arms 132b and 132d, do not vertically overlap and are located transversely displaced with respect to each other. This allows for a smaller pitch for the horizontal carrying planes of the substrate seats of the substrate carriers within the substrate carrier stack and therewith reduced vertical distances between next neighboring substrates held within the substrate carrier stack, if all substrate seats accommodate a respective substrate. FIG. 18A shows that two such next adjacent substrate holding arms do not overlap indeed due to their analogous orientation inwardly in a diagonal or diametrical direction. This is also shown in FIG. 18B which shows the vertex regions 144b and 144d with neighboring sections including substrate holding arms 132b and 132d of plural substrate carriers which are properly stacked on each other.

FIG. 20 shows the frame vertex portions 144a and 144c of plural substrate carriers 112, which are properly stacked on each other. In particular, the mutual engagement of the protrusion 150a of a respective lower substrate carrier with the opening 152b of an upper substrate carrier can be seen as well as a transversely staggered arrangement of the interfacing projections 154a and 154c of adjacent substrate carriers within the substrate carrier stack. This enables a simplified interaction of external interfacing devices, such as movement devices with respective ones of the substrate carriers, since there is a relatively large vertical gap between vertically aligned interfacing projections, namely between vertically next neighboring interfacing projections 154a as well as between vertically next neighboring interfacing projections 154c.

According to the shown preferred embodiment, this transverse staggering of these interfacing projections at the four frame vertex regions of the stacked substrate carriers is able to be achieved with only one type of substrate carrier (no subtypes thereof), and the provision of the positioning formations, in the present case, the protrusions 150a, 150b and the openings or recesses 152a, 152b, safeguard a proper stacking of these substrate carriers 112 in the substrate carrier stack 112 with the required alternate relative rotational positions of the substrate carriers, so that the vertically neighboring holding arms are alternatingly transversely staggered and the vertically neighboring interfacing projections are alternatingly transversely staggered, as described above.

Figure 22A:
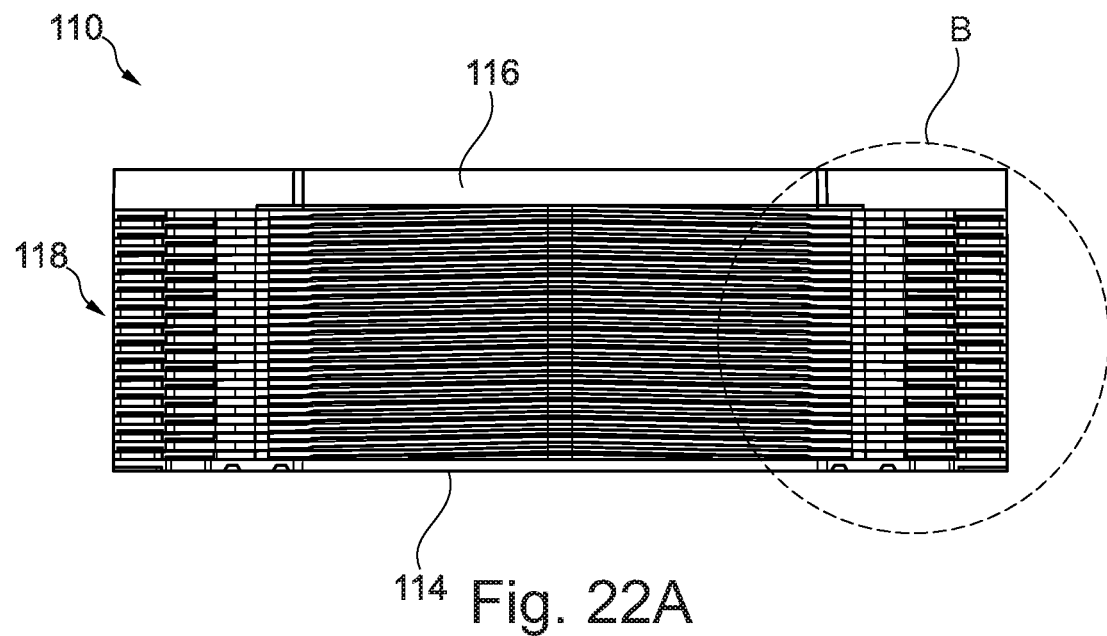
FIG. 22A is a side view of the substrate carrier stack.
Figure 22B:
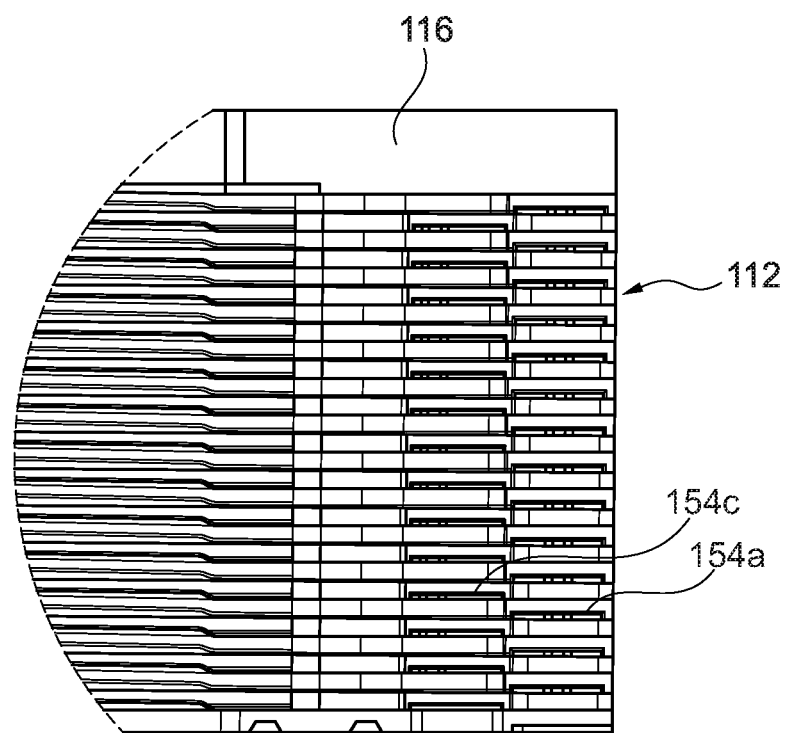
FIG. 22B is a close up side view on interfacing elements provided in the form of projections of the substrate carriers according to detail B in FIG. 22A.

FIG. 21, FIG. 22A, and FIG. 22B show an example of a substrate carrier stack 110 according to the fifth preferred embodiment of the present invention. In the present case, well over twenty five substrate carriers 112, e.g., twenty seven or twenty eight six substrate carriers 112 are stacked on each other, with the lowermost substrate carrier 112 being stacked on a base 114, and a cover 116 being stacked on the uppermost substrate carrier 112. As shown from the transversely staggered interfacing projections 154a and 154c, and the transversely staggered interfacing projections 154b and 154d, the substrate carriers 112 are stacked in the explained manner relatively rotated with respect to each other about a vertical axis by 180°, which is safeguarded by the explained positioning formations, in the present case, the protrusions 150a, 150b and the openings or recesses 152a, 152b. As shown in the drawing, a high stacking density and a high storage density for substrates held within the substrate carrier stack 110 in the seats of the substrate carriers 112 is obtained. In principle, such substrate carrier stack is able to include any number of substrate carriers, indeed also many more substrate carriers than as in the shown non-limiting example, for example. An even number of substrate carriers or alternatively an uneven number of substrate carriers are able to be provided in such a substrate carrier stack.

According to the perspective view of FIG. 21 and the side views of FIGS. 22A and 22B, the base 114 and the cover 116 are provided in the form of a base plate and a cover plate. Preferably, the cover plate would be provided at its lower side with a suitable recess that accommodates the substrate holding arms of the uppermost substrate carriers and the substrates held thereby.

According to preferred embodiments of the present invention, the base 114 and the cover 116 are provided with structures that enable a purging treatment of the substrates 130 held within the substrate carrier stack 110. Preferably, these purging structures include or have integrated laminarisation structures, such as at least one of a laminarisation chamber, a laminarisation manifold, and a laminarisation fabric, to achieve or contribute to laminar purging gas flows through the spaces between adjacent substrates within the substrate carrier stack.

Figure 23:
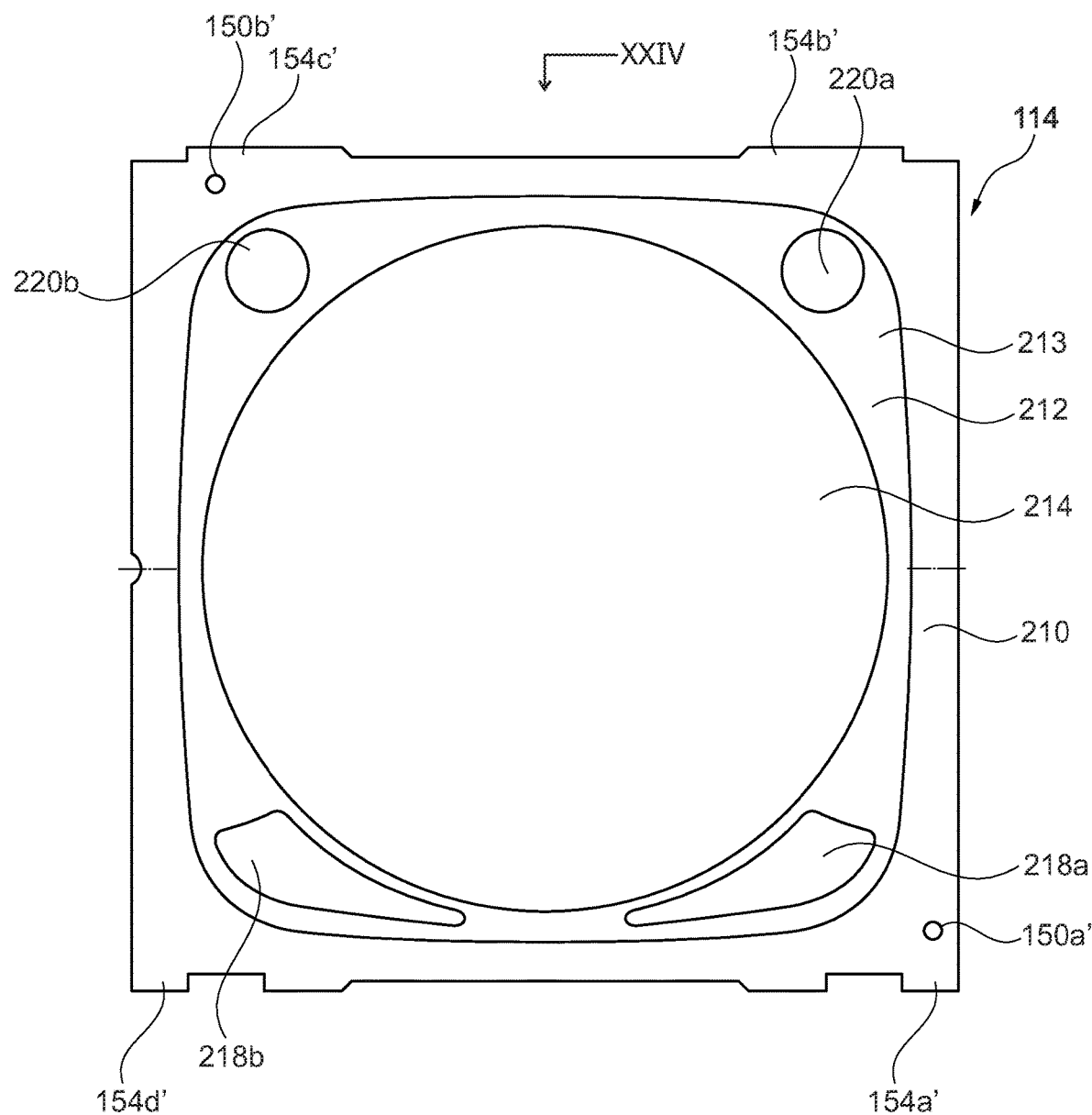
FIG. 23 is a top down view on an exemplary preferred embodiment of the base of the substrate carrier stack according to the fifth preferred embodiment of the present invention.
Figure 24:
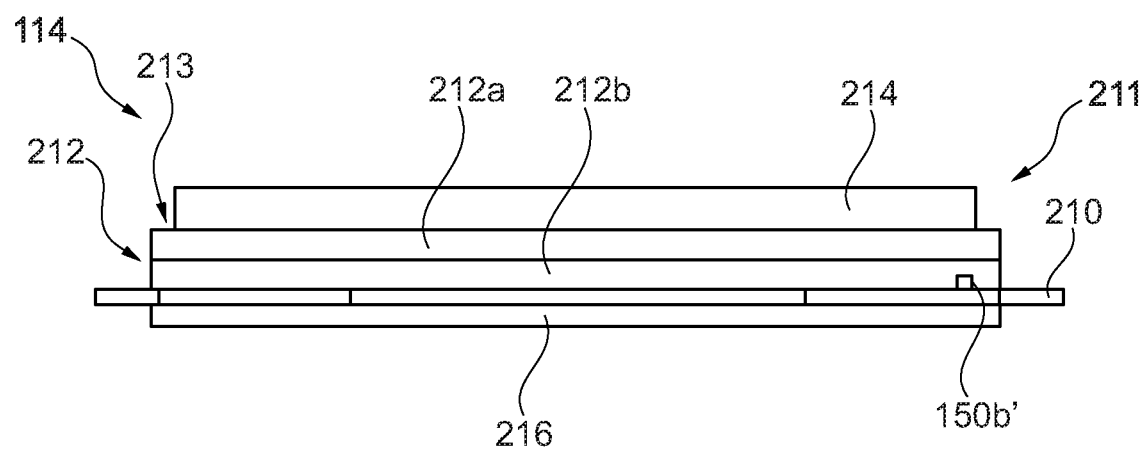
FIG. 24 is a schematic side view of the base according to FIG. 23 according to view direction XXIV in FIG. 23.

FIG. 23 and FIG. 24 show an example for a preferred embodiment of the base 114. FIG. 23 is a top-down-view on the upper side of the base, and FIG. 24 is a rather schematic side view of the base 114.

As shown in FIG. 24, the base is able to include a carrying plate 210, which is provided with positioning protrusions 150a' and 150b', which basically correspond to the protrusions 150a and 150b of a respective substrate carrier 112 so that the lowermost substrate carrier 112 of the plurality of substrate carriers of the substrate carrier stack 110 is stacked in a defined relative position onto the base, namely so that the protrusion 150a' engages into the opening 152b and the protrusion 150b' engages into opening 152a of this lowermost substrate carrier 112. The carrying plate 210 is able to be made from a metallic material or alternatively from a plastic material, for example.

The base 114 is provided on the upper side of the carrying plate 210 with an inner body 211, which is located inside the substrate carrier stack 110 and supports the lowermost substrate carrier 112 thereof. The inner body, which is fastened to the carrying plate 210, is able to be integrally manufactured or is able to be made from plural elements, e.g., plate-shaped elements, mounted to each other. Indeed, the complete base 114 is able to be manufactured integrally in principle, depending on its chosen structure, for example.

In the present case, the inner body 211 includes a support base 212 for the lowermost substrate carrier 112, which, as shown in FIG. 24, is able to be made from a plurality, e.g., two plate-shaped elements 212a and 212b. An annular surface strip 213 extending on the upper surface of the support base 212 along its outer edge supports the lowermost substrate carrier 112 at its sealing ridge or sealing lip 204 and forms a sealing surface. The weight of the substrate carriers 112 and the cover 116 of the substrate carrier stack 210 is supported via this sealing ridge or sealing lip 204, so that sealing is achieved.

Preferably, in order to enable the purging treatment of the substrates 130 within the substrate carrier stack 110, the base 114 is provided, at the lower side of the carrying plate 210, with an interfacing body 216 which is mounted to the carrying plate 210. The interfacing body includes an integrated purging gas entry connector or purging gas inlet and includes an integrated purging gas return connector or purging gas outlet. These connectors or inlet and outlet are connected via appropriate structures of the base 114 including openings in the carrying plates 210 with associated gas distribution structures or purging structures within the support base 212. These gas distribution structures or purging structures, which are able to include at least one of channels and chambers, are connected via a pair of inflow openings or inflow recesses 218a and 218b and a pair of return flow openings or return flow recesses 220a and 220b with an associated pair of vertical gas distribution channels or vertical purging channels of the substrate carrier stack, so that the purging gas entry connector or purging gas inlet is connected with one pair of these vertical channels and the purging gas return connector or purging gas outlet is connected to the other pair of these vertical channels.

As shown in FIG. 23, the inflow openings or recesses 218a and 218b which are open upwardly are able to have a rather similar shape as the openings 168a, 168b of the lowermost substrate carrier 112 stacked on the support base 212 to achieve or contribute to laminar purging flows. However, other shapes for the inflow openings or recesses are able to be chosen. One might consider the inflow openings or recesses 218a and 218b and the pairs of openings 168a, 168b and 166a, 166b and 168a, 168b and so forth of the substrate carriers 112 stacked on the support base 212 and subsequently on each other to commonly belong to the pair of vertical gas distribution channels or vertical purging channels, through which the purging gas is supplied to the explained longitudinal nozzles or line nozzles (or generally longitudinal openings) defined by vertically adjacent partition web of pairs of vertically adjacent substrate carriers 112, so that the purging gas emanates horizontally towards and into the spaces between neighboring substrates held in the seat of a respective substrate carrier of the substrate carrier stack.

Also, for the return flow openings or return flow recesses 220a and 220b, shapes which are rather similar to the shape of the openings 166a, 166b of the lowermost substrate carrier 212 stacked on the support base 112, and deviate from the shape of these return flow openings or return flow recesses 220a and 220b shown in FIG. 23 are possible. One might consider the reflow openings or recesses 220a and 220b, and the further pairs of opening 166a, 166b and 168a, 168b and 166a, 166b and so forth of the substrate carriers 212 stacked on the support base 212 and subsequently on each other, to commonly belong to the pair of vertical gas distribution channels or vertical purging channels, into which the purging gas emanates via the explained longitudinal nozzles or line nozzles (or generally longitudinal openings) defined by vertically adjacent partition web of pairs of vertically adjacent substrate carriers 112, after having passed through the spaces between neighboring substrates held in the seat of a respective substrate carrier of the substrate carrier stack.

Accordingly, purging gas introduced into the substrate carrier stack via the purging gas entry connector or purging gas inlet of the interfacing body is supplied via the inflow openings or recesses 218*a* and 218*b* and one pair of the two pairs of vertical purging channels and a first set of the longitudinal nozzles or line nozzles (or generally longitudinal openings) to the substrates, and is returned and discharged from the substrate carrier stack via a second set of the longitudinal nozzles or line nozzles (or generally longitudinal openings) and the other pair of the two pairs of vertical purging channels and the reflow openings or recesses 220*a* and 220*b*, and finally the purging gas return connector or purging gas outlet of the interfacing body.

The realization of the support base 212 in the form of two plate-shaped elements 212*a* and 212*b*, as schematically shown in FIG. 24, enables the manufacture of the support base 212 with the needed internal structures without much effort.

Figure 25:
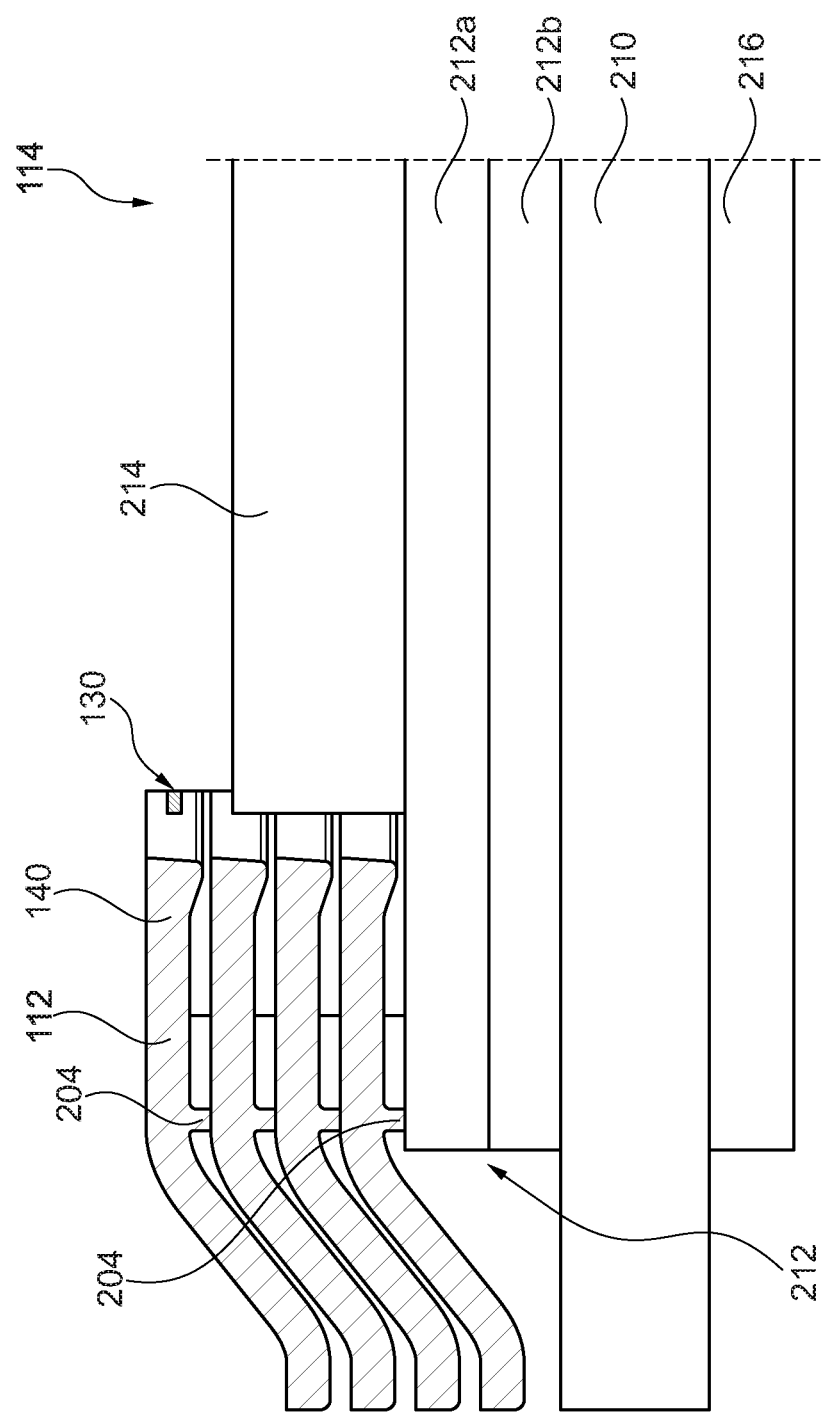
FIG. 25 is a side sectional view of four substrate carriers with a substrate in a view analogous to FIG. 17B, together with the base according to FIG. 24.

The base includes, on top of the support base 212, a cylindrical protrusion 214 having a circular cross section, which is able to be integrally formed with the support base 212 or its upper plate-shaped elements 212*a* or is able to be a separate element attached thereto. This cylindrical protrusion extends into the large opening 164 of the lowermost substrate carriers 212 and has a diameter which exactly or substantially corresponds to the diameter of the substrates 130 carried within the substrate carrier stack in a respective substrate seat. As shown in FIG. 25, the cylindrical protrusion 214 has a height such that the lowermost substrate 130 in the substrate carrier stack, which is held by the lowermost substrate carrier of the substrate carrier stack directly supported by the support basis 212, has purging conditions similar to the other substrate carriers within the substrate carrier stack. To this end, the distance between the upper planar surface of the cylindrical protrusion 214 and the lower surface of this substrate 130 corresponds exactly or substantially to the distance between the lower and upper surfaces of next neighboring substrates held within the substrate carrier stack, if all seats of the substrate carriers carry a respective substrate 130, and if the substrates have a thickness for which the substrate carriers 112 and therewith the substrate carrier stack 110 are optimized. In the case of the shown preferred embodiment, the lowermost three substrate carriers are located with their respective partition webs in the height range of the cylindrical protrusion 214, such that the line nozzles or longitudinal openings between next neighboring partition webs do not have the purpose to emanate purging gas which shall pass a substrate or shall pass between substrates.

FIG. 25 should be considered with reference to FIGS. 17A and 17B which illustrate a plurality of substrate carriers located in the substrate carrier stack above the substrate carriers of FIG. 25.

It should be added that the base 114, preferably its carrying plate 210 in case of the shown preferred embodiment, is able to be provided with interfacing projections 154*a*', 154*b*', 154*c*' and 154*d*', similar to the interfacing projections 154*a*, 154*b*, 154*c* and 154*d* of a respective substrate carrier 112, that enable an interaction with external handling and movement devices and the like.

As already at least implicitly addressed in the foregoing, the aim to provide laminar purging gas flows through the spaces between neighboring substrates in the substrate carrier stack is able to be achieved or contributed to if already laminar purging gas flows enter through the inflow openings or recesses 218*a* and 218*b* into the associated vertical channels of the substrate carrier stack formed by the openings 168*a*, 168*b* and 166*a*, 166*b*, respectively, of its substrate carriers 112. To this end, suitable laminarisation structures within the base 114, in particular its support base 212, such as at least one relative large laminarisation chamber, possibly with gas distribution structures such as partition walls therein, is able to be provided. Alternatively or additionally, at least one laminarisation fabric, through which the purging gas emanates into the vertical supply channels within the substrate carrier stack, is able to be provided.

The base 114 is able to be manufactured from any appropriate material, e.g., at least one of a metallic material and a plastic material, or including a plurality of parts which are combined to form the base, as indicated for the shown preferred embodiment, or integrally.

Figure 26:
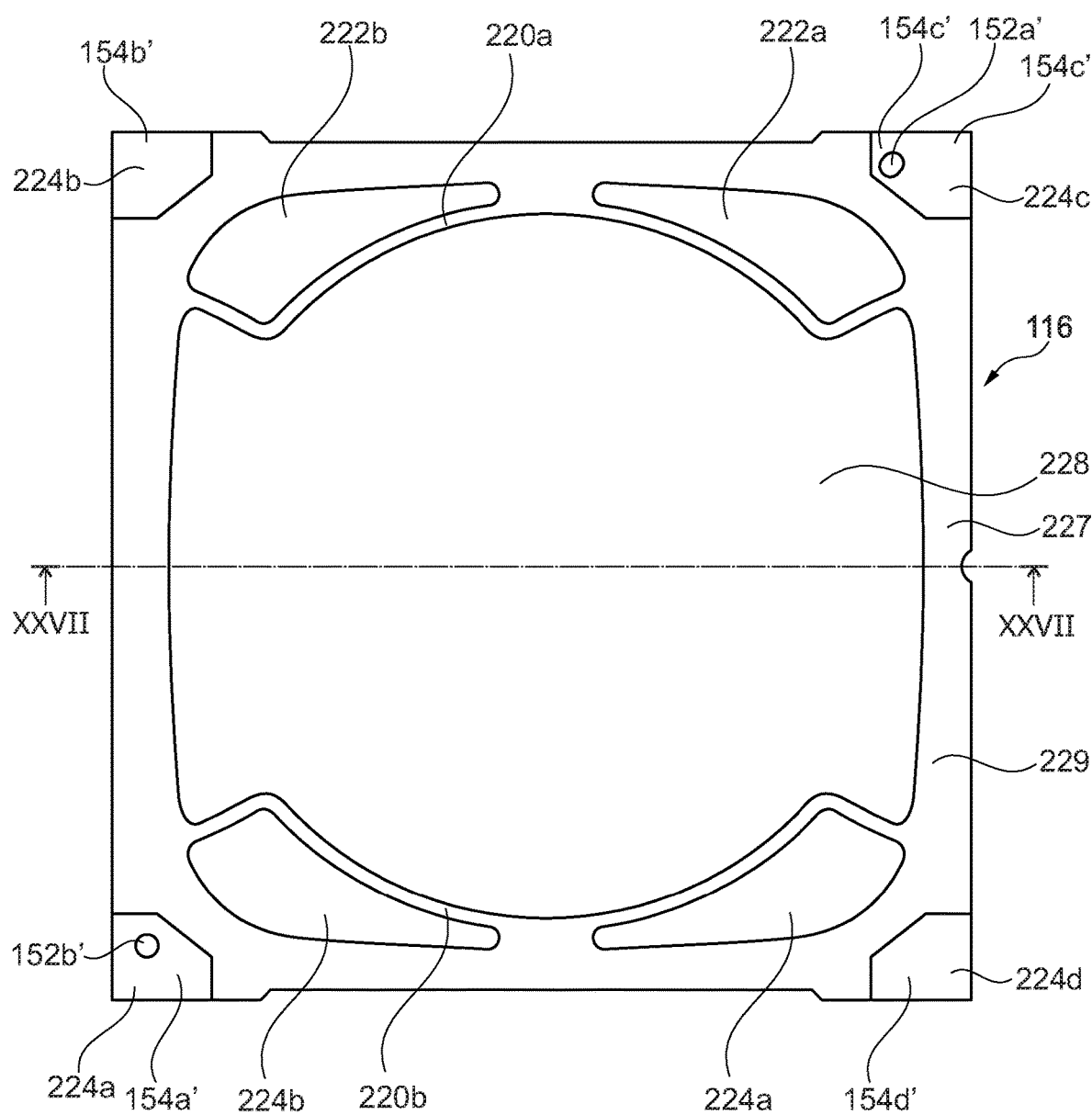
FIG. 26 is a top down view on the lower side/underside of an exemplary preferred embodiment of the cover of the substrate carrier stack according to the fifth preferred embodiment of the present invention placed upside down.
Figure 27:
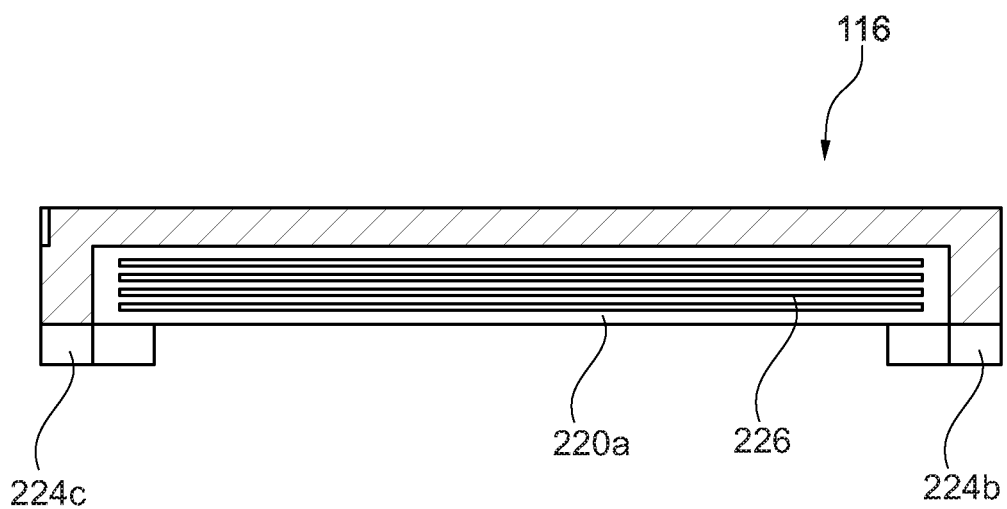
FIG. 27 is a side sectional view of the cover according to section XXVII-XXVII in FIG. 26 placed upside up.

Since in the present preferred embodiment the base 114 is provided with the purging gas inlet as well as with the purging gas outlet, the cover 116 does not need to include such an inlet and such an outlet. FIG. 26 shows a view on the lower side of a suitable cover 116, wherein the cover 116 is to be considered to be placed upside down according to the shown view. FIG. 27 is a corresponding side view of the cover 116, however having located its lower side directed downwardly and its upper side directed upwardly in the shown view.

The cover 116 basically includes a large recess 228 corresponding to the large inner opening 64 of a respective substrate carrier 112, and a first pair of smaller recesses 222*a* and 222*b* and a second pair of smaller recesses 224*a* and 224*b* which correspond to the smaller inner openings 166*a*, 166*b* and 168*a*, 168*b* of a respective substrate carrier 112. The smaller recesses 222*a*, 222*b* and 224*a*, 224*b* are separated from the larger recess 128 by a respective partition wall 240*a* and 240*b*, respectively, which correspond to the partition webs 160*a* and 160*b* of a respective substrate carrier 112. If the cover 116 is stacked on the uppermost substrate carrier 112 of the substrate carrier stack 110, then the first pair of smaller recesses 222*a*, 222*b* and the second pair of smaller recesses 224*a*, 224*b* extend the first and second pairs of vertical purging gas distribution channel or vertical purging channels formed by the first pair of smaller inner opening 166*a* and 166*b* and the second pair of smaller inner openings 168*a* and 168*b*, so that the vertical purging gas channels extend along the complete vertical extent of the inner accommodation space of the substrate carrier stack, where substrates held by a respective substrate carrier are able to be located. The partition walls 220*a* and 220*b*, which may also be denoted as partition ridges, include arc-shaped portions like the arc-shaped portions 202*a* and 202*b* of the partition webs and are provided with a respective set of vertically neighboring longitudinal openings 126 extending along the outer circumference of the inner accommodation space, analogous to the line nozzles or longitudinal openings defined by next neighboring partition webs of the substrate carriers, so that horizontal purging gas flows are able to emanate for the purging treatment of substrates also in the height range of the uppermost substrates held by the uppermost substrate carriers 112 of the substrate carrier stack 110, as illustrated in FIG. 28, along with FIGS. 17A, 17B, and 25.

Figure 28:
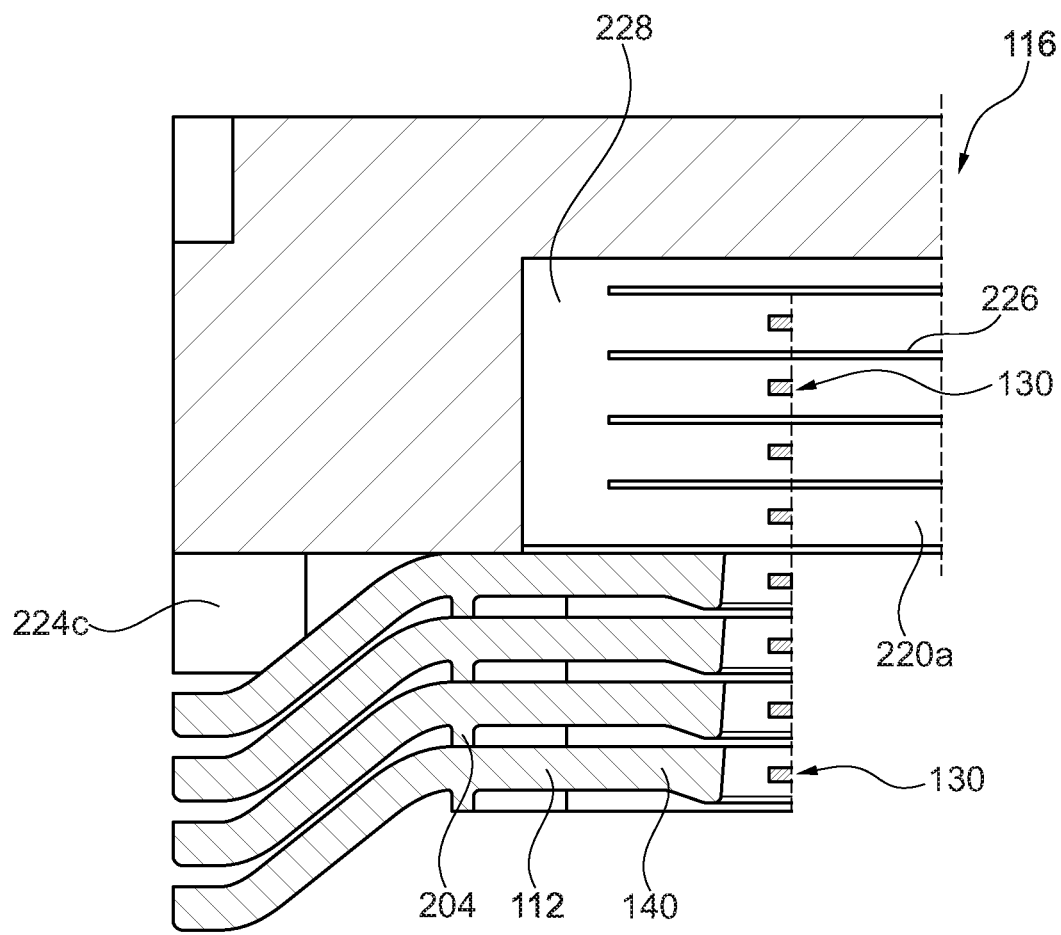
FIG. 28 is a side sectional view of four substrate carriers with substrates in a view analogous to FIG. 17B, together with the cover according to FIG. 27.
Figure 29A:
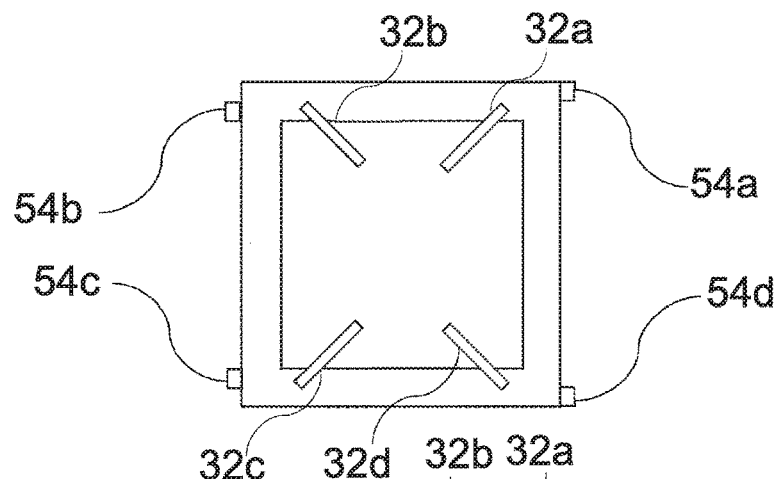
FIG. 29A, FIG. 29B, FIG. 29C, and FIG. 29D are each a schematic top down view of the upper side of a substrate carrier according to a preferred embodiment of the present invention.
Figure 29B:
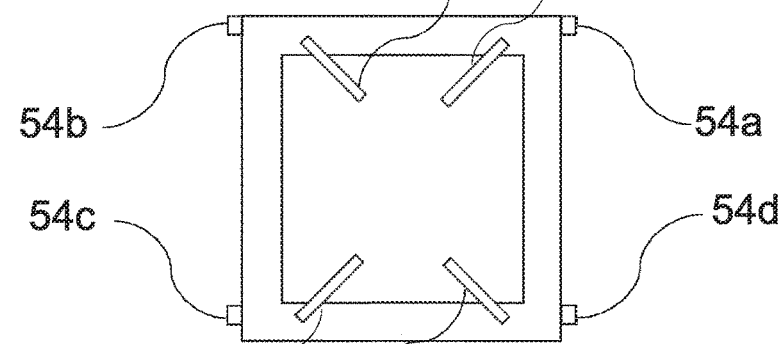
Figure 29C:
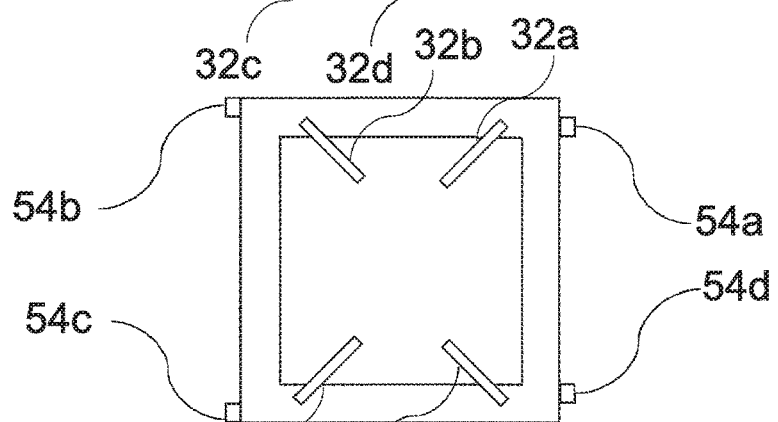
Figure 29D:
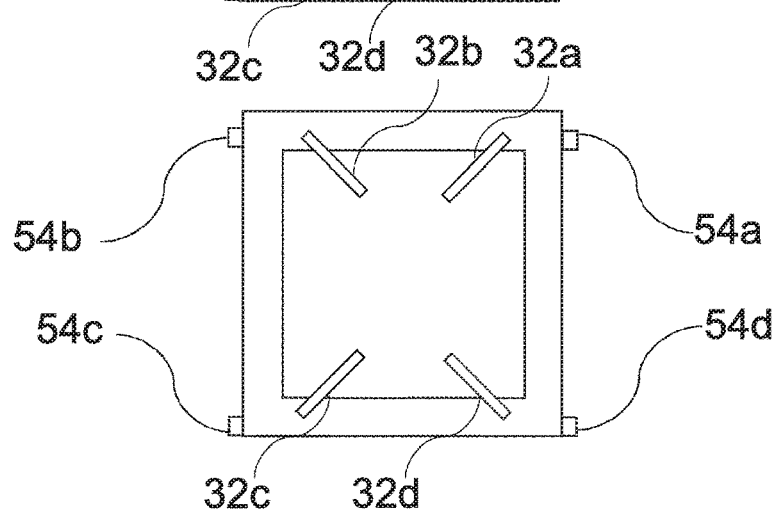
Figure 30A:
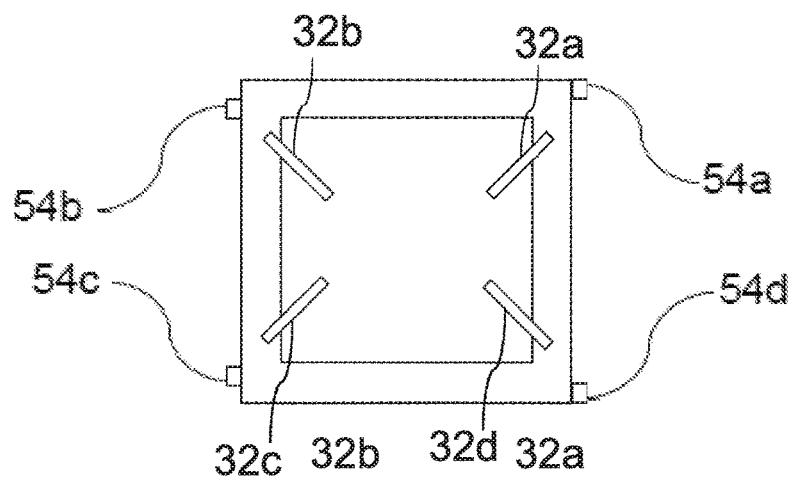
FIG. 30A, FIG. 30B, FIG. 30C, and FIG. 30D are each a schematic top down view of the upper side of a substrate carrier according to a preferred embodiment of the present invention.
Figure 30B:
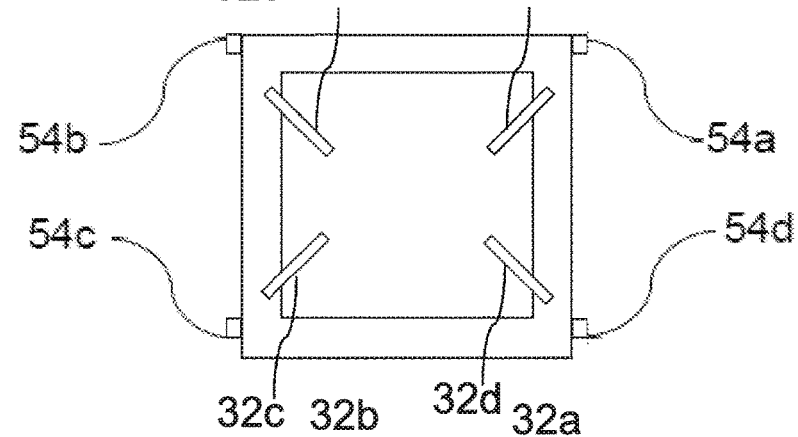
Figure 30C:
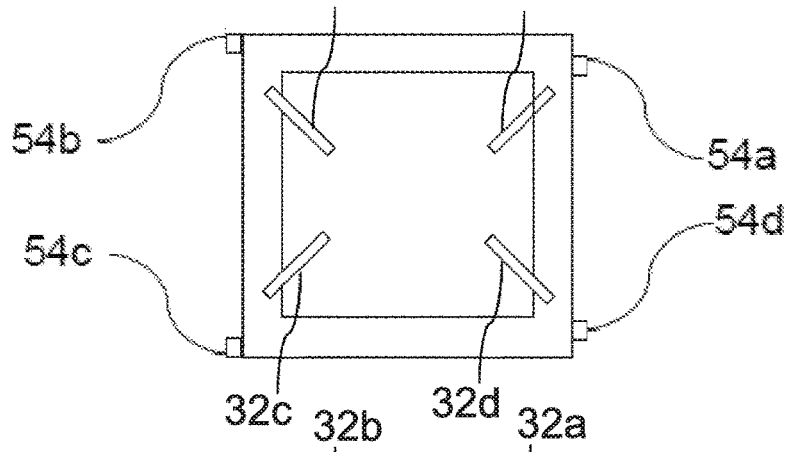
Figure 30D:
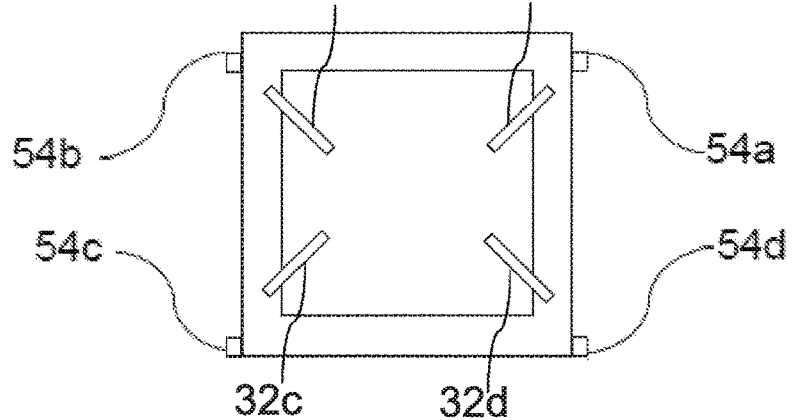

The four substrate carriers 112 shown in FIG. 28 are located in the substrate carrier stack above the substrate carriers of FIG. 17B and hold their respective substrate 130 via their substrate holding arms located within the larger recesses 228 of the cover 116. The smaller recesses 222*a*, 222*b* and 224*a*, 224*b* with the longitudinal openings or possibly line nozzles 226 in the partition walls 220*a* and 220*b* provide for horizontal purging gas flows through the spaces between next neighboring of the substrates 130 and also between the upper surface of the uppermost substrate 112 and the lower surface of the cover within the large recess 228.

Using the base 114 and the cover 116, identical or substantially identical purging conditions for all substrates 130 within the substrate carrier stack 110 are able to be obtained. Preferably, the longitudinal openings or line nozzles from which the horizontal purging gas flows emanate towards the substrates and into which the purging gas enters after having passed the substrates are provided at equidistant vertical distances, wherein the respective line nozzle or longitudinal opening preferably is located at half height between the lower surface of an upper substrate 130 and the upper surface of a lower substrate 130, between the lower surface of the cover 116 within the recess 128 and the upper surface of the uppermost substrate 130 and between the lower surface of the lowermost substrate 112 and the upper surface of the cylindrical protrusion 214 of the base 114, again assuming substrates that have a thickness for which the substrate carriers 112 and therewith the substrate carrier stack 110 are optimized. However, the substrate carriers 112 and the substrate carrier stack 110 are also able to be used for the storage, handling, and treatment of substrates having other thicknesses.

It is to be noted that the cover 116 preferably includes horizontally extending interfacing projections 154a', 154b', 154c', and 154d', which are formed by interfacing sections 224a, 224b, 224c, and 224d protruding downwardly from a support surface 229 of a frame portion 227 of the cover 116. The frame portion 227 is supported on the outer carrier frame 140 of the uppermost substrate carrier 112. A lower ring surface strip of the frame portion 227 extending around the large recess 228 and a lower ring surface strip of the outer carrier frame 1140 of the uppermost substrate carrier 112 extending around its inner zone 162 form sealing surfaces in mutual engagement to confine the purging gas within the substrate carrier stack 110. Alternatively, one of these surfaces is able to be replaced by a sealing lip or sealing ridge. Preferably, the cover 116 is provided with such a sealing lip or sealing ridge at its frame portion 227, analogous to the sealing lip or sealing ridge 204 of the substrate carriers 112.

To achieve a proper relative positioning of the cover on the uppermost substrate carrier 112 of the substrate carrier stack 110, one or a plurality of the interfacing sections 224a, 224b, 224c, and 224d are able to be provided with positioning formations analogous to the positioning formations of the substrate carriers. In the present case, the interfacing section 224a is provided with an opening or recess 152b' corresponding to the opening or recess 152b of a respective substrate carrier 112, and the interfacing section 224c is provided with a longitudinal extended recess or opening 152a' analogous to the opening or recess 152a of a respective substrate carrier 112. When the cover 116 is properly stacked on the uppermost substrate carrier 112 of the substrate carrier stack 110, then the protrusion 150b of this substrate carrier will protrude into the opening or recess 152a' of the cover 116, and the protrusion 150a of this substrate carrier will protrude into the opening 152b' of the cover 116.

It should be added that the kind of interfacing protrusions which are provided for the base 114 and the kind of interfacing protrusions which are provided for the base 116 are preferably adapted to each other and whether an even or an uneven number of substrate carriers 112 shall be provided in the substrate carrier stack 110.

The cover 116 is able to be manufactured from any appropriate material, e.g., at least one of a metallic material and a plastic material, integrally as may be the case for the shown preferred embodiment, or including a plurality of parts which are combined to form the cover.

The substrate carriers 12 and 112, as already mentioned, preferably are manufactured integrally or in one respective part. In particular, the substrate carriers are able to be integrally molded from a plastic material, preferably by injection molding. Favorably, a plastic material including fibers for reinforcement is able to be used. For clean room applications, it is recommended to use a plastics material that reduces static electricity. Accordingly, the substrate carriers preferably are molded from a so-called ESD material or Electronic Discharge material. For example, the plastic material is able to made of or include one of polyether ether ketone (PEEK) and polycarbonate (PC).

Preferred as a molding material is PEEK, in particular the variant PEEK ESD 101 available from Von Allmen AG, CH-8330 Pfäffikon or of a type having similar properties. Such substrate carriers have an enhanced chemical and temperature resistance, which is beneficial if semiconductor wafers are submitted to processing or conditioning steps being seated in the seat of a respective substrate carrier, which generally will be a part of a substrate carrier stack for collectively processing or conditioning all substrates held in the substrate carrier stack or which may alternatively be handled individually and submitted individually to a processing or conditioning apparatus. However, PC is also a well suited molding material, in particular for substrate carriers to be used for storing and buffering of semiconductor wafers in a substrate carrier stack. The variant PC-CF DCL 32 having an increased electrical conductivity or a type having similar properties is recommended, for example.

It is to be noted that substrate carrier stacks according to the preferred embodiments of the present invention are able to be provided to be a high-density replacement or augmentation to already existing systems and transfer mechanisms such as FOUP's, providing a higher storage density and improved and additional and enhanced abilities as aforementioned. Such a substrate carrier stack may be denoted as "TecCell" or "Tec-Cell."

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:
1. A substrate carrier stack comprising:
a plurality of substrate carriers stacked in a vertical direction such that, for each pair of vertically adjacent substrate carriers, a lower substrate carrier supports an upper substrate carrier; wherein
each of the plurality of substrate carriers includes an outer carrier frame extending in a horizontal frame plane around an inner zone that includes an inner opening;
each of the plurality of substrate carriers includes a substrate seat to accommodate and carry a substrate within an inner accommodation space of the substrate carrier stack, the inner accommodation space being defined by the inner openings of the plurality of substrate carriers;
each of the plurality of substrate carriers includes, at the outer carrier frame, an upper supporting formation and a lower supporting formation, the upper supporting formation of the lower substrate carrier supporting the lower supporting formation of the upper substrate carrier;

the outer carrier frame of each of the plurality of substrate carriers includes a first frame web extending along a first frame web axis, a second frame web extending along a second frame web axis, a third frame web extending along a third frame web axis, and a fourth frame web extending along a fourth frame web axis;

the first frame web axis intersects the fourth frame web axis at a right angle at a first vertex of the first frame web and the fourth frame web, the first frame web and the fourth frame web are connected at a first frame vertex region of the outer carrier frame;

the first frame web axis intersects the second frame web axis at a right angle at a second vertex of the first frame web and the second frame web, the first frame web and the second frame web are connected at a second frame vertex region of the outer carrier frame;

the third frame web axis intersects the fourth frame web axis at a right angle at a fourth vertex of the third frame web and the fourth frame web, the third frame web and the fourth frame web are connected at a fourth frame vertex region of the outer carrier frame;

the third frame web axis intersects the second frame web axis at a third vertex of the third frame web and the second frame web, the third frame web and the second frame web are connected at a third frame vertex region of the outer carrier frame;

each of the plurality of substrate carriers includes a plurality of substrate holding arms that extend inwardly and upwardly from the outer carrier frame, overlap the inner zone, and define the substrate seat;

the substrate seat is located at a distance above the outer carrier frame in the vertical direction;

each of the plurality of substrate carriers includes a plurality of partition webs that extend from the outer carrier frame through the inner zone to define the inner opening and two auxiliary openings of the inner zone;

a first arc-shaped portion of the plurality of partition webs extends in a first space between the fourth frame web and the inner opening to define a first of the two auxiliary openings;

a second arc-shaped portion of the plurality of partition webs extends in a second space between the second frame web and the inner opening to define a second of the two auxiliary openings;

the first auxiliary openings and the second auxiliary openings of the inner zones of the plurality of substrate carriers collectively define a first purging channel and a second purging channel that extend vertically parallel or substantially parallel to the inner accommodation space at opposing sides of the inner accommodation space; and the plurality of substrate carriers include purging structures that create horizontal purging flows within the substrate carrier stack through spaces between substrates held by the substrate seats of the plurality of substrate carriers.

2. The substrate carrier stack according to claim 1, further comprising:

a cover that is stacked on the plurality of substrate carriers and is supported by an uppermost substrate carrier of the plurality of substrate carriers; and a base on which the plurality of substrate carriers are stacked, the base supports a lowermost substrate carrier of the plurality of substrate carriers.

3. The substrate carrier stack according claim 2, wherein the upper supporting formation includes an upper sealing formation, and the lower supporting formation includes a lower sealing formation;

the upper sealing formation of the uppermost substrate carrier of the plurality of substrate carriers engages with a sealing formation of the cover; and the lower sealing formation of the lowermost substrate carrier of the plurality of substrate carriers engages with a sealing formation of the base to seal the inner accommodation space, the first purging channel, and the second purging channel from an area surrounding the substrate carrier stack.

4. The substrate carrier stack according claim 2, wherein one of the cover and the base includes a first port connected to the first purging channel;

one of the cover and the base includes a second port connected to the second purging channel; and a purging gas is supplied into the substrate carrier stack via one of the first port and the second port that defines a supply port and is discharged from the substrate carrier stack via the other of the first port and the second port that defines a discharge port such that the purging gas flows through the inner accommodation space via the first purging channel, the second purging channel, and purging passages defined by the purging structures.

5. The substrate carrier stack according claim 4, wherein the first port is connected to the first purging channel via a first laminarisator included in the one of the cover and the base that includes the first port;

the second port is connected to the second purging channel via a second laminarisator included in the one of the cover and the base that includes the second port; and each of the first laminarisator and the second laminarisator includes a gas filtering medium and/or a gas distribution manifold that suppresses turbulences in the purging gas that passes therethrough.

6. The substrate carrier stack according claim 2, wherein the cover includes purging formations connected to the first purging channel and the second purging channel and provide purging passages in which purging gas flows to the substrate seat of the uppermost substrate carrier or the substrate seats of a predetermined number of uppermost substrate carriers of the plurality of substrate carriers; and the purging passages provided by the purging formations connect a portion of the inner accommodation space with the first purging channel and the second purging channel.

7. The substrate carrier stack according to claim 1, wherein the purging structures define purging passages, and the each pair of vertically adjacent substrate carriers is provided with the purging passages which pass through the first arc-shaped portions and the second arc-shaped portions of the partition webs of the substrate carriers;

a first portion of the inner accommodation space is connected with the first purging channel through a first purging passage such that purging gas flows between the first purging channel and the first portion of the inner accommodation space; and a second portion of the inner accommodation space is connected with the second purging channel through a second purging passage such that the purging gas flows between the second purging channel and the second portion of the inner accommodation space.

8. The substrate carrier stack according to claim 7, wherein the purging passages are defined by an upper surface of the first arc-shaped portion or the second arc-shaped portion of the lower substrate carrier and a lower surface of the first arc-shaped portion or the second arc-shaped portion of the upper substrate carrier.

9. The substrate carrier stack according to claim 7, wherein the purging passages are defined by elongated nozzle openings including an opening width in the vertical direction that tapers towards the inner accommodation space.

10. The substrate carrier stack according to claim 7, wherein each of the purging passages included in the substrate carrier stack are provided within the substrate carrier stack at equidistant positions in the vertical direction.

11. The substrate carrier stack according to claim 1, wherein
the upper supporting formation includes an upper sealing formation, and the lower supporting formation includes a lower sealing formation;
a first of the upper sealing formation and the lower sealing formation includes a continuous sealing lip that extends continuously around the inner zone, and a second of the upper sealing formation and the lower sealing formation includes a continuous sealing surface strip that extends continuously around the inner zone;
for the each pair of vertically adjacent substrate carriers, the lower sealing formation of the upper substrate carrier engages with the upper sealing formation of the lower substrate carrier to seal the inner accommodation space, the first purging channel, and the second purging channel from an area surrounding the substrate carrier stack.

12. The substrate carrier stack according to claim 1, wherein
each of the plurality of substrate carriers includes a first positioning formation and a second positioning formation such that, for the each pair of vertically adjacent substrate carriers, the first positioning formation of the lower substrate carrier engages with the second positioning formation of the upper substrate carrier; and
each of the plurality of substrate carriers includes a vertical protrusion defining a first of the first positioning formation and the second positioning formation, and a recess or opening defining a second of the first positioning formation and the second positioning formation.

13. The substrate carrier stack according to claim 1, wherein
all of the plurality of substrate carriers have a same structure or substantially a same structure; and
the substrate carriers of the each pair of vertically adjacent substrate carriers are stacked such that:
the first frame web of the lower substrate carrier supports the third frame web of the upper substrate carrier, the second frame web of the lower substrate carrier supports the fourth frame web of the upper substrate carrier, the third frame web of the lower substrate carrier supports the first frame web of the upper substrate carrier, and the fourth frame web of the lower substrate carrier supports the second frame web of the upper substrate carrier.

14. The substrate carrier stack according to claim 1, wherein each of the plurality of substrate carriers includes projections that project horizontally from an outer peripheral surface of the outer carrier frame.

15. The substrate carrier stack according to claim 1, wherein each of the plurality of substrate carriers includes a first pair of projections that project from an outer peripheral surface of the outer carrier frame in a first horizontal direction and a second pair of projections that project from the outer peripheral surface of the outer carrier frame in a second horizontal direction that is different from the first horizontal direction.

16. A substrate carrier stack comprising:
a plurality of substrate carriers stacked in a vertical direction; wherein
each of the plurality of substrate carriers includes a substrate seat to accommodate and carry a substrate within an inner accommodation space of the substrate carrier stack;
the plurality of substrate carriers include a first purging channel and a second purging channel that extend vertically parallel or substantially parallel to the inner accommodation space at opposing sides of the inner accommodation space;
the plurality of substrate carriers include purging structures that create horizontal purging flows within the substrate carrier stack; and
each of the plurality of substrate carriers includes an outer carrier frame extending in a horizontal frame plane around the first purging channel, the second purging channel, and the inner accommodation space.

17. The substrate carrier according to claim 16, wherein each of the plurality of substrate carriers is integrally molded from a plastic material.

18. A substrate carrier comprising:
an outer carrier frame extending in a frame plane around an inner zone including an inner opening;
a plurality of partition webs that extend from the outer carrier frame through the inner zone to define the inner opening and two auxiliary openings of the inner zone;
the two auxiliary openings define a portion of a first purging channel and a portion of a second purging channel that extend vertically parallel or substantially parallel to the inner zone when the substrate carrier is one of a plurality of substrate carriers stacked in a vertical direction.

19. The substrate carrier according to claim 18, wherein the substrate carrier is integrally molded from a plastic material.

20. The substrate carrier according to claim 18, wherein the substrate carrier is integrally molded from polyether ether ketone or polycarbonate.

* * * * *